United States Patent
Newdoll et al.

(10) Patent No.: US 9,196,770 B2
(45) Date of Patent: Nov. 24, 2015

(54) POLE-MOUNTED POWER GENERATION SYSTEMS, STRUCTURES AND PROCESSES

(75) Inventors: Ronald M. Newdoll, Woodside, CA (US); Argil E. Shaver, II, Menlo Park, CA (US)

(73) Assignee: Newdoll Enterprises LLC, Menlo Park, CA (US)

( * ) Notice: Subject to any disclaimer, the term of this patent is extended or adjusted under 35 U.S.C. 154(b) by 463 days.

(21) Appl. No.: 13/615,014

(22) Filed: Sep. 13, 2012

(65) Prior Publication Data

US 2013/0038124 A1 Feb. 14, 2013

Related U.S. Application Data

(63) Continuation-in-part of application No. PCT/US2010/045352, filed on Aug. 12, 2010, and a continuation-in-part of application No. 12/842,864, filed on Jul. 23, 2010, now Pat. No. 8,035,249, which (Continued)

(51) Int. Cl.
*H01L 31/042* (2014.01)
*H02J 3/38* (2006.01)
(Continued)

(52) U.S. Cl.
CPC ........ *H01L 31/042* (2013.01); *H01L 31/02021* (2013.01); *H02J 3/385* (2013.01); *H02J 13/0062* (2013.01); *H02J 13/0079* (2013.01); *H02S 50/10* (2014.12); *Y02B 90/2638* (2013.01);
(Continued)

(58) Field of Classification Search
USPC ........................................................ 307/150
See application file for complete search history.

(56) References Cited

U.S. PATENT DOCUMENTS

| | | | |
|---|---|---|---|
| 3,958,171 A | 5/1976 | Sekino | |
| 4,488,791 A | 12/1984 | Hinchliffe | |

(Continued)

FOREIGN PATENT DOCUMENTS

| | | |
|---|---|---|
| AU | 2010101396 | 2/2011 |
| CN | 201141544 | 10/2008 |

(Continued)

OTHER PUBLICATIONS

"Long Island Power Authority Requirements for Interconnection of New Distributed Generation Units with Capacity of 300kVA", Radial Distribution Lines, (Date Unknown—before Jun. 19, 2006), pp. 1-12.

(Continued)

*Primary Examiner* — Robert Deberadinis
(74) *Attorney, Agent, or Firm* — Michael A. Glenn; Perkins Coie LLP

(57) ABSTRACT

Solar power systems and structures are mountable to a power distribution structure, e.g. a power pole or tower, which supports alternating current (AC) power transmission lines. An exemplary power generation structure is fixedly attached to and extends from the power distribution structure, and comprises a mounting rack. A solar array, comprising at least one solar panel, is affixed to the mounting rack. A DC to AC invertor is connected between the DC outputs of the solar array and the AC power transmission lines. The length of the solar array is generally in alignment with the power distribution structure, and the width of the solar array is greater than half the circumference of the power distribution structure. The mounting rack and solar array may preferably be rotatable, such as based on any of location, time of day, or available light.

30 Claims, 52 Drawing Sheets

Related U.S. Application Data is a continuation of application No. 12/056,235, filed on Mar. 26, 2008, now Pat. No. 7,772,716, application No. 13/615,014, which is a continuation-in-part of application No. 13/250,887, filed on Sep. 30, 2011, now Pat. No. 8,427,009, which is a continuation of application No. 12/842,864, filed on Jul. 23, 2010, now Pat. No. 8,035,249, which is a continuation of application No. 12/056,235, filed on Mar. 26, 2008, now Pat. No. 7,772,716.

(60) Provisional application No. 61/534,802, filed on Sep. 14, 2011, provisional application No. 61/234,181, filed on Aug. 14, 2009, provisional application No. 60/908,361, filed on Mar. 27, 2007.

(51) Int. Cl.
  *H02J 13/00* (2006.01)
  *H01L 31/02* (2006.01)
  *H02S 50/10* (2014.01)
  *H02J 7/00* (2006.01)

(52) U.S. Cl.
  CPC .................. *Y02E 10/58* (2013.01); *Y02E 40/72* (2013.01); *Y02E 60/74* (2013.01); *Y04S 10/123* (2013.01); *Y04S 10/30* (2013.01); *Y04S 40/124* (2013.01); *Y10T 307/406* (2015.04)

(56) References Cited

U.S. PATENT DOCUMENTS

| | | | |
|---|---|---|---|
| 4,599,685 | A | 7/1986 | Hombu et al. |
| 5,706,798 | A | 1/1998 | Steinorth |
| 5,742,495 | A | 4/1998 | Barone |
| 5,982,253 | A | 11/1999 | Perrin et al. |
| 6,153,823 | A | 11/2000 | Shiozaki et al. |
| 6,201,180 | B1 | 3/2001 | Meyer et al. |
| 6,285,572 | B1 | 9/2001 | Onizuka et al. |
| 6,291,762 | B1 | 9/2001 | Yih-Song et al. |
| 6,750,391 | B2 | 6/2004 | Bower et al. |
| 6,810,339 | B2 | 10/2004 | Wills |
| 7,104,064 | B2 | 9/2006 | Hon |
| 7,443,052 | B2 | 10/2008 | Wendt et al. |
| 7,444,816 | B2 | 11/2008 | Hon |
| 7,731,383 | B2 | 6/2010 | Myer |
| 7,772,716 | B2 | 8/2010 | Shaver |
| 7,866,927 | B1 | 1/2011 | Wong |
| 7,994,657 | B2 | 8/2011 | Kimball et al. |
| 8,035,249 | B2 | 10/2011 | Shaver et al. |
| 2002/0066473 | A1 | 6/2002 | Levy et al. |
| 2002/0074034 | A1 | 6/2002 | Fujisaki et al. |
| 2003/0111103 | A1 | 6/2003 | Bower et al. |
| 2003/0177706 | A1 | 9/2003 | Ullman |
| 2004/0207366 | A1 | 10/2004 | Sung |
| 2004/0261334 | A1 | 12/2004 | Liebendorfer et al. |
| 2005/0076563 | A1 | 4/2005 | Faris |
| 2006/0185727 | A1 | 8/2006 | Matan |
| 2006/0266408 | A1 | 11/2006 | Horne et al. |
| 2007/0089778 | A1 | 4/2007 | Horne et al. |
| 2007/0090653 | A1 | 4/2007 | Martelon |
| 2007/0113881 | A1 | 5/2007 | Mellott et al. |
| 2007/0221267 | A1 | 9/2007 | Fornage |
| 2007/0271006 | A1 | 11/2007 | Golden et al. |
| 2008/0149786 | A1 | 6/2008 | Bradley |
| 2008/0149791 | A1 | 6/2008 | Bradley |
| 2008/0150484 | A1 | 6/2008 | Kimball et al. |
| 2008/0169652 | A1 | 7/2008 | Green |
| 2008/0238195 | A1 | 10/2008 | Shaver, II et al. |
| 2009/0030605 | A1 | 1/2009 | Breed |
| 2009/0040750 | A1 | 2/2009 | Myer |
| 2009/0078299 | A1 | 3/2009 | Cinnamon et al. |
| 2009/0090895 | A1 | 4/2009 | Hogan, Jr. |
| 2009/0146501 | A1 | 6/2009 | Cyrus |
| 2009/0150005 | A1 | 6/2009 | Hadar et al. |
| 2009/0194669 | A1 | 8/2009 | Noble et al. |
| 2009/0199846 | A1 | 8/2009 | Collins et al. |
| 2009/0266353 | A1 | 10/2009 | Lee |
| 2009/0283129 | A1 | 11/2009 | Foss |
| 2010/0043851 | A1 | 2/2010 | Levy et al. |
| 2010/0205870 | A1 | 8/2010 | Cobb |
| 2010/0237305 | A1 | 9/2010 | Miller |
| 2010/0270808 | A1 | 10/2010 | Bates et al. |
| 2010/0284737 | A1 | 11/2010 | McPheeters |
| 2010/0296285 | A1 | 11/2010 | Chemel et al. |
| 2010/0328931 | A1 | 12/2010 | Fogerlie |
| 2010/0328932 | A1 | 12/2010 | Fogerlie |
| 2011/0005583 | A1 | 1/2011 | Thomas |
| 2011/0017256 | A1 | 1/2011 | Stevens |
| 2011/0041834 | A1 | 2/2011 | Liao |
| 2011/0058664 | A1 | 3/2011 | Prax et al. |
| 2011/0073161 | A1 | 3/2011 | Scanlon |
| 2011/0085322 | A1 | 4/2011 | Myer |
| 2011/0120523 | A1 | 5/2011 | Silver |
| 2011/0163222 | A1 | 7/2011 | Moser |
| 2011/0192460 | A1 | 8/2011 | Tan |
| 2011/0265840 | A1 | 11/2011 | Sela |
| 2012/0187222 | A1 | 7/2012 | Galili et al. |

FOREIGN PATENT DOCUMENTS

| | | |
|---|---|---|
| CN | 202362621 | 8/2012 |
| DE | 103 20 347 | 12/2004 |
| EP | 033706 | 9/1989 |
| JP | S59 79579 | 5/1984 |
| JP | 59-150484 | 8/1984 |
| JP | S62 13084 | 1/1987 |
| JP | 9182459 | 7/1997 |
| JP | H10 308523 | 11/1998 |
| JP | 3405035 | 5/2003 |
| JP | 2003-197946 | 7/2003 |
| JP | 2003-199377 | 7/2003 |
| KR | 2009010561 | 1/2009 |
| WO | WO-2005076444 | 8/2005 |
| WO | WO-2006022590 | 3/2006 |
| WO | WO-2006071436 | 7/2006 |
| WO | WO2006078685 | 7/2006 |
| WO | WO-2006130520 | 12/2006 |
| WO | WO2007106519 | 9/2007 |
| WO | WO-2008045335 | 4/2008 |
| WO | WO-2008080088 | 7/2008 |
| WO | WO-2008088311 | 7/2008 |
| WO | WO-2008/129089 | 10/2008 |
| WO | WO2008125915 | 10/2008 |
| WO | WO2008144540 | 11/2008 |
| WO | WO-2009038810 | 3/2009 |
| WO | WO2009044982 | 4/2009 |
| WO | WO-2009114730 | 9/2009 |
| WO | WO-2010008927 | 1/2010 |
| WO | WO-2010050993 | 5/2010 |
| WO | WO-2010068706 | 6/2010 |
| WO | WO-2010102256 | 9/2010 |
| WO | WO-2010118236 | 10/2010 |
| WO | WO-2010118503 | 10/2010 |
| WO | WO-2010123538 | 10/2010 |
| WO | WO-2011044641 | 4/2011 |

OTHER PUBLICATIONS

"Solar Tracking System", Solazone, solar tracker, retrieved online on Aug. 19, 2011 from url: http://www.solazone.com.au/tracker.htm, 7 pages.

"Welcome to the next phase of solar", enphase Energy Brochure System Overview; retrieved Sep. 13, 2012 online from url: http://enphase.com/producs/microinverters ; copyright 2012, 3 pages.

Clark, et al., "Plug-n-Play, Reliable Power Systems for Nanosatellites", 20th Annual AIAAIUSU Conference on Small Satellites retrieved on May 21, 2008 from website http://ssdl.stanford.edu/ssdl/images/storieslAA236/A06Fall/ARFC/ssc06-vi-2.pdf, Retrieved on May 21, 2008 from website: http://ssdl.stanford.edu/ssdl/images/storieslAA236/A06Fall/ARFC/ssc06-vi-2.pdf, Aug. 2006, pp. 1-6.

(56) References Cited

OTHER PUBLICATIONS

Santos, J.L. et al., "Maximum Power Point Tracker for PV Systems", RIO 3—World Climate & Energy Event, Rio de Janiero, Brazil, Dec. 2003, pp. 75-80.

Ton, D. et al., "Summary Report of the DOE High-Tech Inverter Workshop", Jan. 2005, 124 pages.

Walker, G.R et al., "PV String Per-Module Maximum Power Point Enabling Converters;", Proceedings of the Australasian Universities Power Engineering Conference, Christchurch, New Zealand, Oct. 2003, 6 pages.

Xantrex Technology, Inc., "PV Series Grid Tie Solar Inverters—Three Phase—North America", Accessed at: xantrex.comlweb/id/11/p/1/ptl23/product.asp, Feb. 3 2010, 1 page.

Orduz, R. et al., "Evaluation Test Results of a New Distributed MPPT Converter", 22nd European Photovoltaic Solar Energy Conference, Sep. 3-7, 2007, Milan, Italy, pp. 2826-2829.

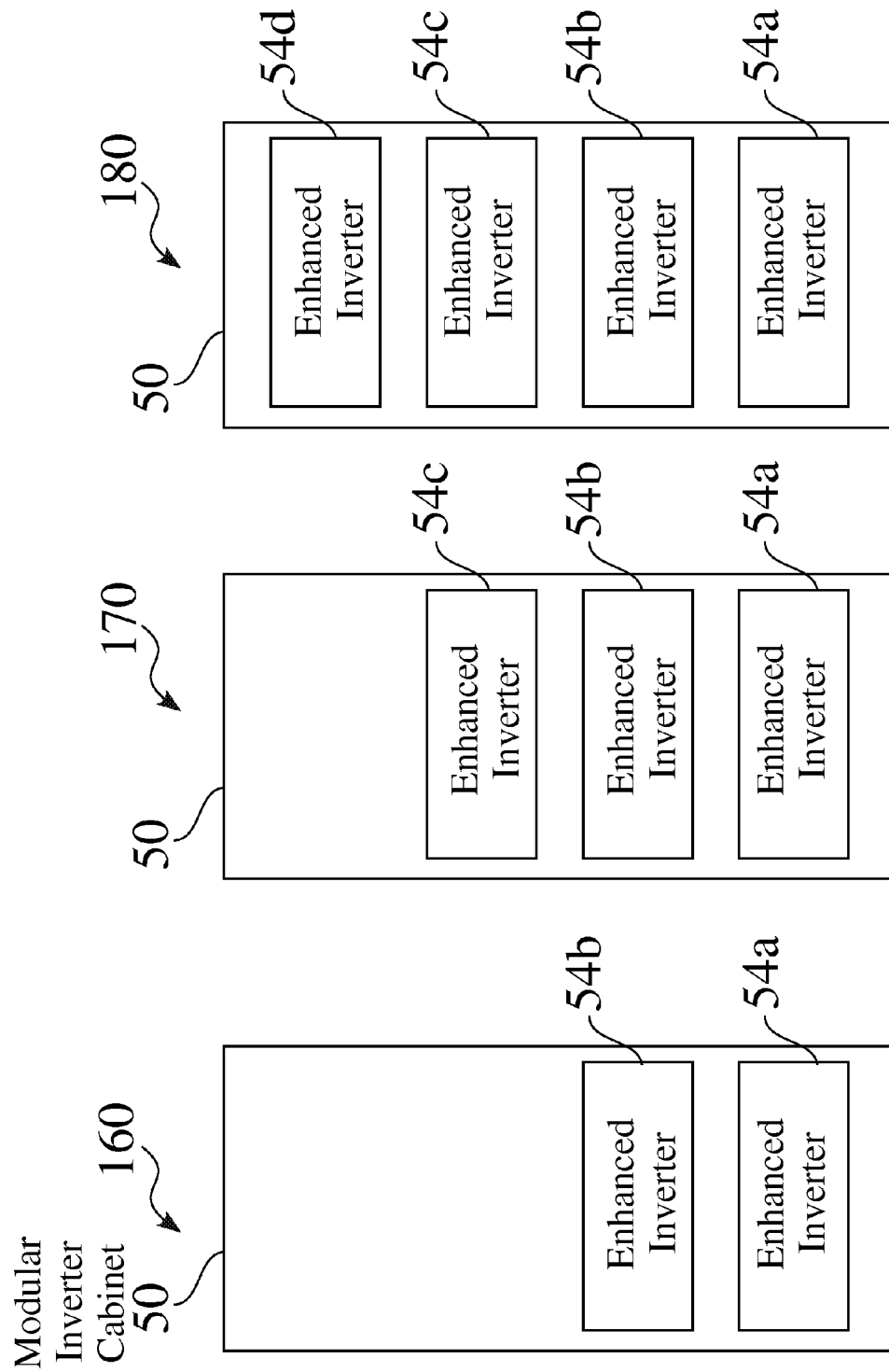

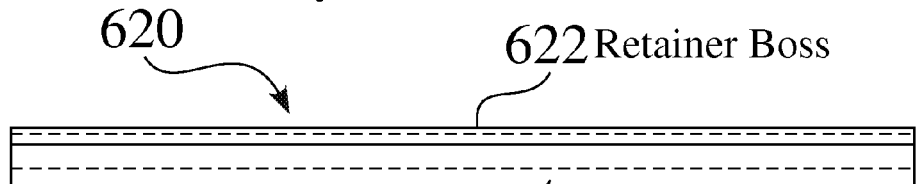
Fig. 44
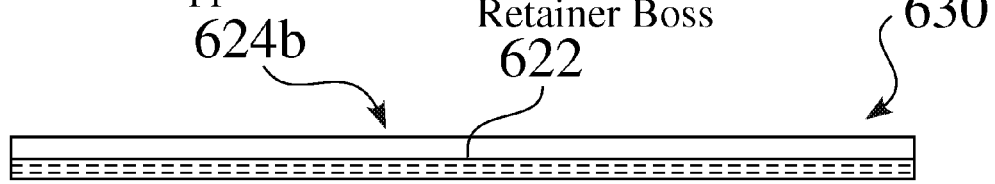
Fig. 45
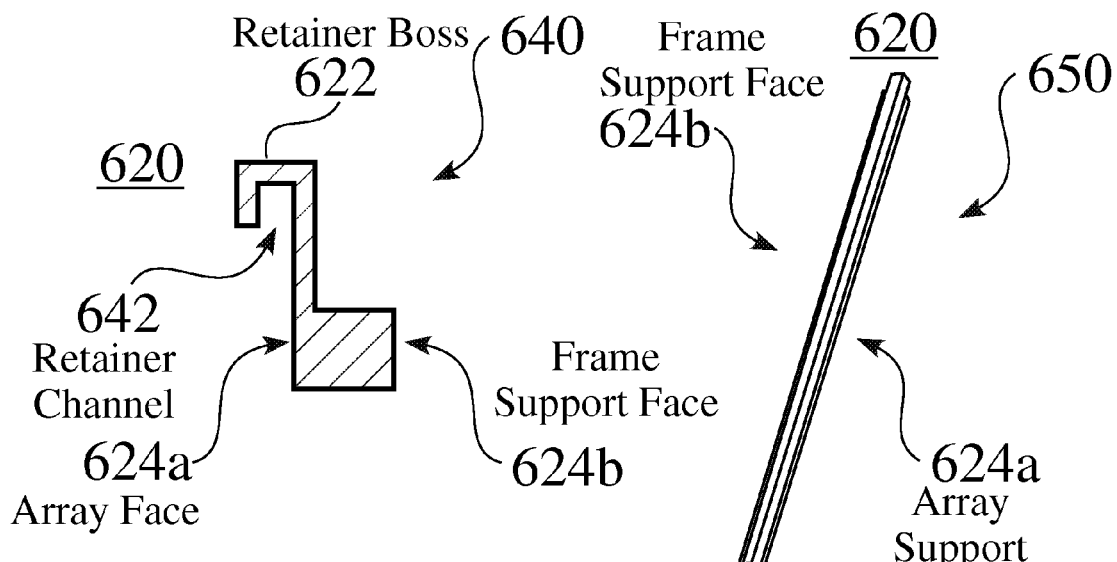
Fig. 46
Fig. 47

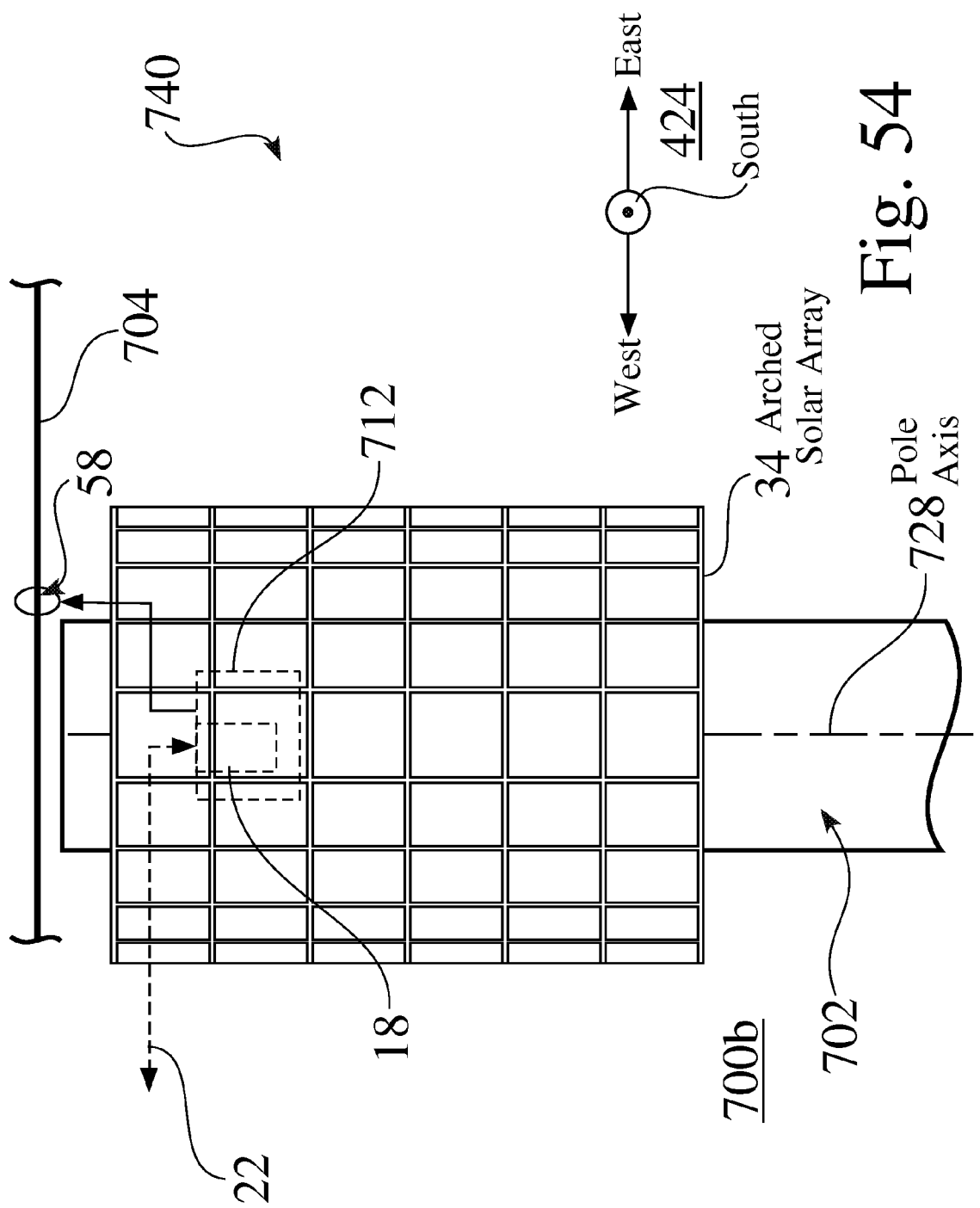

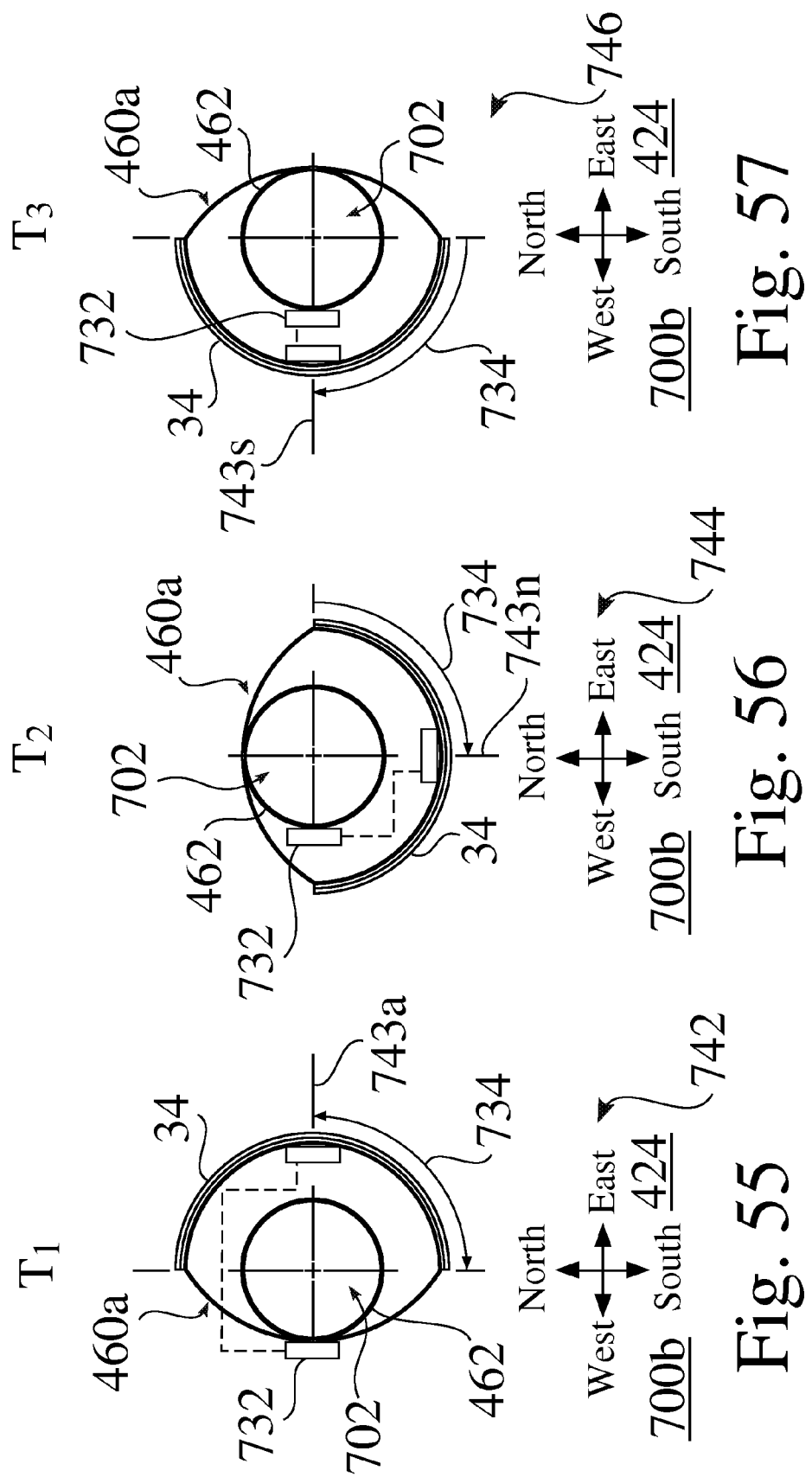

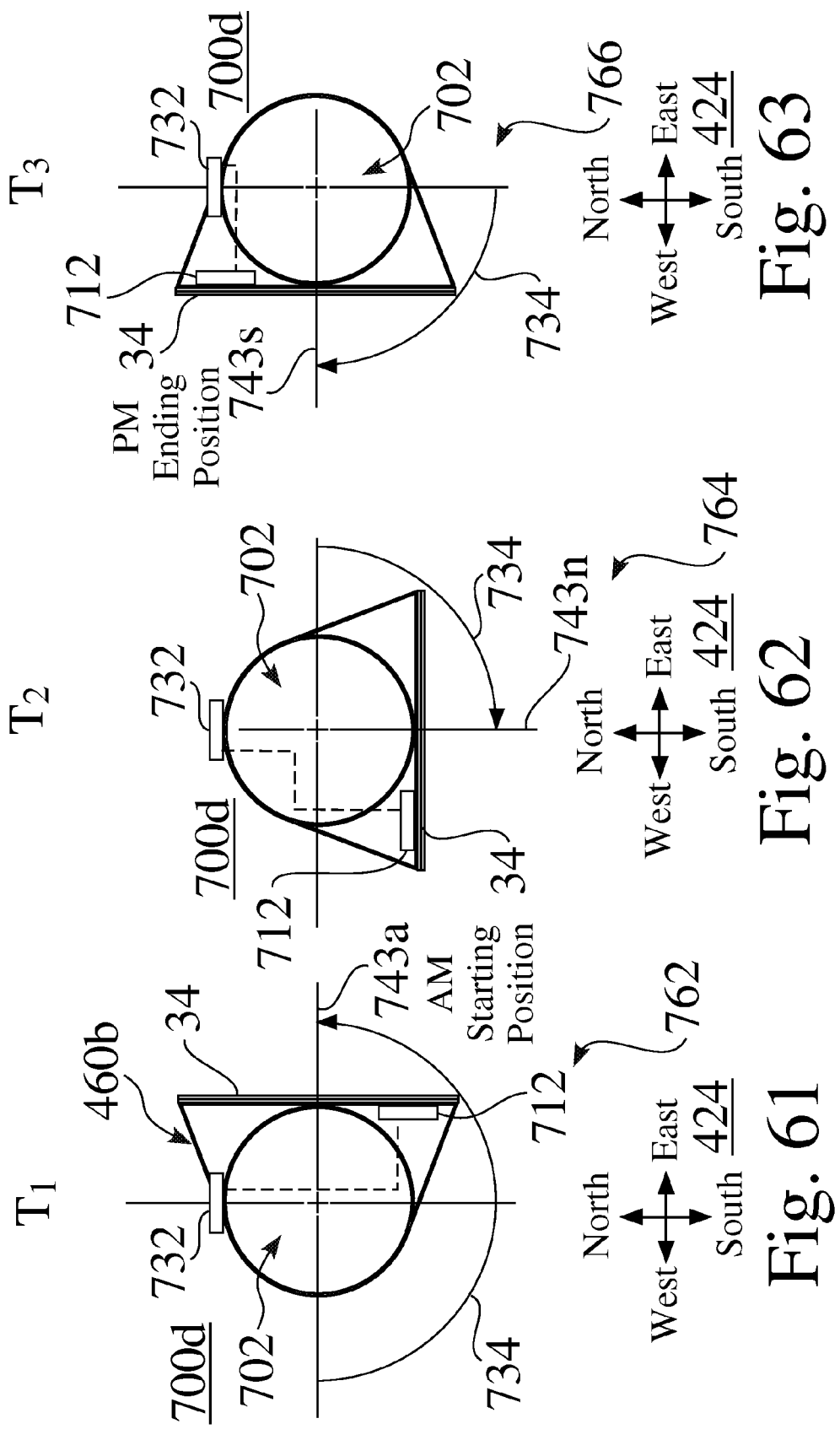

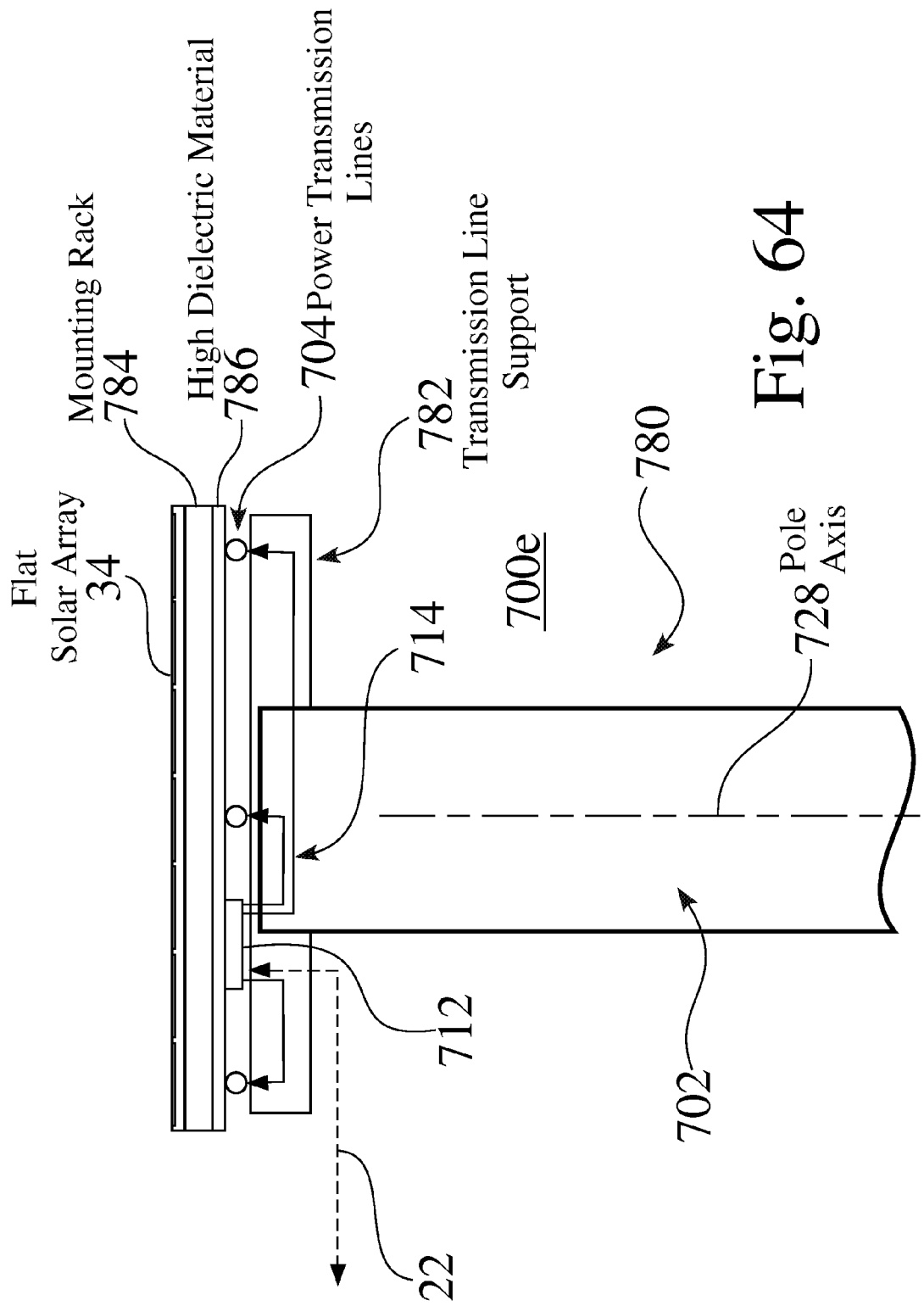

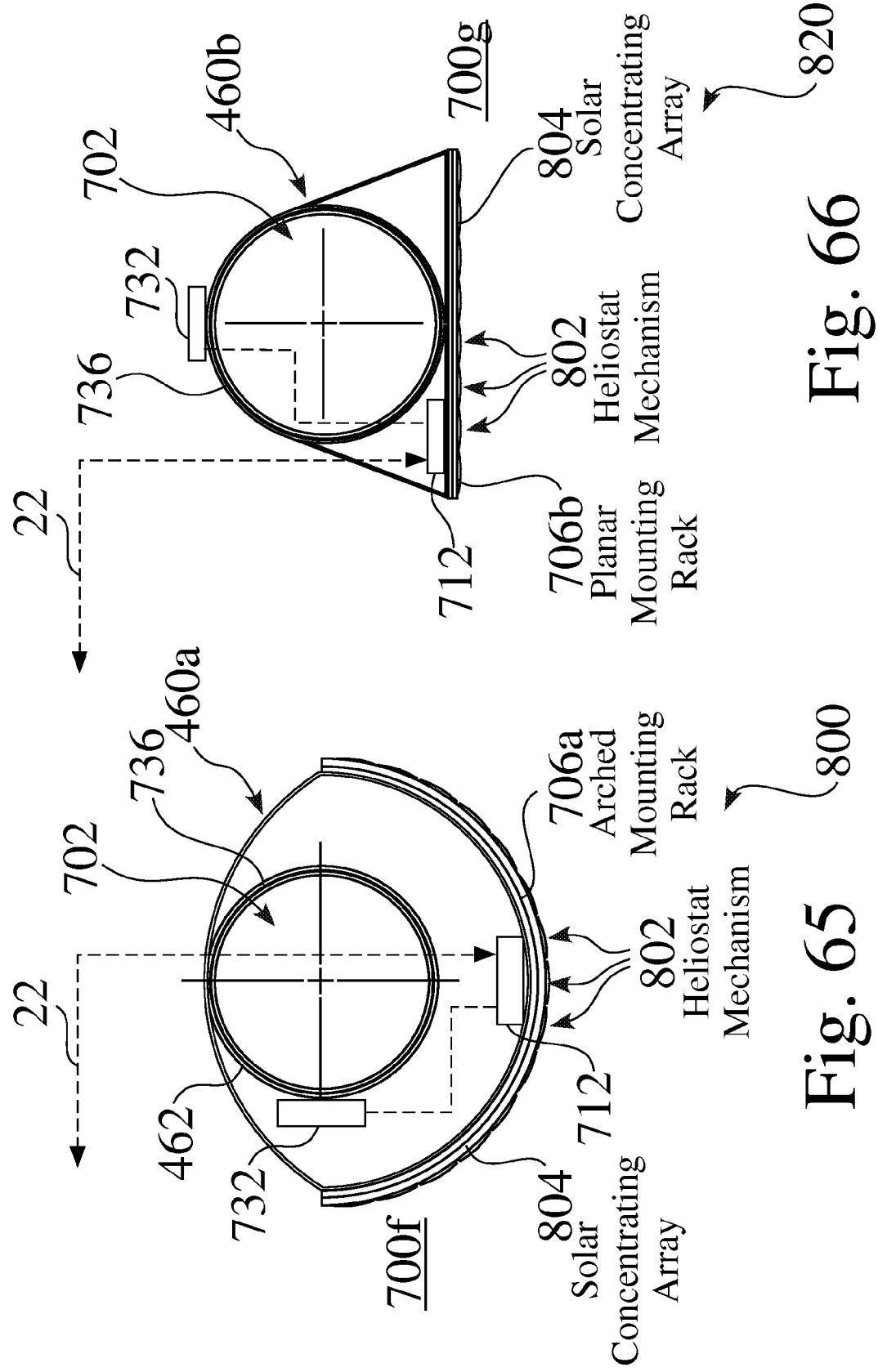

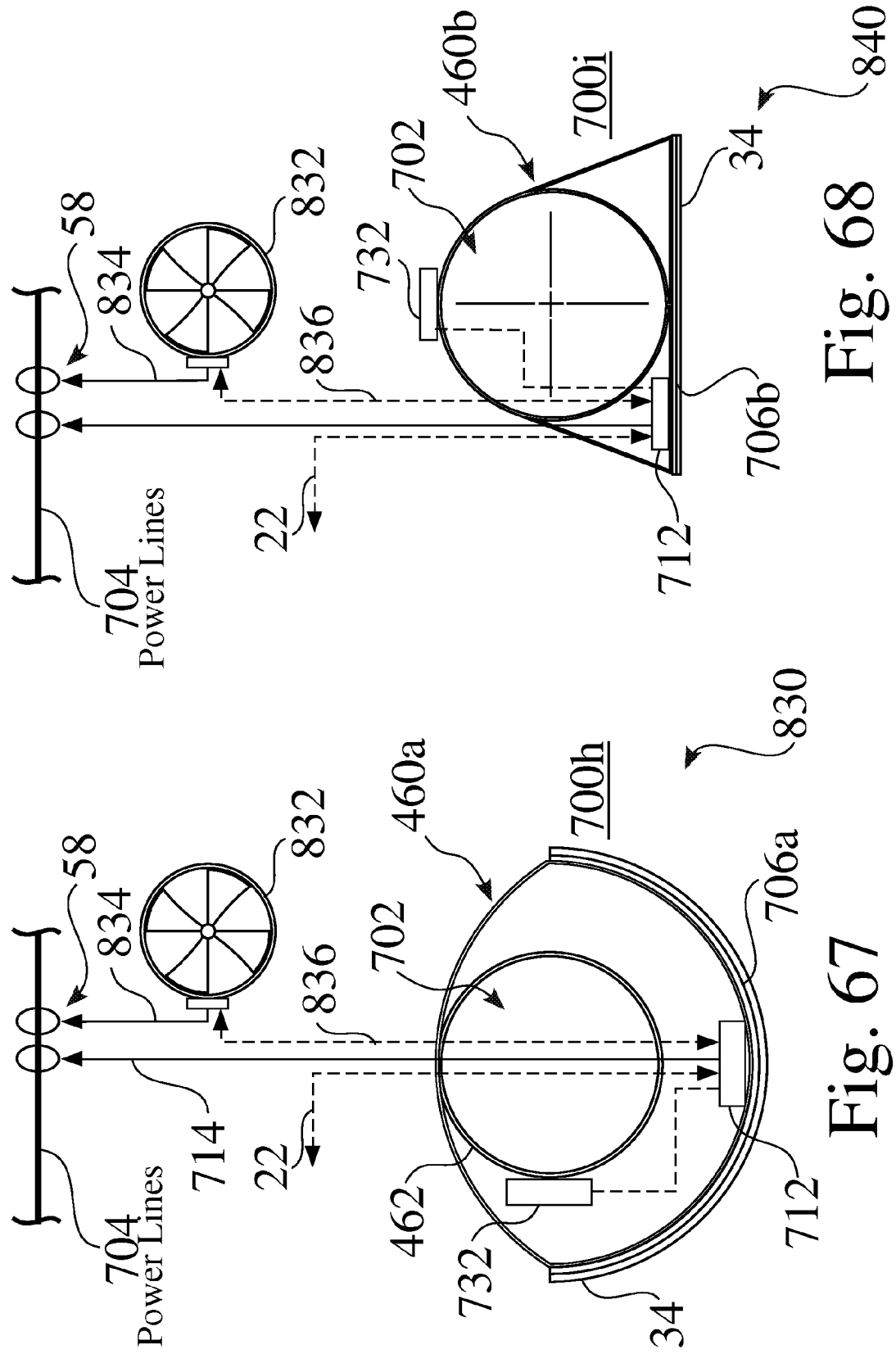

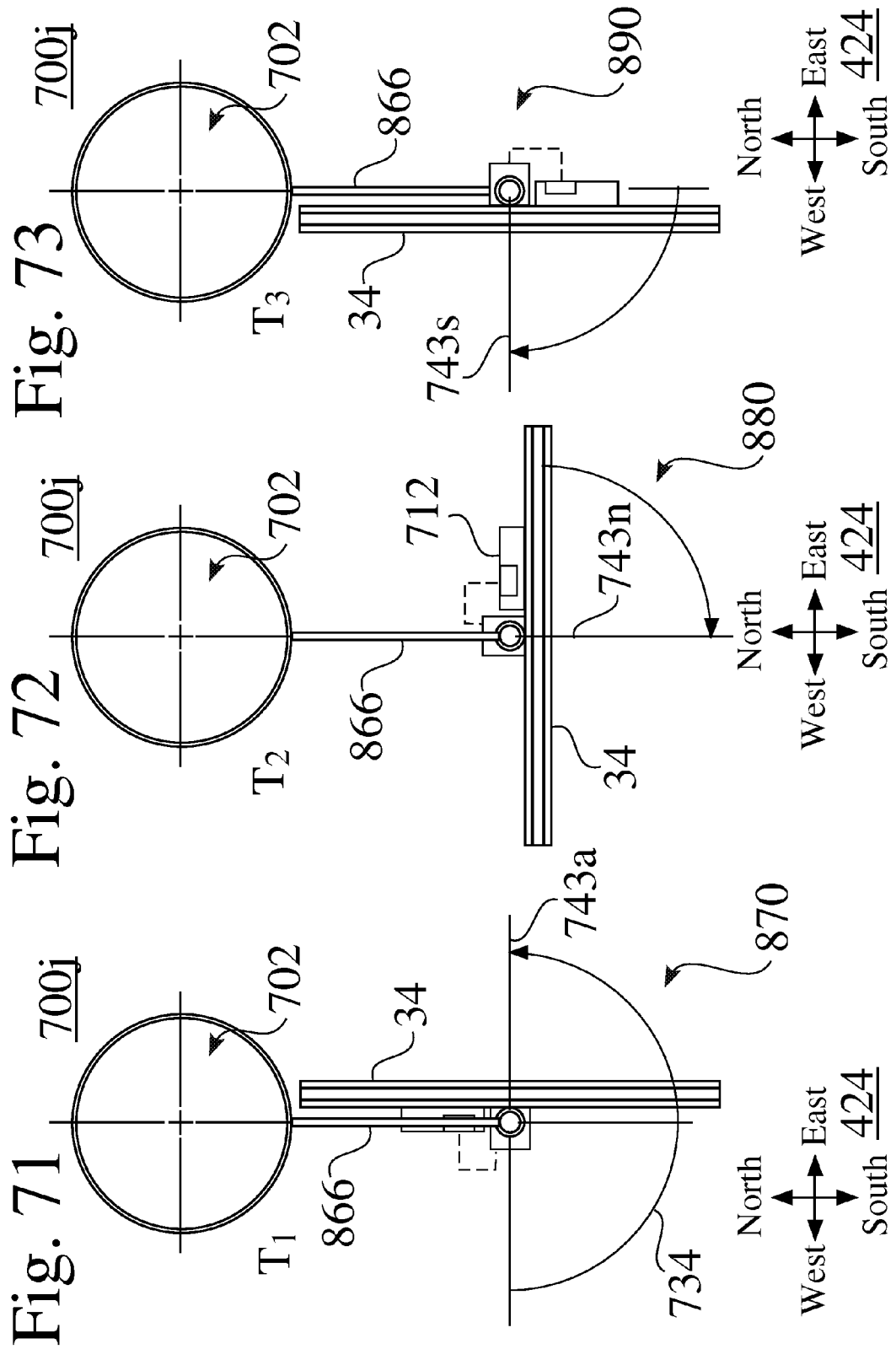

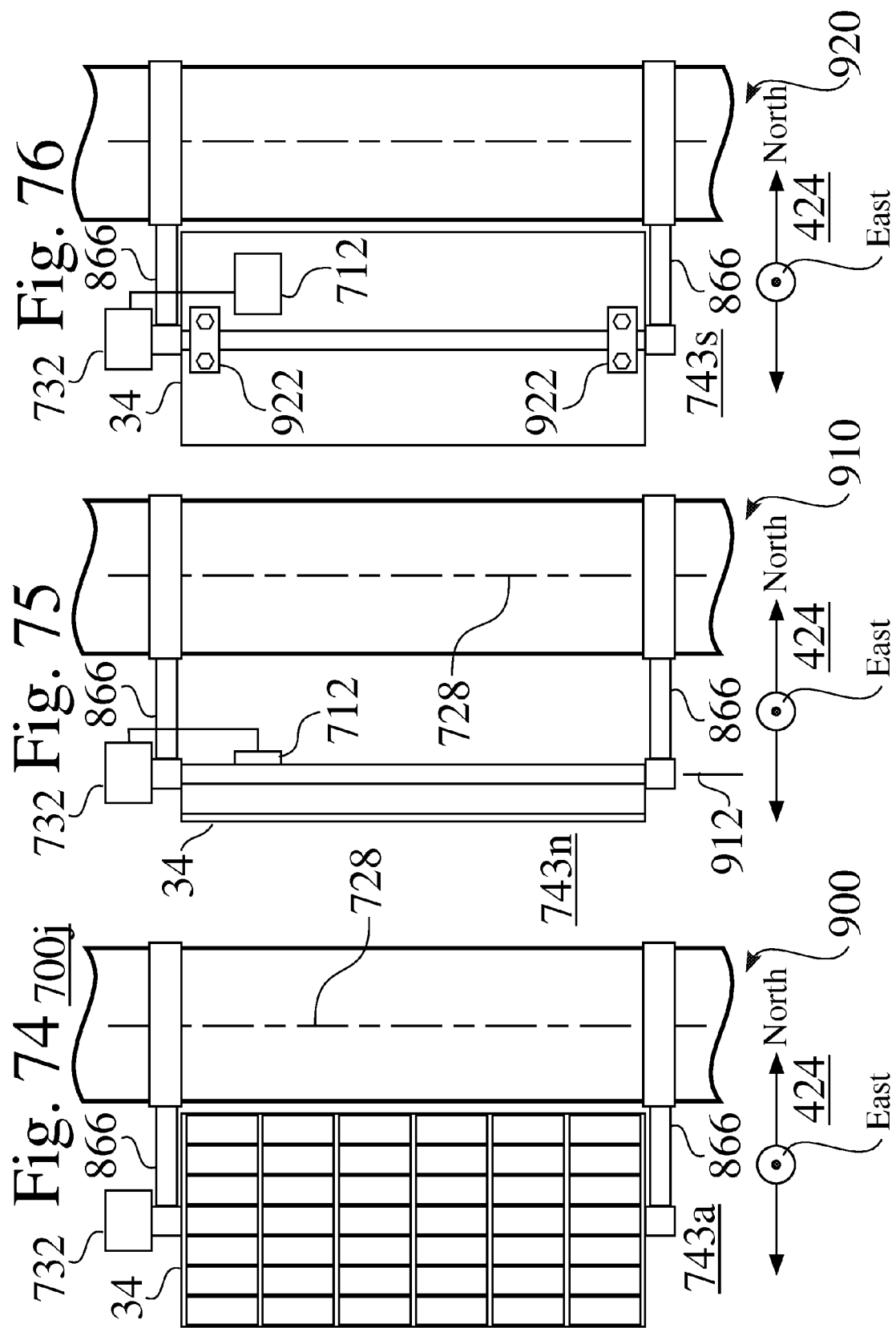

POLE-MOUNTED POWER GENERATION SYSTEMS, STRUCTURES AND PROCESSES

CROSS REFERENCE TO RELATED APPLICATIONS

This Application Claims Priority to U.S. Provisional Application No. 61/534,802, entitled Pole-Mounted Systems, Structures and Processes with Distributed Maximum Power Point Tracking and Tracking Mechanisms, filed 14 Sep. 2011, which is incorporated herein in its entirety by this reference thereto.

The Application is also a Continuation in Part and claims priority for commonly disclosed matter to PCT Application No. PCT/US2010/045352, entitled Enhanced Solar Panels, Liquid Delivery Systems and Associated Processes for Solar Energy Systems, filed 12 Aug. 2010, which claims priority to U.S. Provisional Application No. 61/234,181, entitled Distributed Maximum Power Point Tracking System, Structure, and Process with Enhanced Solar Panel Coating, Cleaning and Cooling, filed 14 Aug. 2009, which are each incorporated herein in their entirety by this reference thereto.

PCT Application No. PCT/US2010/045352 is also a Continuation in Part and claims priority for commonly disclosed matter to U.S. Application No. 12/842,864, entitled Distributed Maximum Power Point Tracking System, Structure and Process, filed 23 Jul. 2010, which is a Continuation of U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

The Application is also a Continuation in Part and claims priority for commonly disclosed matter to U.S. application Ser. No. 13/250,887, entitled Distributed Maximum Power Point Tracking System, Structure and Process, filed 30 Sep. 2011, which is a Continuation of U.S. application Ser. No. 12/842,864, entitled Distributed Maximum Power Point Tracking System, Structure and Process, filed 23 Jul. 2010, which was issued as U.S. Pat. No. 8,035,249 on 11 Oct. 2011, which is a Continuation of U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908,361, entitled Distributed Multiple Power Point Tracking, filed 27 Mar. 2007, which are each incorporated herein in their entirety by this reference thereto.

The Application is also related to PCT Application No. PCT/US08/58473, entitled Distributed Maximum Power Point Tracking System, Structure and Process, filed 27 Mar. 2008, which claims priority to U.S. application Ser. No. 12/056,235, entitled Distributed Maximum Power Point Tracking System, Structure and Process, filed 26 Mar. 2008, which was issued as U.S. Pat. No. 7,772,716 on 10 Aug. 2010, which claims priority to U.S. Provisional Application No. 60/908,361, entitled Distributed Multiple Power Point Tracking, filed 27 Mar. 2007.

FIELD OF THE INVENTION

The present invention relates generally to the field of distributed solar power generation systems. More particularly, the present invention relates to distributed solar power system structures, operation and control, and enhanced inverter systems, structures, and processes.

BACKGROUND OF THE INVENTION

Solar power is a clean renewable energy resource, and is becoming increasingly important for the future of this planet. Energy from the Sun is converted to electrical energy via the photoelectric effect using many photovoltaic cells in a photovoltaic (PV) panel. Power from a PV panel is direct current (DC), while modern utility grids require alternating current (AC) power. The DC power from the PV panel must be converted to AC power, of a suitable quality, and injected into the grid. A solar inverter accomplishes this task.

It would be advantageous to provide a structure, system and process to improve the efficiency of power inverters, such as for a solar panel system. Such a development would provide a significant technical advance.

To maximize the amount of power harvested, most solar inverters perform a maximum power point tracking (MPPT) algorithm. These algorithms treat an entire array of PV panels as a single entity, averaging all of the PV panels together, with a preference towards the weakest link.

It would therefore also be advantageous to provide a structure, system and process, to maximize efficiency and harvest capabilities of any solar PV system, to capitalize on profit and maximum return for the owner of the system.

Three specific examples of DC energy sources that currently have a role in distributed generation and sustainable energy systems are photovoltaic (PV) panels, fuel cell stacks, and batteries of various chemistries. These DC energy sources are all series and parallel connections of basic "cells". These cells all operate at a low DC voltage, ranging from less than a volt (for a PV cell) to three or four volts (for a Li-Ion cell). These low voltages do not interface well to existing higher power systems, so the cells are series connected, to create modules with higher terminal voltages. Paralleled modules then supply increased power levels to an inverter, for conversion to AC power.

These long strings of cells bring with them many complications. While the current exemplary discussion is focused on PV Panels, other power systems and devices are often similarly implemented for other sources of DC power.

A problem occurs when even a single cell in a PV array is shaded or obscured. The photocurrent generated in a shaded cell may drop to around 23.2% of the other cells.

The shaded cell is reverse biased by the remaining cells in the string, while current continues to flow through the shaded cell, causing large localized power dissipation. This power is converted to heat, which in turn lowers the panel's output power capability. Bypass diodes, generally placed in parallel around each 24 cells (which may vary between manufacturers), limit the reverse bias voltage and hence the power dissipation in the shaded cell, to that generated by the surrounding half panel. However, all the power from that sub-string is lost, while current flows in the bypass diode. As well, the bypass diode wastes power from the entire string current, which flows through the panel. The output voltage of the entire string is also negatively affected, causing an even larger imbalance in the system.

Conventional module MPP currents may become unbalanced for other reasons. PV panels in a string are never identical. Because each PV panel in a series string is constrained to conduct the same current as the other PV panels in the string, the least efficient module sets the maximum string current, thereby reducing the overall efficiency of the array to the efficiency of this PV panel. For similar reasons, PV panels in a string are conventionally required to be mounted in the same orientation, and to be of identical size. This is not always possible or desirable, such as for aesthetic or other architectural reasons.

In standard solar array wiring, several series strings of solar panels are wired in parallel to each other to increase power. If there is an imbalance between these paralleled strings, current flows from the higher potential strings to the lower potential strings, instead of flowing to the inverter. Just as it is important to match the cells within a panel, it is also necessary to match the panels in a string, and then to match the strings, for maximum harvest from the solar array. If small fluctuations in environmental conditions occur, it can have a large impact on the system as a whole.

Solar inverters also "average" the entire array when they perform a conventional MPPT function. However, it is not a true average, since there is a preference that leans towards the weakest link in the system. This means that, even though some panels may be capable of supplying 100 percent of their rated power, the system will only harvest a fraction of that power, due to the averaging effect of the algorithm, and the current following through the weaker string, panel, and/or cells.

It would therefore be advantageous to provide a means for applying an algorithm that maximizes the harvest of power from a string, panel, and/or cells. Such an improvement would provide a significant advance to the efficiency and cost effectiveness of power cells structures, processes, and systems.

All public utilities in the United States have been tasked by the Federal Government to generate 25 percent of their electricity from renewable sources by 2020. Some states have mandated even higher percentages of renewable energy. For example, in 2011, California passed a law to raise the amount of renewable energy that all California utilities must use to 33 percent by 2020. While some states, such as California, already produce renewable energy through large hydropower installations, the need to increase electricity production through solar power is increasing rapidly.

Some current distributed solar panel installations, such as currently offered through Petra Solar, Inc., of South Plainfield N.J., comprise stationary brackets that are mountable to utility distribution poles, which support traditional, silicon-based, non-flexible solar panels that are locally connected to the power grid. In a typical installation, a 32 inch wide by 62 inch long silicon-based rigid solar panel is fixedly mounted at a +/−30 degree angle onto the a utility distribution pole.

Silicon panels are typically expensive, require direct light, and tolerate only a slight offset to the sun to provide power. As well, such silicon panels don't react to reflected light sources well. Furthermore, rigid silicon-based panels are fragile, and are susceptible to damage, such as by but not limited to rocks, bullets, or birds. As well, particularly when fixedly mounted at an inclined angle to a utility distribution pole, silicon-based panels are not self-cleaning, and are difficult to manually clean by hand.

It would be advantageous to provide a pole mounted solar power structure, process and system that provides enhanced power harvest, monitoring, and control for a wide variety of installations. The development of such a system would provide a significant advance to the efficiency and cost effectiveness of distributed power cells structures, processes, and systems.

One current alternative to traditional, silicon-based, non-flexible solar panels that are fixedly mounted to power distribution poles is offered through NextStep Electric, Inc., of Longmont, Colo. Flexible thin-film panels, having an adhesive backing, are wrapped directly to a power pole, and are connected to the local power grid through a micro-inverter 712. When the mounting surface of the pole surface is clean, uncluttered, and consistent, the adhesive mounting of flexible thin-film panels may provide a fast, simple, and inexpensive installation. As the flexible panels are mounted vertically to the ground, they can be considered to be at least partially self-cleaning, since less dirt accumulates on the vertical panel surfaces, and at least a portion of any accumulated dirt is cleaned through any of wind, rain, dew, or fog.

Thin-film panels are typically less fragile than silicon panels. In most cases, a thrown rock will bounce off the panel without harm. While a gunshot may penetrate the panel and cause a small loss of efficiency, it will not normally disable the panel as with silicon. Furthermore, thin-film technology is more tolerant at producing electricity from indirect and reflected light than are traditional, silicon-based solar panels.

While installations that comprise flexible thin-film panels that are attached directly to power poles may provide easier installation, improved cleaning, and tolerance to incident light direction to that of traditional, silicon-based, non-flexible solar panels, such installations are inherently limited to the available circumferential surface area of the utility pole.

It would be advantageous to provide a pole mounted solar power structure, process and system that provides a greater surface area than that of flexible thin-film panels that are attached directly to power poles, which also provides any of enhanced cleaning, robustness, monitoring, and control for a wide variety of installations. The development of such a system would provide a further significant advance.

SUMMARY OF THE INVENTION

Solar power systems and structures are mountable to a power distribution structure, e.g. a power pole or tower, which supports alternating current (AC) power transmission lines. An exemplary power generation structure is fixedly attached to and extends from the power distribution structure, and comprises a mounting rack. A solar array comprising at least one solar panel is affixed to the mounting rack. A DC to AC invertor is connected between the DC outputs of the solar array and the AC power transmission lines. The length of the solar array is generally in alignment with the power distribution structure, and the width of the solar array is greater than half the circumference of the power distribution structure. The mounting rack and solar array may preferably be rotatable, such as based on any of location, time of day, or available light.

BRIEF DESCRIPTION OF THE DRAWINGS

FIG. 15 is a block diagram of a modular power module housing having two sub-modules installed;

FIG. 16 is a block diagram of a modular power module housing having three sub-modules installed;

FIG. 17 is a block diagram of a modular power module housing having a four sub-module installed;

FIG. 44 is top schematic view of an exemplary horizontal channel stay;

FIG. 45 is a front schematic view of an exemplary horizontal channel stay;

FIG. 46 is a side schematic view of an exemplary horizontal channel stay;

FIG. 47 is a perspective view of an exemplary horizontal channel stay;

FIG. 54 is a partial front view of an exemplary pole-mounted rotatable arched solar power structure having an enhanced DMPPT module;

FIG. 55 is a partial schematic view of an exemplary pole-mounted rotatable arched solar power structure located in the Northern Hemisphere at a first time, wherein the solar array is rotatably positioned in a generally Eastward direction;

FIG. 56 is a partial schematic view of an exemplary pole-mounted rotatable arched solar power structure located in the Northern Hemisphere at a second time, wherein the solar array is rotatably positioned in a generally Southward direction;

FIG. 57 is a partial schematic view of an exemplary pole-mounted rotatable arched solar power structure located in the Northern Hemisphere at a third time, wherein the solar array is rotatably positioned in a generally Westward direction;

FIG. 61 is a partial schematic view of an exemplary pole-mounted rotatable flat solar power structure located in the Northern Hemisphere at a first time, wherein the solar array is rotatably positioned in a generally Eastward direction;

FIG. 62 is a partial schematic view of an exemplary pole-mounted rotatable flat solar power structure located in the Northern Hemisphere at a second time, wherein the solar array is rotatably positioned in a generally Southward direction;

FIG. 63 is a partial schematic view of an exemplary pole-mounted rotatable flat solar power structure located in the Northern Hemisphere at a third time, wherein the solar array is rotatably positioned in a generally Westward direction;

FIG. 64 is a partial schematic view of a transmission line mounted solar power structure;

FIG. 65 is a partial schematic view of an exemplary pole-mounted arched solar concentrating power structure;

FIG. 66 is a partial schematic view of an exemplary pole-mounted flat solar concentrating power structure;

FIG. 67 is a partial schematic view of an exemplary pole-mounted arched solar power structure that is integrated with a wind turbine;

FIG. 68 is a partial schematic view of an exemplary pole-mounted flat solar power structure that is integrated with a wind turbine;

FIG. 71 is a partial bird's eye schematic view of an exemplary pole-mounted rotatable flat solar power structure located in the Northern Hemisphere at a first time, wherein the solar array is rotatably positioned in a generally Eastward direction;

FIG. 72 is a partial bird's eye schematic view of an exemplary pole-mounted rotatable flat solar power structure located in the Northern Hemisphere at a second time, wherein the solar array is rotatably positioned in a generally Southward direction;

FIG. 73 is a partial bird's eye schematic view of an exemplary pole-mounted rotatable flat solar power structure located in the Northern Hemisphere at a third time, wherein the solar array is rotatably positioned in a generally Westward direction;

FIG. 74 is a side schematic view of an exemplary pole-mounted rotatable flat solar power structure located in the Northern Hemisphere at a first time, wherein the solar array is rotatably positioned in a generally Eastward direction;

FIG. 75 is a side schematic view of an exemplary pole-mounted rotatable flat solar power structure located in the Northern Hemisphere at a second time, wherein the solar array is rotatably positioned in a generally Southward direction; and FIG. 76 is a side schematic view of an exemplary pole-mounted rotatable flat solar power structure located in the Northern Hemisphere at a third time, wherein the solar array is rotatably positioned in a generally Westward direction.

DETAILED DESCRIPTION OF PREFERRED EMBODIMENTS

Figure 1:
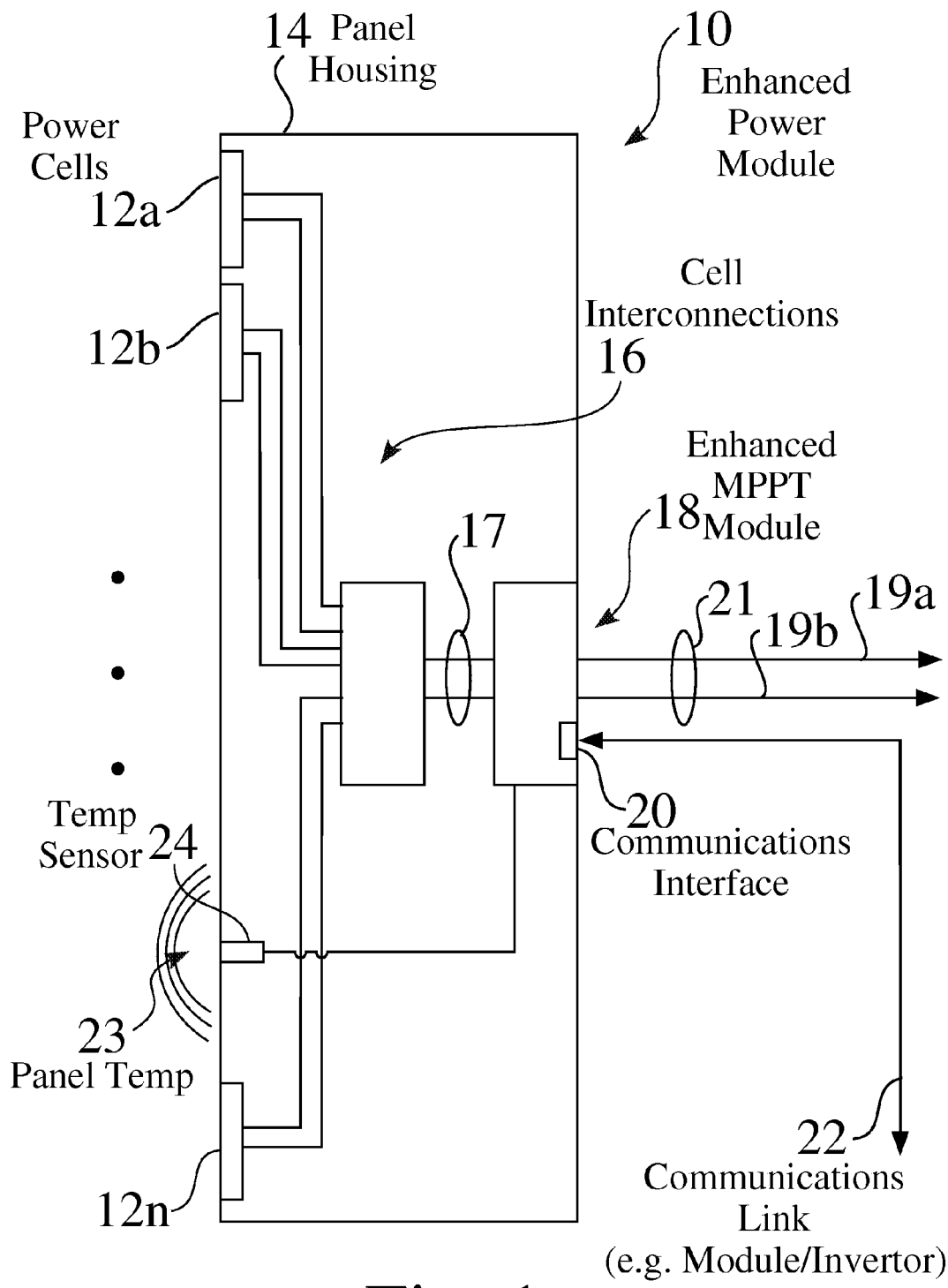
FIG. 1 is a schematic view of an exemplary enhanced power module comprising a plurality of power cells connected to a distributed maximum power point tracking module.
Figure 2:
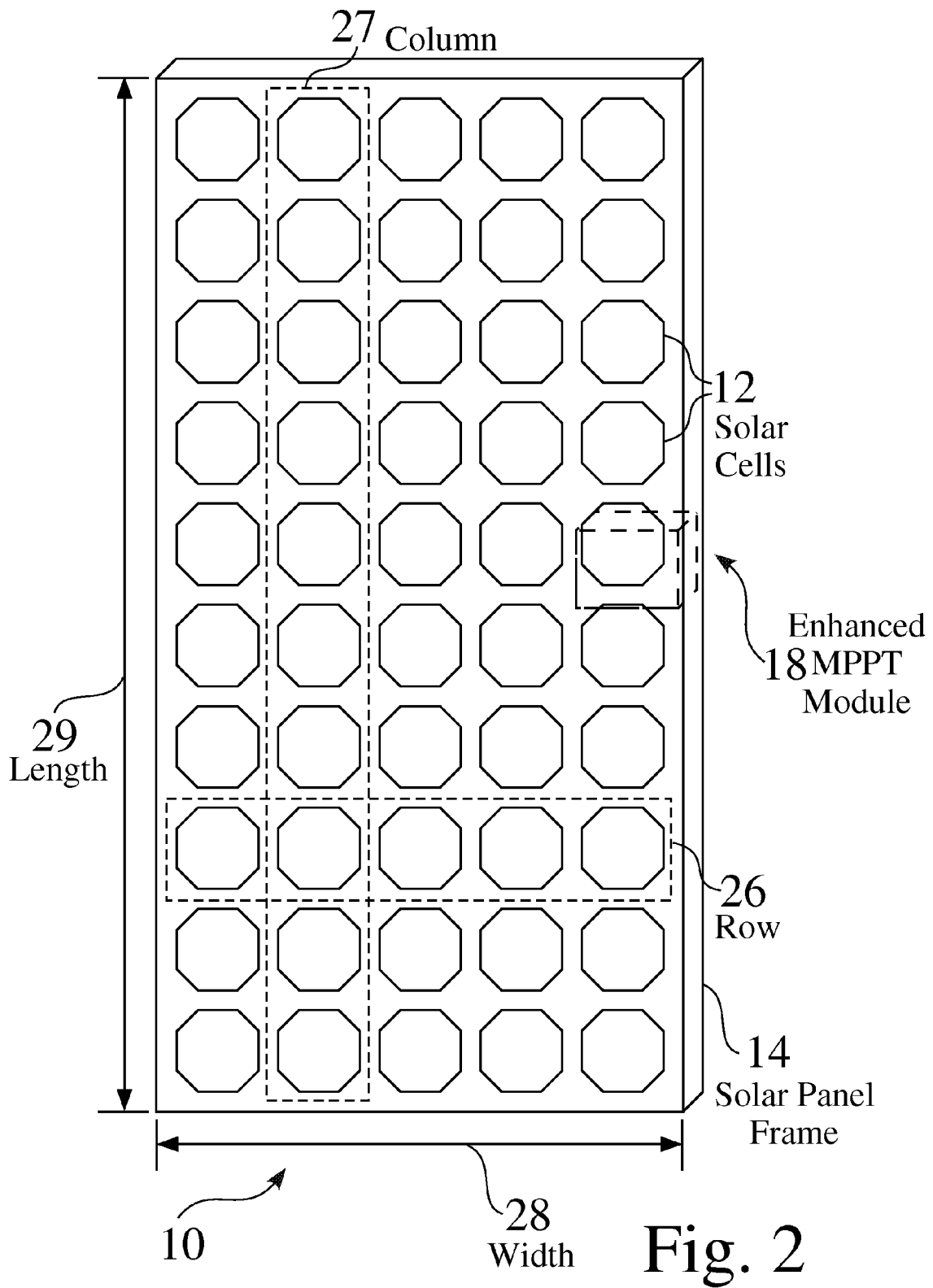
FIG. 2 is a schematic view of an exemplary enhanced solar panel comprising a plurality of solar cells and a distributed maximum power point tracking module.
Figure 3:
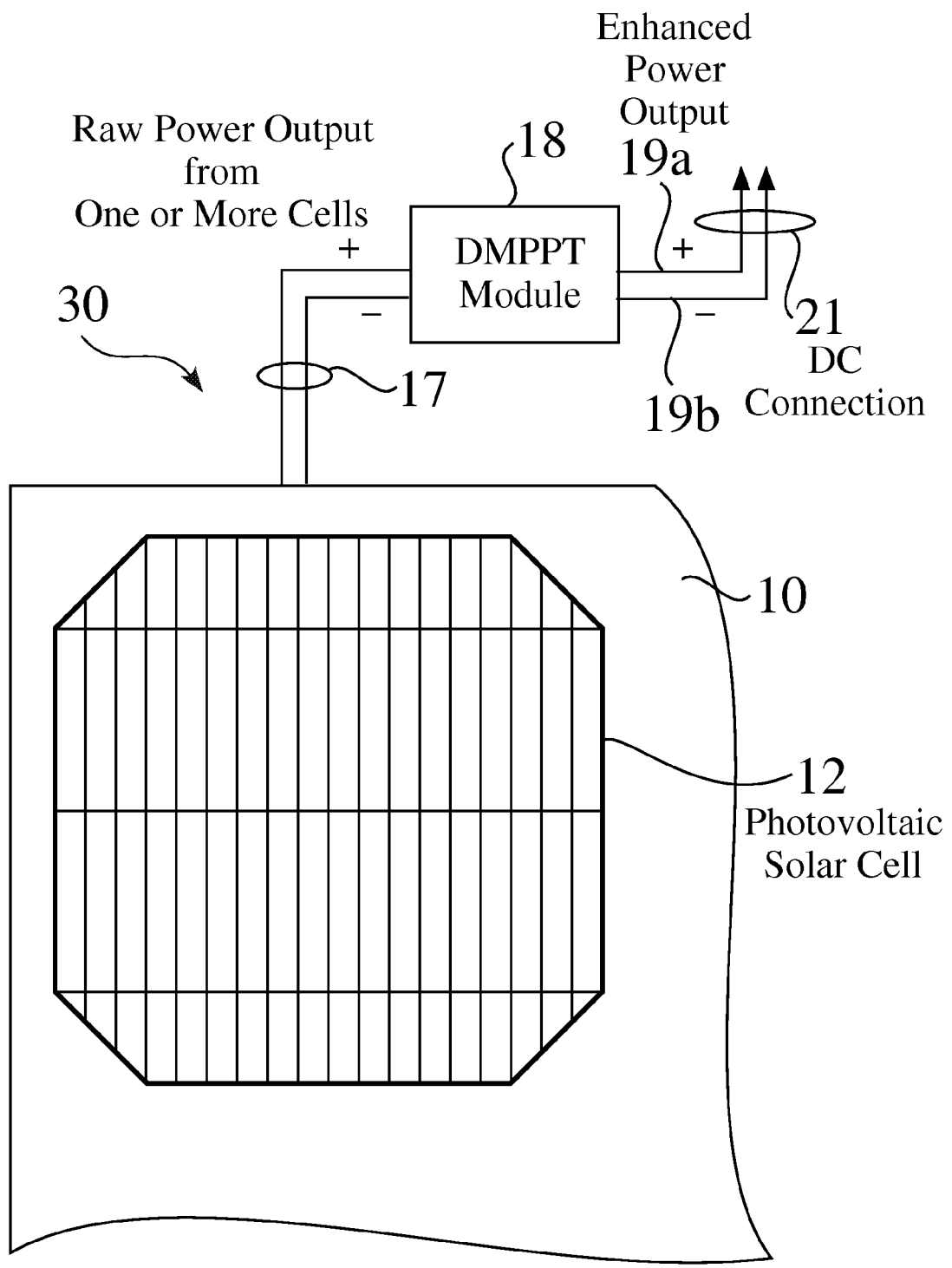
FIG. 3 is a schematic view of an exemplary photovoltaic solar cell having DC output power connections to a DMPPT module.
Figure 4:
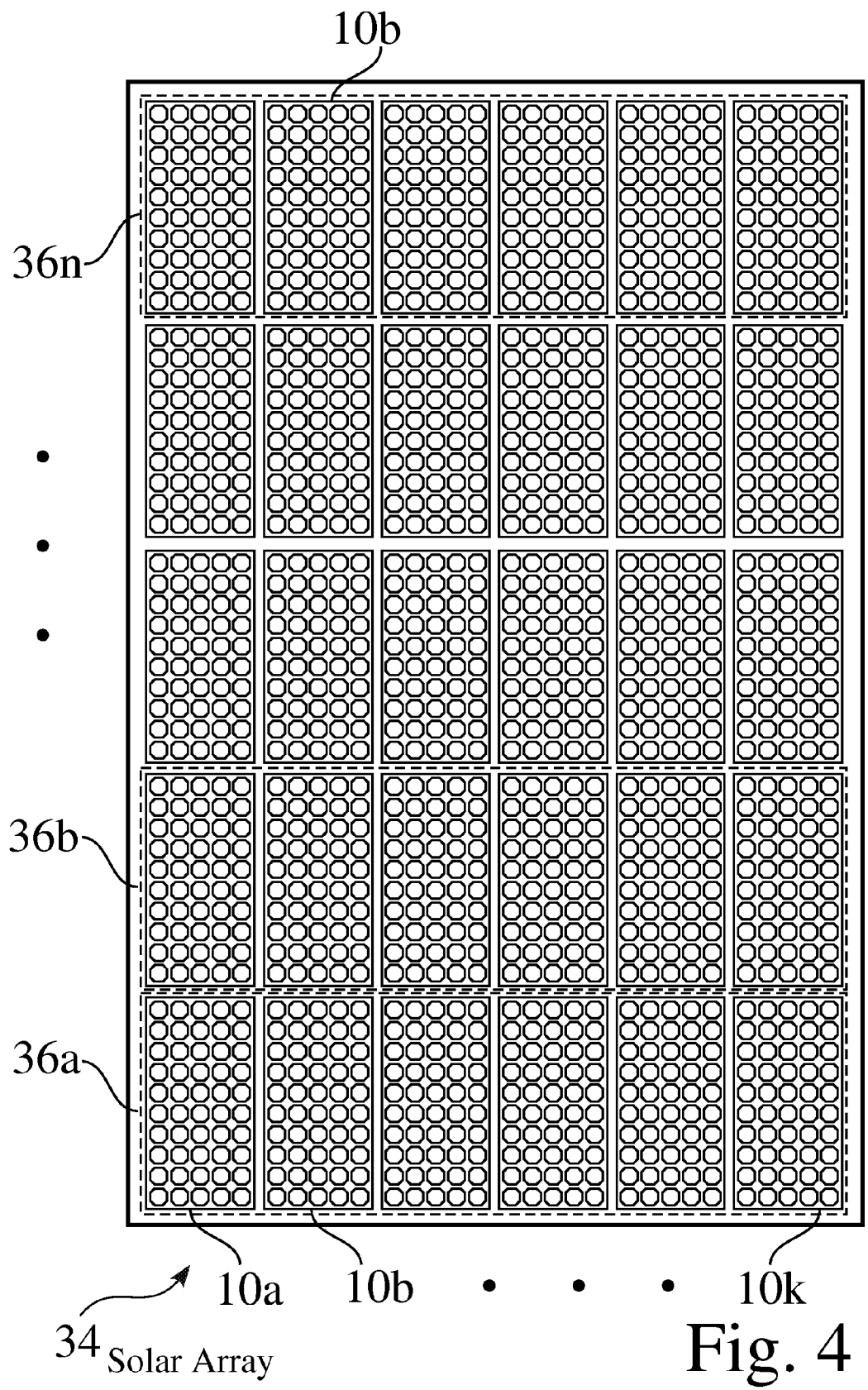
FIG. 4 is a schematic view of an exemplary solar array comprising a plurality of enhanced solar panels.

FIG. 1 is a schematic view of an exemplary enhanced power module 10 comprising a plurality of power cells 12, e.g. 12a-12n, such as but not limited to photovoltaic solar cells, fuel cells, and battery cells, connected 16,17 to a distributed maximum power point tracking (DMPPT) module 18. FIG. 2 is a schematic view of an exemplary enhanced power structure 10, e.g. an enhanced solar panel 10, comprising a plurality of solar cells 12 and a distributed maximum power point tracking module 18. FIG. 3 is a schematic view 30 of an exemplary photovoltaic solar cell having DC output power connections 17 to a DMPPT module 18. FIG. 4 is a schematic view of an exemplary solar array 34 comprising a plurality of enhanced solar panels 10, e.g. 10a-10k, arranged in a plurality of strings 36, e.g. 36a-36n.

The exemplary DMPPT module 18 seen in FIG. 1 has DC inputs 17, and a DC output 21, such as comprising a positive lead 19a and a negative lead 19b, The exemplary DMPPT module 18 also comprises a communications interface 20, and means for connection to a temperature sensor 24, such as responsive to a local panel temperature 23.

DMPPT modules 18, such as seen in FIG. 1, are preferably locally powered from the solar panel 10 that they are attached to, wherein each DMPPT module 18 draws its operating power from it's respective panel 10 that it is connected to, such as to reduce wiring and to improve efficiency.

DMPPT modules 18 are currently implemented for both new panels 10, i.e. at the point of manufacture, and for existing systems, wherein the DMPPT modules 18 may be retrofitted to existing panels 10. As also seen in FIG. 1, the external DC connection 21, comprising leads 19a,19b, is similar to the input DC connection 17, such as provided by an existing conventional panel. Therefore, wiring for the DMPPT modules is similar to conventional solar panels, which minimizes the learning curve for installation personnel.

The communications link 22 shown in FIG. 1 may be a wired connection or a wireless connection, such as to provide flexibility in design and installation. For example, the DMPPT module 18 can communicate via a wireless network, or through a wired connection, e.g. single twisted pair standard RS485 cable.

Some embodiments of either the wired or wireless style DMPPT modules feature a self-discovery function, such that when a new DMPPT module 18 is added to a system 40 (FIGS. 5, 6, 14), the system server 153 (FIG. 14) discovers the new module 18 over the communications link 22, and adds the new module 18 and associated panel 10 to the system 40.

As well, some embodiments of wireless style DMPPT modules 18 feature a self-healing function, wherein a DMPPT module 18 having a wireless communication link 22 also has the ability to bypass non-functioning devices or branches.

For example, if a DMPPT Module 18 is broken or removed, such as by a thief, in a wireless system 40, everything continues to function. The system 40 sees the "broken" device 18, and continues normal communications with the other DMPPT modules 18. This ensures continuous communications with the other active DMPPT modules 18 in the system 40. In a wired system, this may typically cause the loss of communications with several modules 18, as the communications line 22 could be damaged, broken, or cut. In addition to the DMPPT modules 18 and inverters 54, other devices may preferably be connected to the wireless network 22. If something should happen to one of these, it will not affect the system 40 as a whole. Therefore, some system embodiments 40 comprise a self-discovery module, such as provided through the server 153, built into the software. As well, the system 40 can be expanded to include utility monitoring and other applications.

In a conventional solar panel system, solar cells 12 are typically matched to make efficient solar panels, and solar panels are typically matched to make efficient solar arrays. In a conventional solar system, the output of a solar array having a plurality of conventional solar panels, i.e. without DMPPT modules 18, can never match the sum of the maximum power of the conventional solar panels, and the conventional panels can never match the sum of the maximum power of the solar cells 12. In additional to such inherit losses of power, environmental conditions, e.g. such as but not limited to the time of day, season, weather, location, panel positioning, panel age, and/or panel condition, further degrade the short-term and/or long term efficiency of such systems.

Figure 5:
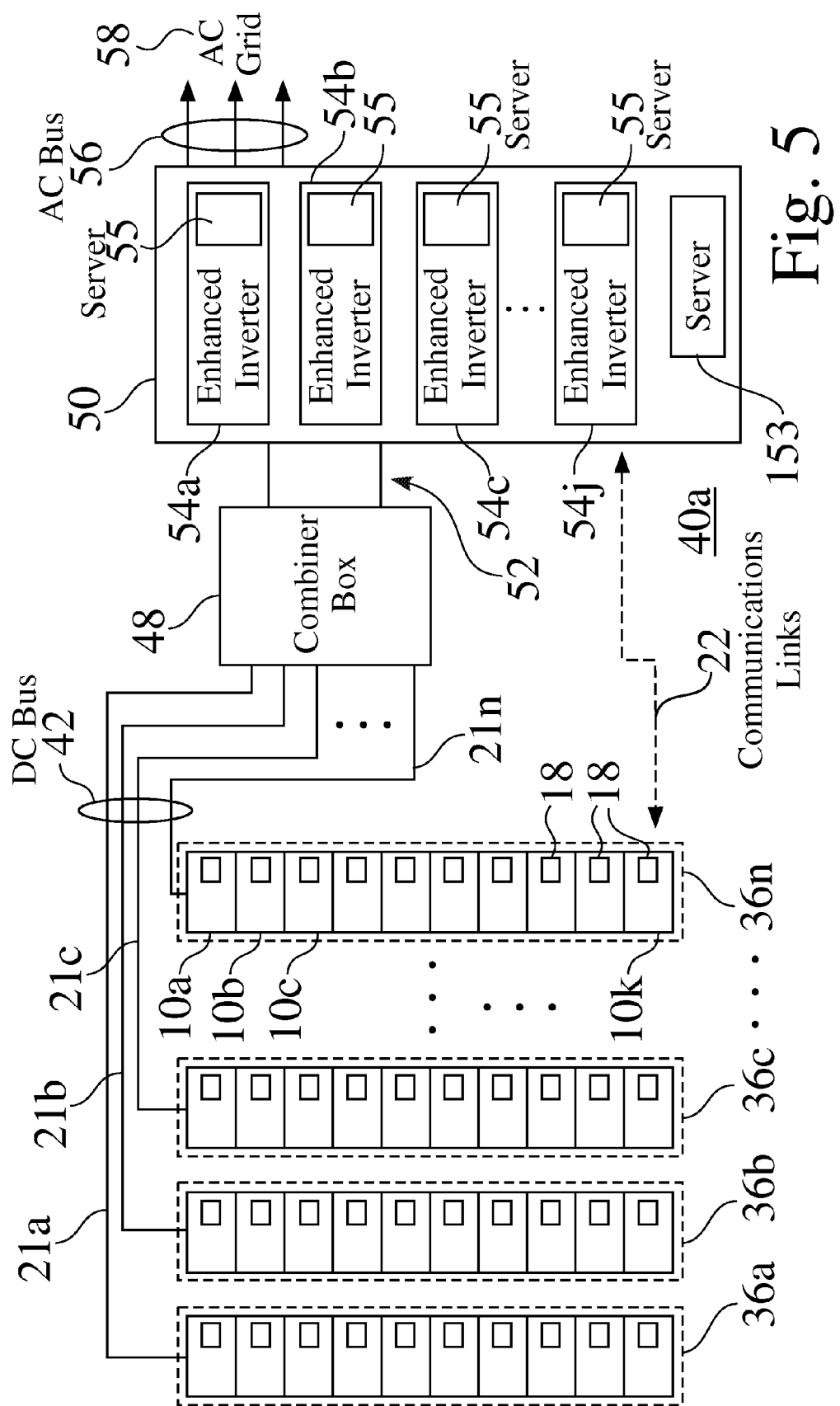
FIG. 5 is a schematic block diagram of an exemplary solar panel system having a plurality of strings of enhanced solar panels routed through a combiner box and controlled through a modular power module housing having one or more enhanced inverter modules.
Figure 6:
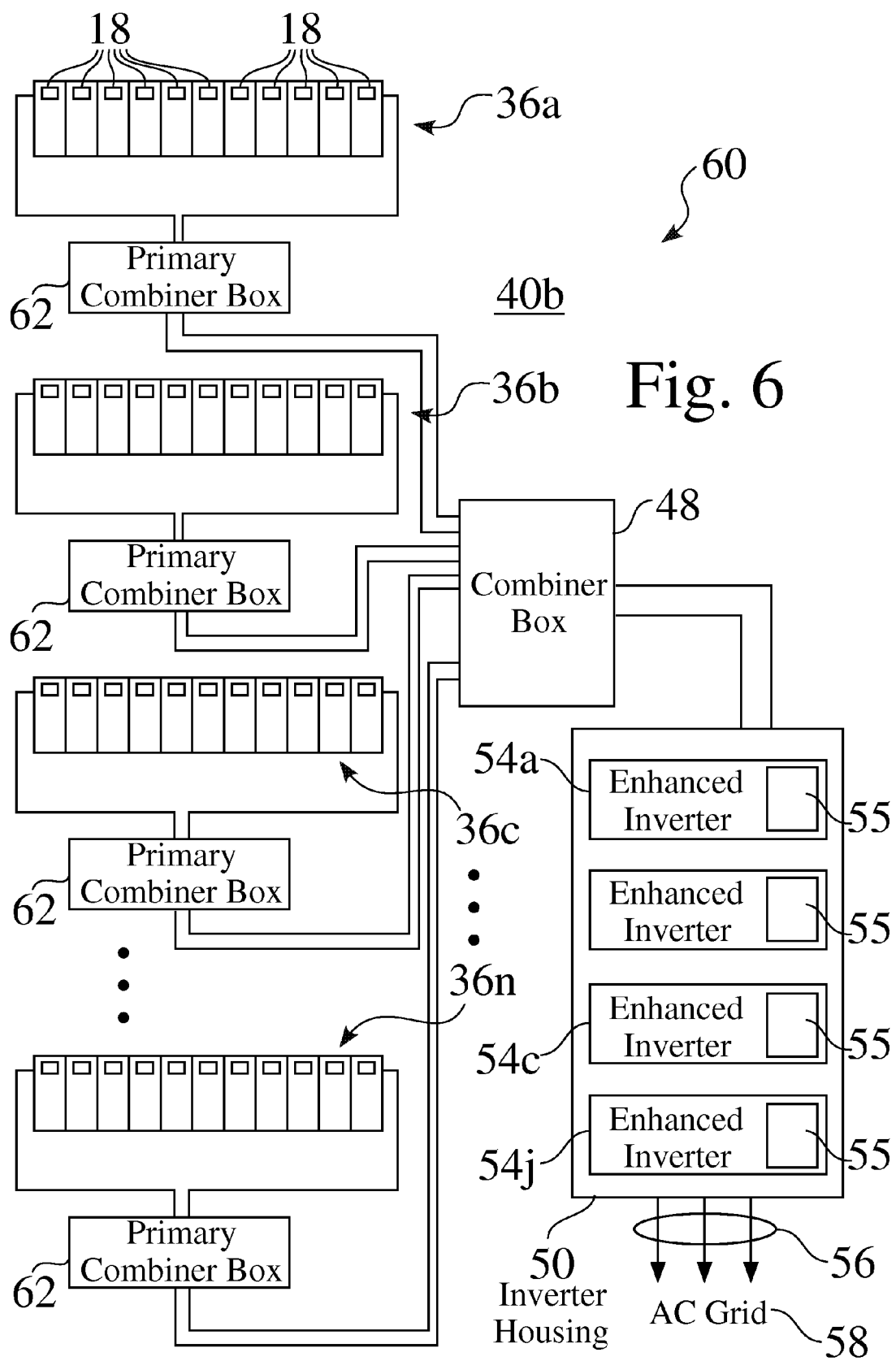
FIG. 6 is a schematic block diagram of an alternate exemplary solar panel system having a plurality of strings of enhanced solar panels having string-level combiner modules and routed through a combiner box and controlled through a modular power module housing having one or more enhanced inverter modules.

FIG. 5 is a schematic block diagram of an exemplary solar panel system 40, e.g. 40a, having a plurality of strings 36, e.g. 36a-36n, of enhanced solar panels 10, e.g. 10a-10k, routed through a combiner box 48 and controlled through a modular power module housing 50 having one or more enhanced inverter power modules 54, e.g. 54a-54j. FIG. 6 is a schematic block diagram 60 of an alternate exemplary solar panel system 40b having a plurality of strings 36, e.g. 36a-36n of enhanced solar panels 10 having string-level combiner modules 62, routed through a combiner box 48, and controlled through a modular power module housing 50 having one or more enhanced inverter power modules 54, e.g. 54a-54j.

Figure 7:
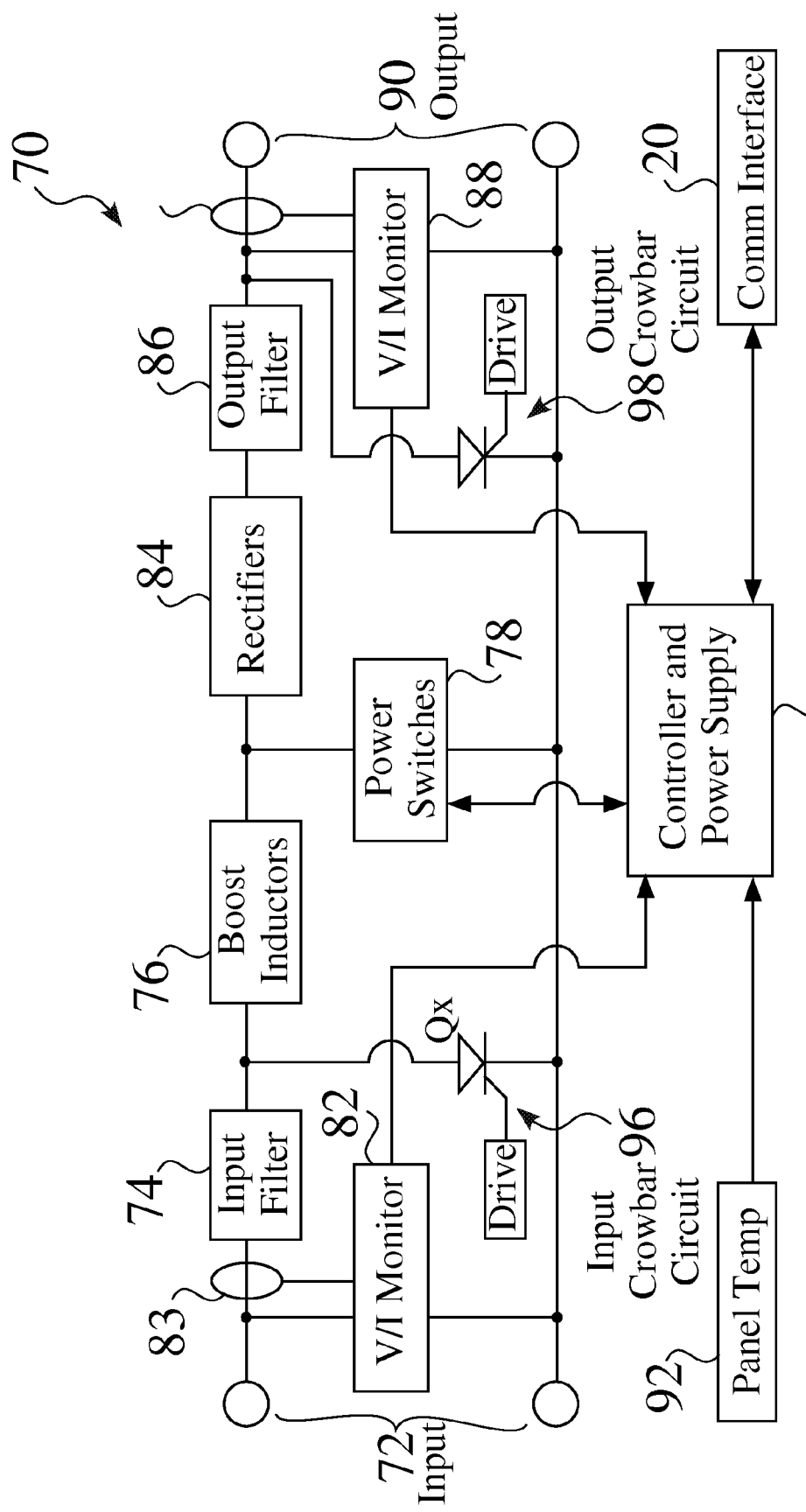
FIG. 7 is a block diagram of an exemplary distributed MPPT circuit.

FIG. 7 is a block diagram of an exemplary distributed MPPT circuit 70 for a distributed maximum power point tracker (DMPPT) module 18, which typically comprises an integrated or retrofitted module 18 for each enhanced solar panel 18. DMPPT modules 18 associated with the enhanced solar panels 10 overcome several problems inherent with conventional solar panels and the harvesting of power.

An input filter 74 is preferably attached to the input 72 of the DMPPT module 18, to help reduce EMI/RFI, as well as to supply protection from surges, etc. on the input side. This also helps in impedance matching between the solar panel 10 and the DMPPT module 18, such as to improve MPPT tracking.

The exemplary DMPPT module 18 shown in FIG. 7 preferably comprises one or more boost inductors 76, such as a dual inductively-coupled link inductor 76 to boost the efficiency of the DC-DC conversion stage. This has the added benefit of splitting the power path, which provides an increase in efficiency. At the present time, small inductor units 76 cost less and weigh less than a single inductor design, and there is less chance for core saturation. Another benefit of this design is the increased compensation factor. This allows a more stable distributed DC Bus 42,52 to be produced, with fewer requirements for DC-ripple and output filtering 86.

Some DMPPT embodiments 18 uses a multi-phase approach, wherein the controller 80 can reduce the current flow through the power switch 78, thus increasing efficiency and reducing the heat dissipation load. This also allows the DMPPT 18 to improve power harvesting of the solar panels 10. The controller 80 controls the switching of these power devices 78 in a modified spread-spectrum switching scheme, to minimize EMI/RFI radiation of the modules 18. Low loss switching devices 78 are used to improve overall efficiency. In some embodiments 18, these switching devices 78 comprise transistors, FETs, MOSFETs, IGBTs, or any other power-switching device 78 that meets the design criteria.

Two diodes typically provide rectification 84 for the DMPPT modules 18, thus reducing the power dissipation and providing a plurality of paths for the power flow. The rectification diodes 84 also effectively isolate each DMPPT module 18 and associated solar panel 18 from the system array 30, in case of total panel failure. Even if a DMPPT module 18 fails, this isolation still exists, if it was not the diodes 84 or the output filter 86 that failed. This increases the reliability of the system 40 as a whole.

As seen in FIG. 7, a filter 86 is preferably attached to the output of the DMPPT modules 18, to help reduce EMI/RFI, and to provide protection, e.g. from surges, on the output side 90. The output filter 86 also helps to stabilize the distributed DC bus 42,52 that feeds the solar inverter(s) 54.

The controlled production of DC output voltage at the DMPPT modules 18, having a higher voltage than the incoming voltage from the panels 10, reduces power transmission losses from the array 36 to the inverter(s) 54. For example, for a higher voltage DC output that is also stabilized, to get the same amount of power from the array 36 to an inverter 54 requires less current, since the power loss in the conductors is given as $I^2R$, where I is the current over the conductors, and R is the resistance. Therefore, the lower current due to the higher voltage results in less line drop losses, and more power to the inverter(s) 54.

In addition, the inverters 54 run at better efficiency with a stable DC Distributed Bus 42,52. While other conventional inverters experience better efficiency with a higher DC Bus input, as long as it is within the design specifications, the DMPPT module 18 may preferably boost the distributed DC voltage from the array 36, to maximize this benefit.

Figure 8:
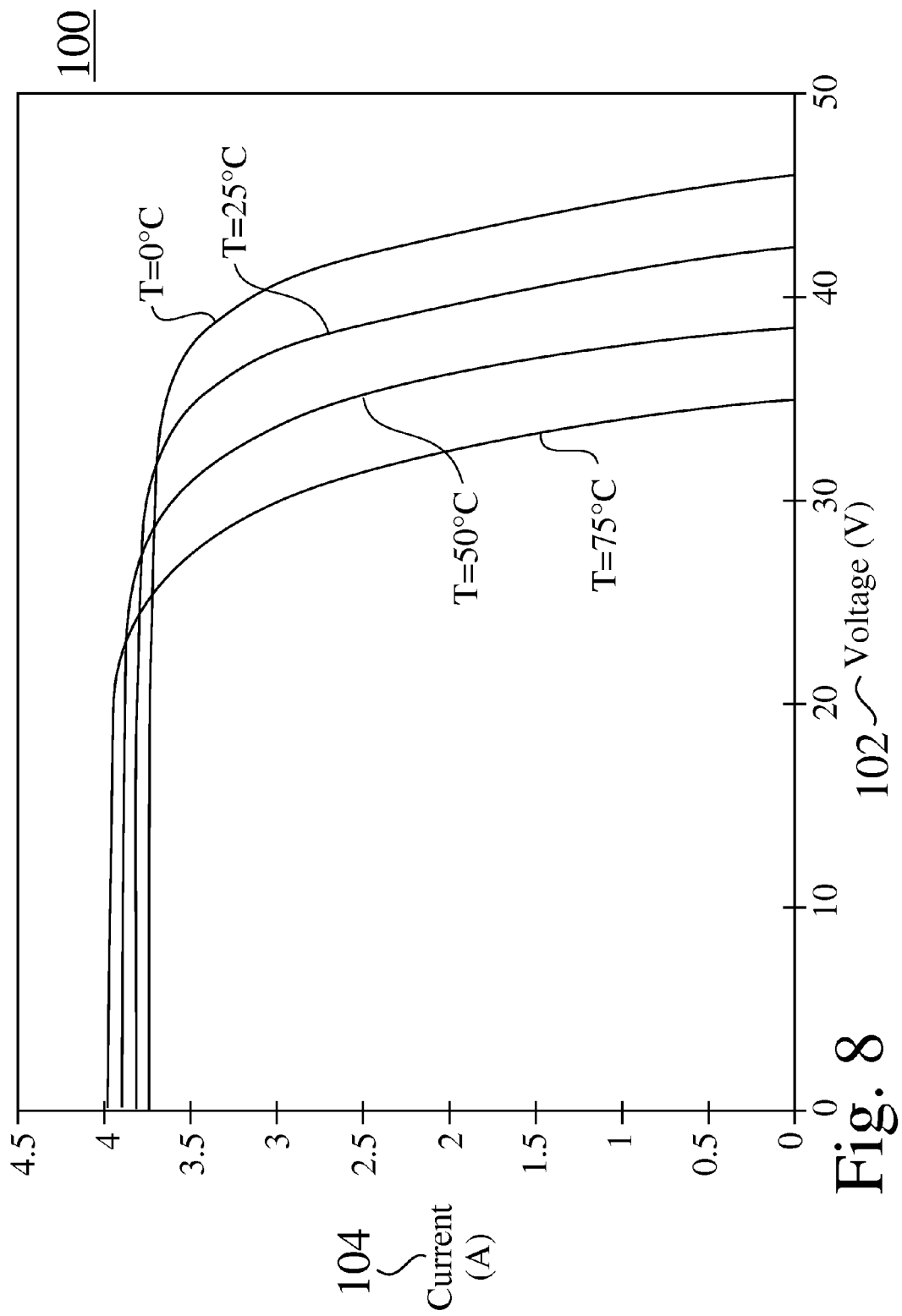
FIG. 8 is a first graph showing exemplary current-voltage (IV) curves of photovoltaic solar panels over a range of temperatures.
Figure 9:
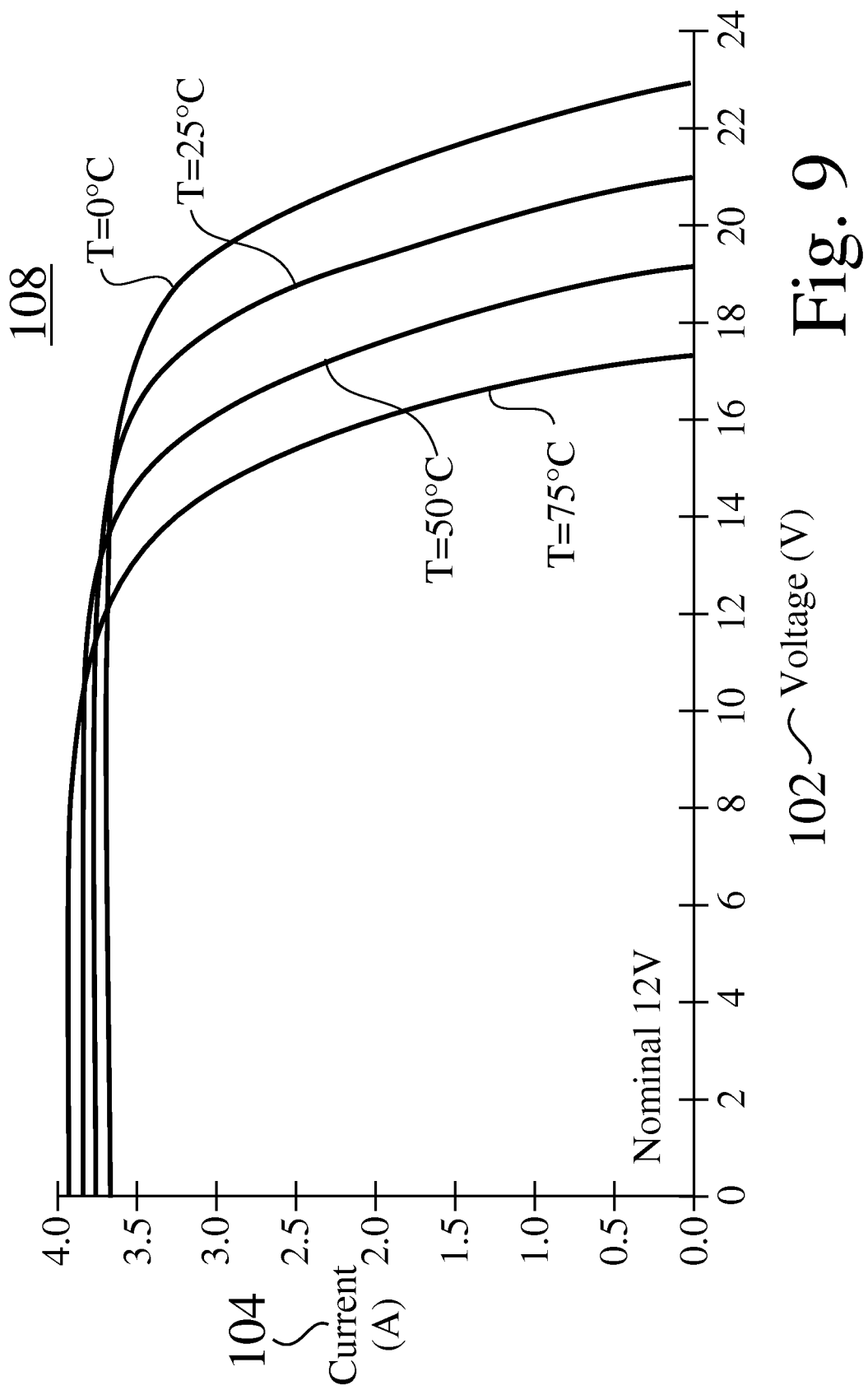
FIG. 9 is a second graph showing exemplary current-voltage (IV) curves of photovoltaic solar panels over a range of temperatures.

FIG. 8 and FIG. 9 show typical Current-Voltage (IV) curves of photovoltaic solar panels. These demonstrate how the voltage moves over a wider range than the current with temperature and solar radiation. The maximum power point for one or more panels moves during the day, and each panel experiences different environmental conditions, even within the same system. The distributed maximum power point tracking modules 18 and associated inverter system 40 provide several means to maximize the power output over a wide range of such conditions.

The panel temperature 23 (FIG. 1) is monitored and reported back to a server, such as an embedded server 153 associated with the inverter housing 50, or to a server 55 associated with a particular inverter 54. This temperature value is also used as an input to the multi-level MPPT controller 80 (FIG. 7). An op-amp may preferably be used to scale this value to be read by the controller 80, and is used as another control input to the controller 80 of the DMPPT module 18. In some embodiments of the DMPPT modules 18, a lead wire and temperature sensor 24 exit from the DMPPT Module 18 and attach to the panel 18. In alternate embodiments, a temperature sensor 124 is collocated with the DMPPT module 18, such as inside a panel junction box.

The embedded server 153 may preferably supply an ambient temperature, such as taken outside of the inverter cabinet 54, or outside a web server box, such as if another inverter is used at the site.

Operation of Distributed Maximum Power Point Tracking Modules.

Figure 10:
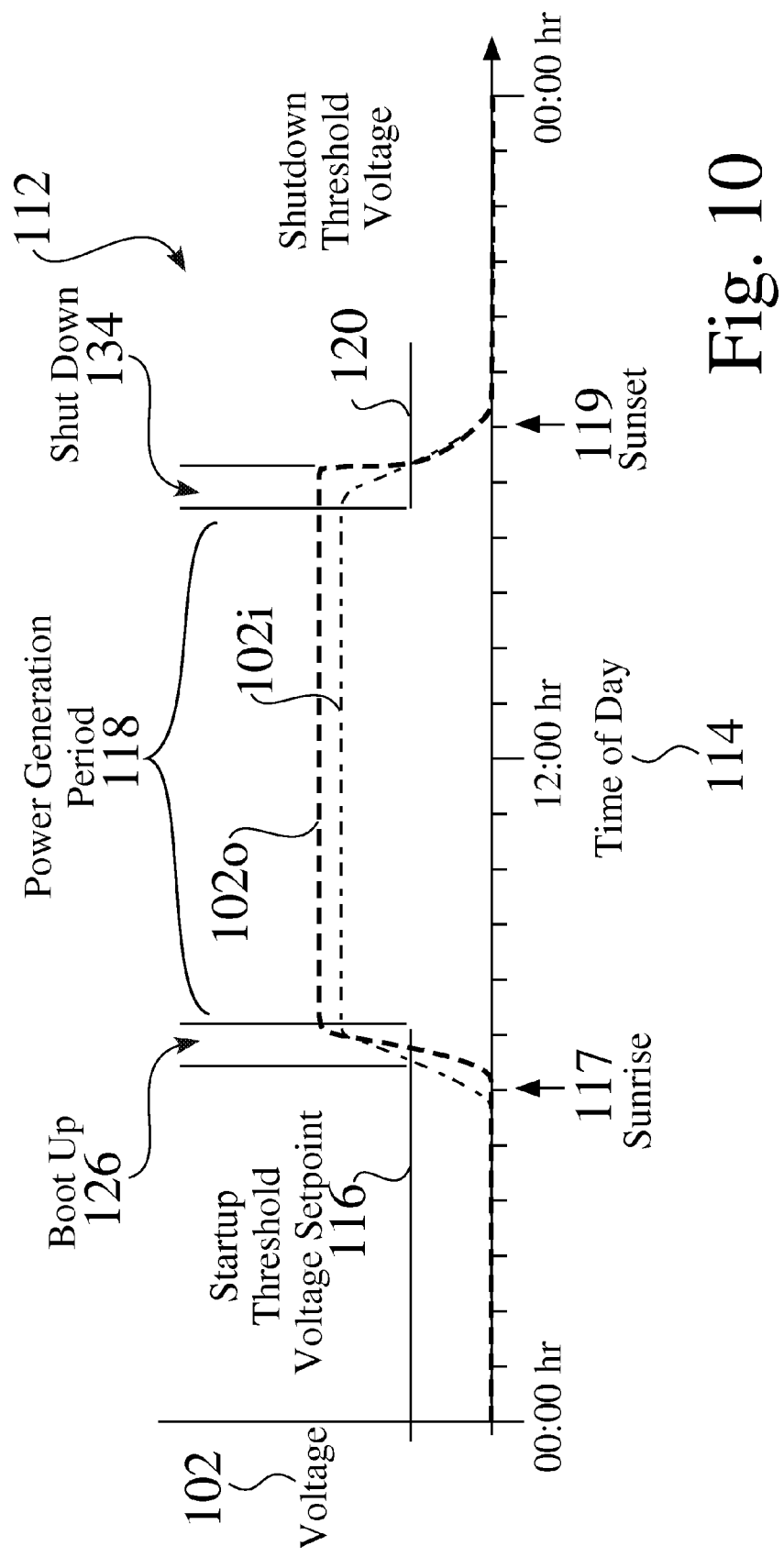
FIG. 10 is time chart of voltage output for an enhanced power module having a DMPPT module.
Figure 11:
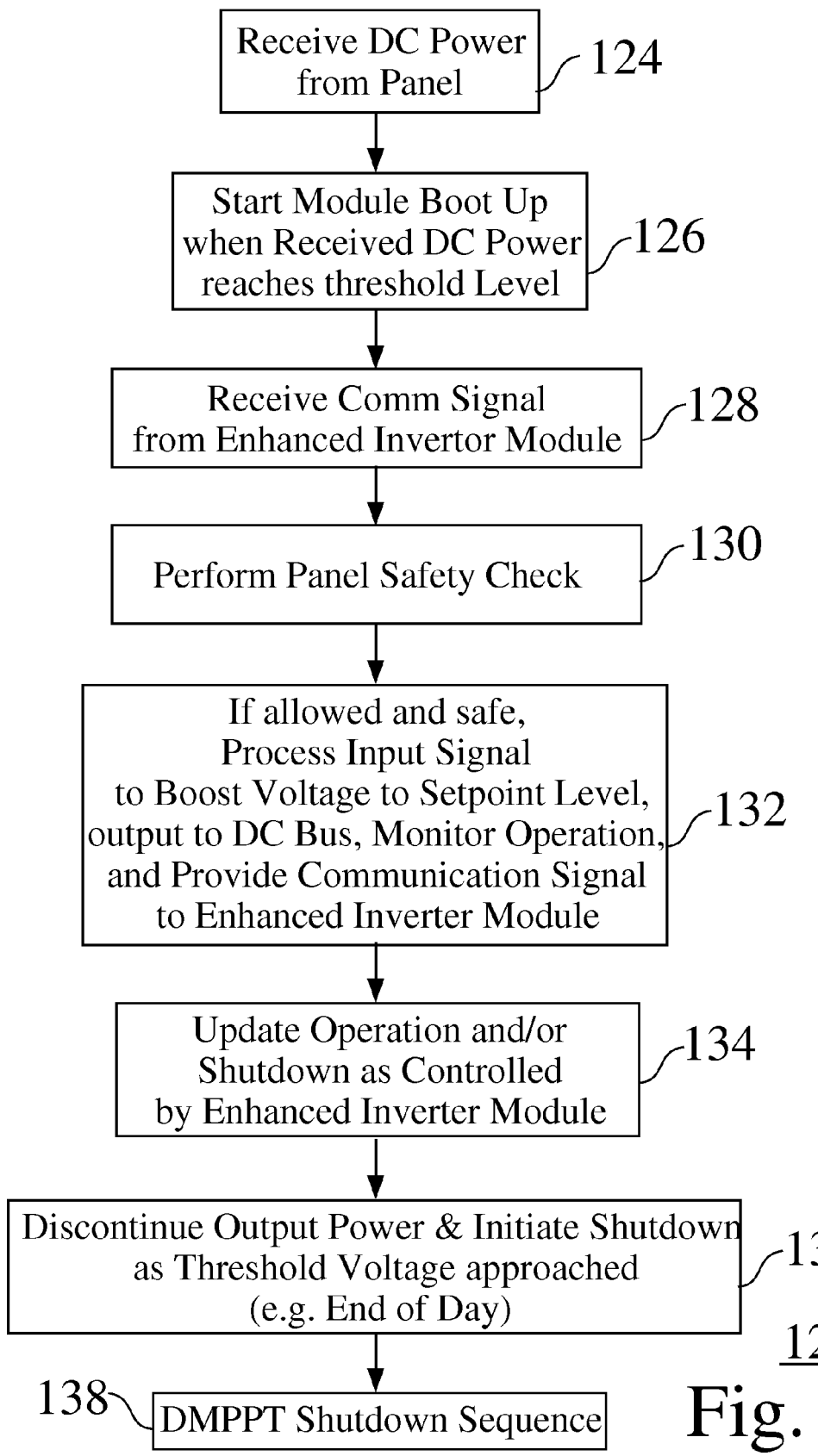
FIG. 11 is a flowchart of an exemplary operation of an enhanced power module having a DMPPT module.

FIG. 10 is time chart 112 showing operation states of the DMPPT 18, indicating DMPPT input voltage 102i, and output voltage 102o for an enhanced power module 10 having a DMPPT module 18. FIG. 11 is a flowchart of an exemplary process 122 for operation of an enhanced power module having a DMPPT module 18.

Figure 21:
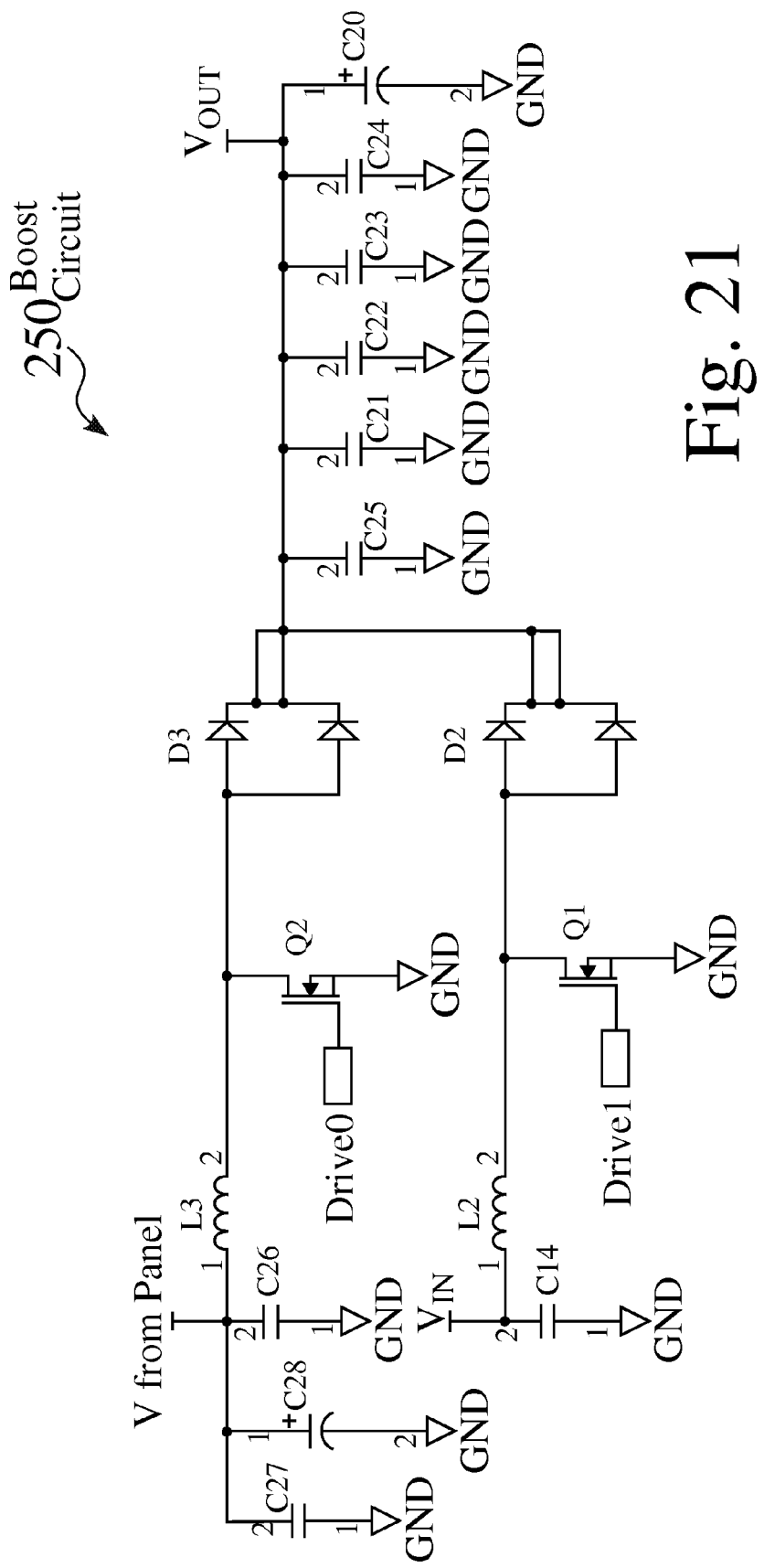
FIG. 21 is a schematic circuit diagram of an exemplary boost circuit for a DMPPT module.

As a solar panel 10 starts producing a voltage 102 and current 104 when light is shining on it, this power is transferred to the distributed bus 42 (FIG. 5) when it exceeds the voltage 102 to overcome the component drops and the forward voltage drop of the diode(s), such as shown in the diode circuits D2 and D3 seen in FIG. 21. In this regard, the system behaves like a conventional solar panel array structure. In some embodiments of solar panels 10 having DMPPTs 18, once the voltage on the solar panel 18 reaches a threshold voltage 116 (FIG. 10), e.g. approximately 4.5 to 6.5 Volts DC, the DMPPT Module 18 automatically wakes up 126 (FIG. 11), and starts performing the necessary checks 128,130, before switching over to RUN Mode 132.

As the voltage 102 of the solar panel 18 increases, the DMPPT 18 starts boosting the voltage 102 from the panel 18 to the common distribution bus 52 feeding the solar inverters 54. This wait is necessary to prevent the loss of control power from the controller circuit 70 (FIG. 7) when switching begins. By using control inputs, the system tracks the maximum power point of the solar panel 18, and boosts the voltage out to the distributed DC Bus 52 feeding the solar inverter(s) 54.

Since the voltage 102i is boosted 102o, the system as a whole reaches striking voltage for the solar Inverter 54 in a shorter period than a conventional array of panels 10 would without DMPPT Modules 18.

Furthermore, the system 40 as a whole operates longer before shutting down at the end of a power generation period 118, e.g. such as at sunset, dusk or evening 119 for externally mounted solar panels 18. Since the function of maximum power point tracking (MPPT) is performed at the panel level, several other issues associated with solar panels 10 are addressed as well.

Figure 29:
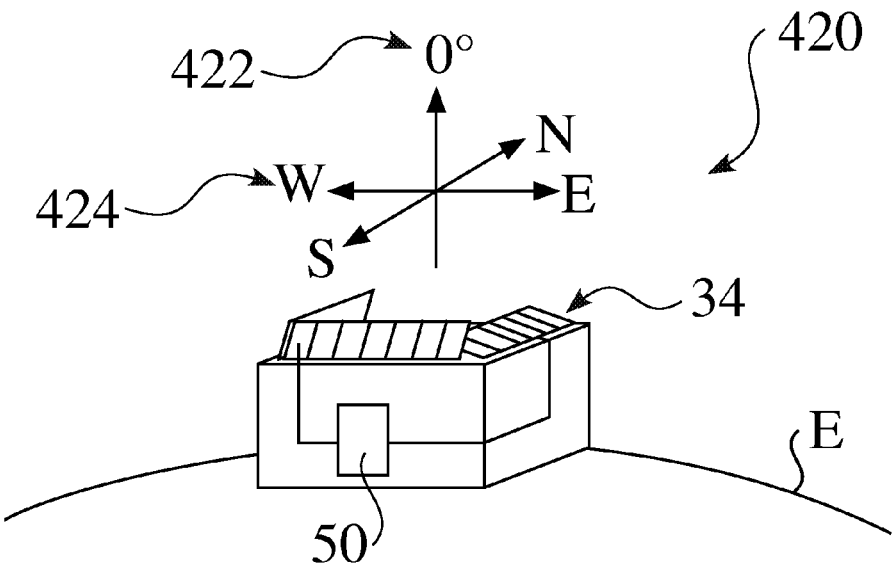
FIG. 29 shows an enhanced power harvesting system located on the Earth, wherein one or more panels within a string have different angles and/or orientations.

For example, problems with mismatched or different manufacturers can be eliminated with the DMPPT units 18. As seen in FIG. 29, solar panels 10 on different planes and orientations can be combined into the same system, without any de-rating or loss of harvest from the array 34. The overall efficiency of the array is increased, because the MPPT is done on a per panel basis, and not on the average of the entire system. In contrast to conventional solar systems, string mismatches are not an issue, due to the active nature of the DMPPT Modules 18. Conduction losses are reduced, thus allowing more energy to be harvested and transmitted to the inverter 54 for grid conversion. The overall efficiency of the array 34 is increased, because the panel output is processed, monitored, and controlled on a per panel basis, and not based upon the average of the entire string 36 or array 34. Safety features are built into the design for fire safety, monitoring, and several other future applications.

Overall, the DMPPT Module 18 addresses many of the current limitations of solar power, such as by providing longer harvest times with panel-level DMPPT modules 18, by providing "Early-On" and "Late-Off" for extended harvest times. Since the output from the solar panels 10 is boosted, the usable power is converted by the inverter 54, because the striking voltage is reached sooner and can be held longer, thereby resulting in an increase in harvestable power from each of the solar panels 10.

As well, some embodiments of the DMPPT modules 18 may preferably be reprogrammable or updatable, such as over the communications link 22, wherein different algorithms may be sent and stored within the DMPPT controllers 80, such as for modifying start up, operation, safety and shut-down operations.

DMPPT modules 18 also help to reduce the effects of partial shading on solar arrays 34. In conventional solar panels, partial shading of a single cell 12 causes the entire panel and string in which it is connected to reduce power output, and also increases loses due to string mismatch, by lowering the MPPT point for an entire solar array. In contrast to conventional panels, the DMPPT modules 18 can controllably compensate for partial shading at the panel level, to boost the DC output signal 102o.

Test Platform.

Figure 12:
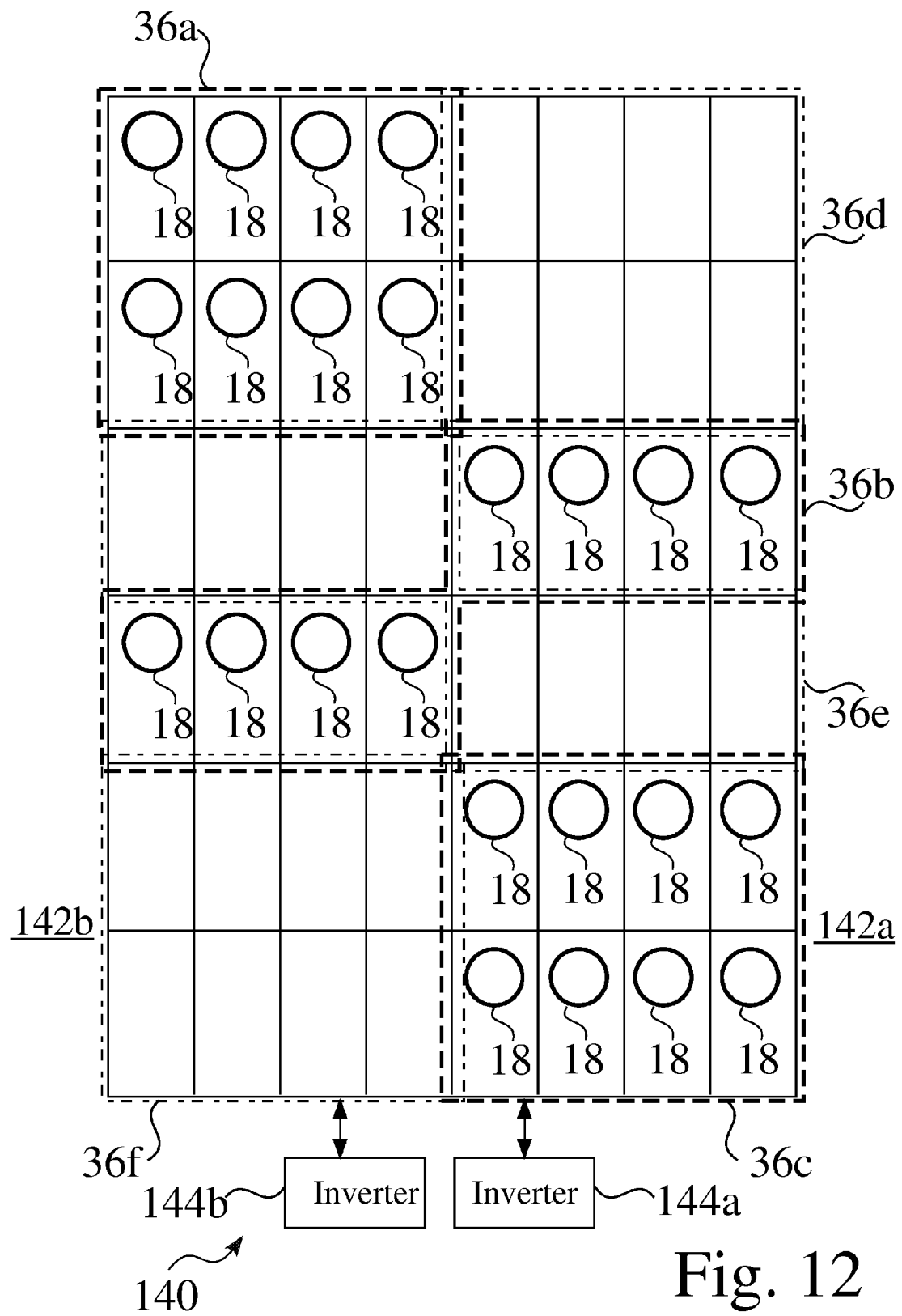
FIG. 12 is a schematic view of an exemplary solar array comprising a plurality of solar panels, wherein a portion of the panels in one or more strings further comprise DMPPT modules.

A test platform was installed to test the benefits and operation of the DMPPT modules 18. The test bed utilized forty-eight solar panels 10, rated at 170 watts, connected in six strings of eight 170-watt panels each. FIG. 12 is a schematic layout view 140 of the exemplary test bed solar array 34 comprising a plurality of solar panels 10, wherein a portion of the panels in one or more strings further comprise DMPPT modules 18. A first group 142a comprising three strings 36a, 36b and 36c having different sample orientations across the array 34 included DMPPT modules 18, while a second group 142b comprising three strings 36d,36e and 36f having different sample orientations across the array 34, did not include DMPPT modules 18.

The system was connected to two identical conventional solar inverters 144, e.g. 144a,144b for connection to a public AC grid, wherein the first string group 142b was fed into the first conventional inverter 144a, and the second string group 142b was fed into the second conventional inverter 144b. In the test platform 140, each of the conventional solar inverters 144a,144b was rated at 4,080 Watts Peak DC.

Figure 13:
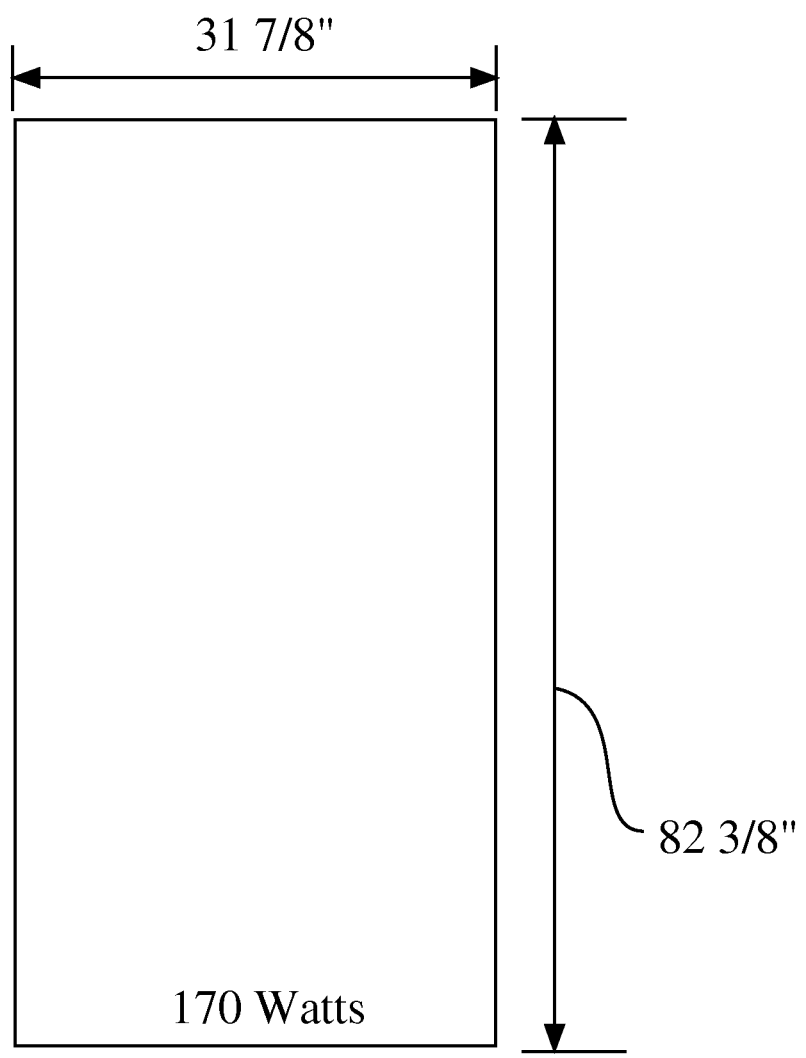
FIG. 13 shows the relative proportion and size of an exemplary solar array having a capacity of approximately 170 W, comprising a plurality of enhanced solar panels, wherein a portion of the panels in one or more strings further comprise DMPPT modules.

FIG. 13 shows the relative proportion and size of an exemplary solar array having a capacity of approximately 170 W, comprising a plurality of enhanced solar panels, wherein a portion of the panels in one or more strings further comprise DMPPT modules 18.

The panels on the test bed are laid out to give a fair representation of solar illumination. One half of the panels are modified with the DMPPT modules 18, while the other half of the panels are left unmodified, i.e. standard solar panels. Each set feeds into a similar sized solar inverter from the same manufacturer. Data is to be gathered over a period of time to evaluate specific design parameters for the DMPPT modules 18. Since the strings 36 are set adjacent to each other, shading can be introduced upon the system, such as by using cardboard cutouts and sliding them over the top the solar panels 10.

Enhanced Inverter System Operation and Monitoring.

Figure 14:
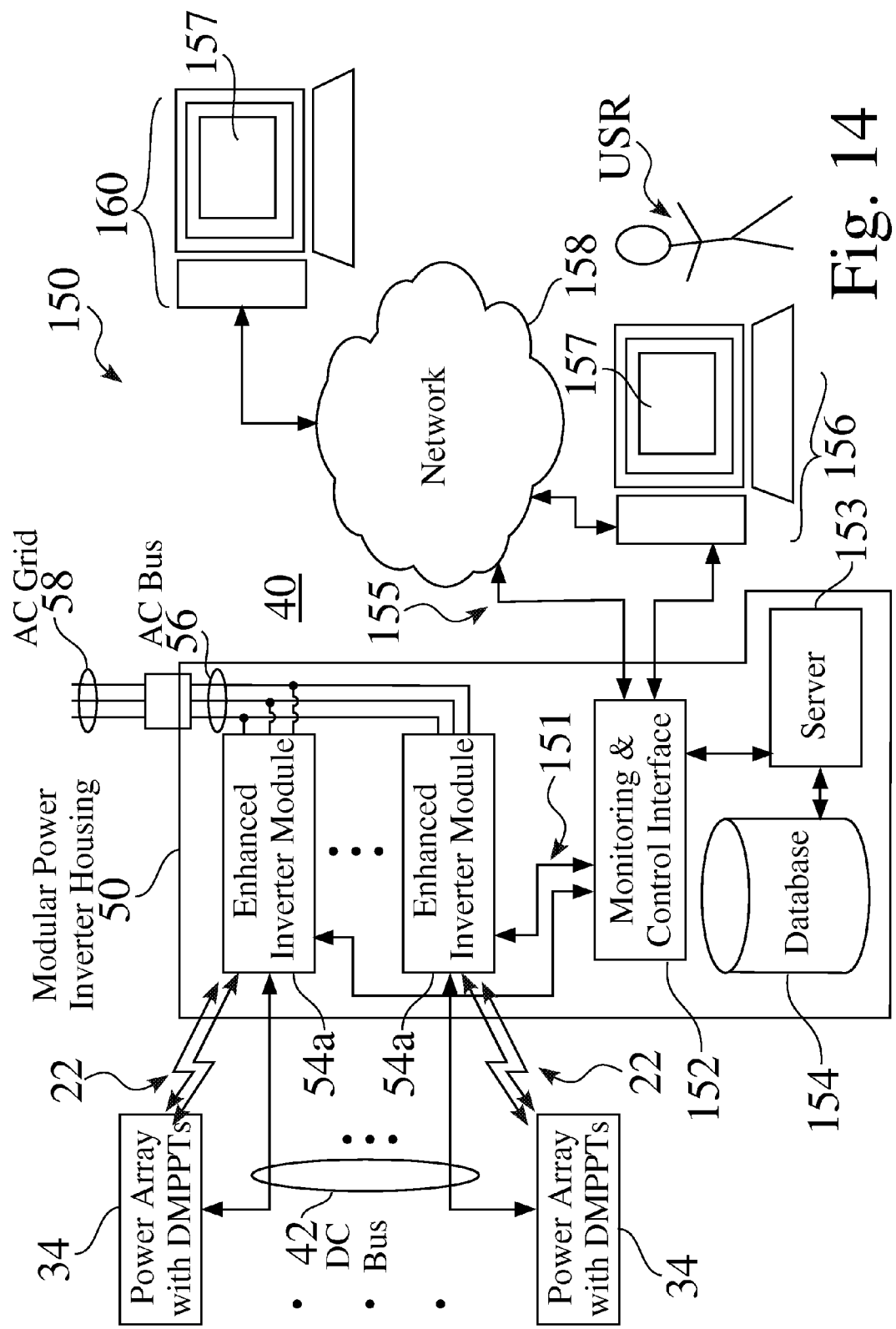
FIG. 14 is a block diagram of a modular power module housing having one or more enhanced inverter modules, a central interface, and connectable to one or more local or remote monitoring or control devices.

FIG. 14 is a block diagram of an exemplary system 40 comprising a modular power inverter housing 50 housing having one or more enhanced inverter modules 54, e.g. 54a-54j, a central interface 152, a database 154, and connectable 155 to one or more local or remote monitoring or control devices 156,160, such as for interaction with a user USR.

In some system embodiments, the modular power inverter housing 50 is powered by the AC bus 56, e.g. such as by the AC grid 58, wherein the housing 50 may be powered by a public AC grid 58 even when the power array(s) 34 are down. In other system embodiments 40, the modular power inverter housing 50 is powered by the DC bus 42, 52 e.g. such as by the solar arrays(s) 34, wherein the housing 50 may be powered off-grid, even when the AC grid 58 is down. In some alternate system embodiments, the modular power inverter housing 50 is powered by the either off-grid 42,52 or on-grid 58, such as depending on available power.

As seen in FIG. 14, a central monitoring and control interface 152 interacts with each of the inverters 154, e.g. the enhanced inverters 54a-54j. Each of the enhanced inverters 54 preferably comprise a dedicated server 55 (FIG. 5, FIG. 6), e.g. an embedded web server 55, or may communicate with a system server 153, e.g. an embedded system server 153, associated with the inverter housing 50.

The data collected from the power panels 10, e.g. the solar panels 10, the enhanced inverters 54, e.g. solar inverters 54, and other equipment with the system 40, can be displayed in near real-time, such as through a local device 156 or remote device 160, e.g. over a network 158, such as but not limited to a local area network (LAN) a wide area network (WAN), or the Internet. This collected data can also be sent, such as through a server 153, and logged into a database 154. The exemplary system 40 seen in FIG. 14 may therefore preferably provide detailed trending analysis and/or performance tracking over the lifetime of the system. The system server 153, e.g. an embedded web server 153, typically gathers information and provides presetting of controls for the entire system 40, right down to the individual panels 10, through communication links 22 to panel DMPPT modules 18.

The DMPPT module controller 80 (FIG. 7), e.g. such as comprising a digital signal processor 80, typically outputs data in a slave mode, such as by reporting data back to an associated embedded server 54 when requested, through one of several means, e.g. such as but not limited to wired or wireless transmission 22. The controller 80 also typically accepts measured parameters from the embedded controller 54 pertaining to the local ambient temperature 25 (FIG. 1) and the solar insulation, i.e. the intensity of incident solar radiation These parameters, along with the data collected at the panel 10, provide control inputs to the program performing the MPPT function on a distributed, i.e. local panel, level.

In some system embodiments 40, the communication links 22 between the DMPPTs 18 and the embedded server(s) 153,55 comprise either a multi-drop single twisted pair RS-485 communications line 22, or a wireless radio link 22. In some system embodiments, the use of wireless communication links 22 may be preferred, such as to reduce the wiring cost, thereby reducing the overall cost of the system 40.

In some embodiments, the protocol used for the communication links is ModBus, such as RTU RS485 for the wired system, or a wireless tree mesh system with self-healing/discovery capabilities for wireless communication links 22. Such ModBus protocols are preferably designed for harsh environments, minimizing or eliminating lost packets of data.

All distributed data is gathered and passed 22, e.g. via the RS-485 ModBus links 22, and then the embedded server 54 at the inverter cabinet 50 formats this into a viewable web page 157 (FIG. 14) for the user USR. This collected data can also be streamed out to another server, e.g. 156,160 for data logging and trending applications.

The heartbeat signal rides on the universal broadcast address, and this synchronizes all of the panels 10 within a few microseconds of each other for their operation. Another defined address broadcasts the ambient temperature and solar insolation from the server 153 to each of the DMPPT Modules 18. If communications are lost, or if a "Fire" signal is broadcasted, then the DMPPT Modules 18 automatically shut down, to remove high voltage from their input 72 and output 90.

Modular Design of Solar Inverter Units.

FIG. 15 is a block diagram of a modular inverter housing 50, such as a Model No. ASPM-2-70 KW, available through Accurate Solar Systems, Inc. of Menlo Park Calif., having two 35 KW enhanced inverters 54 installed, such as a Model No. ASPM-1-35 KW, available through Accurate Solar Systems, Inc. of Menlo Park Calif., having a total rating of 70 KW. FIG. 16 is a block diagram of a modular inverter housing 50 having three 35 KW enhanced inverters 54 installed, e.g. Model No. ASPM-1-35 KW, rated for 105 KW. FIG. 17 is a block diagram of a modular inverter housing 50 housing having four 35 KW enhanced inverters 54 installed, e.g. Model No. ASPM-1-35 KW, rated for 140 KW. While the exemplary enhanced inverters 54 described above are rated at 35 KW each, some alternate embodiments of the enhanced inverters are rated 4 kilowatts each, wherein the system 40 can operate even closer throughout the day.

The modular inverter housing 50 may preferably house a plurality of inverters 54, to reduce cost, increase efficiency, and improve performance of the system 40. As well, the use of a modular enhanced inverter 54, such as but not limited to a 35 kW inverter 54, is readily combined or stacked to provide a wide variety of capacities for a system 40, such as for a 35 kW system, a 70 kW system 40, a 105 kW system 40, or a 140 kW system 40, which may be housed in one or more types of modular inverter housings 50.

Each cabinet 50 typically comprises associated transformers, output circuitry, input circuitry, and communications 151 with the embedded web server 153. The smallest current cabinet 50 houses a single 35 kW module 54. The next step is a larger cabinet 50 that houses between two and four of 35 kW enhanced inverter modules, depending on the power required.

In the modular inverter housing systems 50, such as seen in FIG. 15, FIG. 16 and FIG. 17, if an enhanced inverter 54 goes down, the others continue to deliver power to the AC bus 58. Therefore, a single fault will not bring the entire system 40 down. The enhanced inverter units 54 communicate with each other, such as through the embedded web server 153.

In some system embodiments 40, one of the enhanced inverters 54 initially comes on as the system 40 starts up, such as to increase efficiency. As the available power increases, the next enhanced inverter unit 54 is signaled to come online, and so on, such that the system 40 operates at near peak efficiency for as much time as possible, thereby providing more system up time in larger systems. Therefore, in some system embodiments 40, the use of multiple enhanced modules 54 wastes less energy, as the system 40 only turns on inverters 54 that can be supported by the array 34.

In the modular inverter housing systems 50, such as seen in FIG. 15, FIG. 16 and FIG. 17, each of the enhanced inverter modules 54, e.g. such as but not limited to being rated at 4 kW or 35 kW apiece, may preferably be hot swappable.

Advanced Diagnostics and Monitoring of Enhanced Power Systems.

Since embedded web servers 153,55 communicate with the solar inverters 54, the solar panels 10, and any other associated equipment, the system 40 may preferably provide a near real-time view of the current status of the system 40 as a whole. If a problem occurs, then the operator USR is notified by various means, e.g. such as through the user interface 157.

Most conventional solar power inverter systems typically provide a single DC input voltage and a single current measurement at the inverter level, which is based upon the sum of an entire array. In contrast, while the enhanced power inverter system 40 provides the current, voltage, and power of each of the arrays 34, the enhanced power inverter system 40 may preferably provide the status and performance for each individual panel 10 and string 36, such that troubleshooting and maintenance is readily performed.

Smart Switching Technology.

Figure 18:
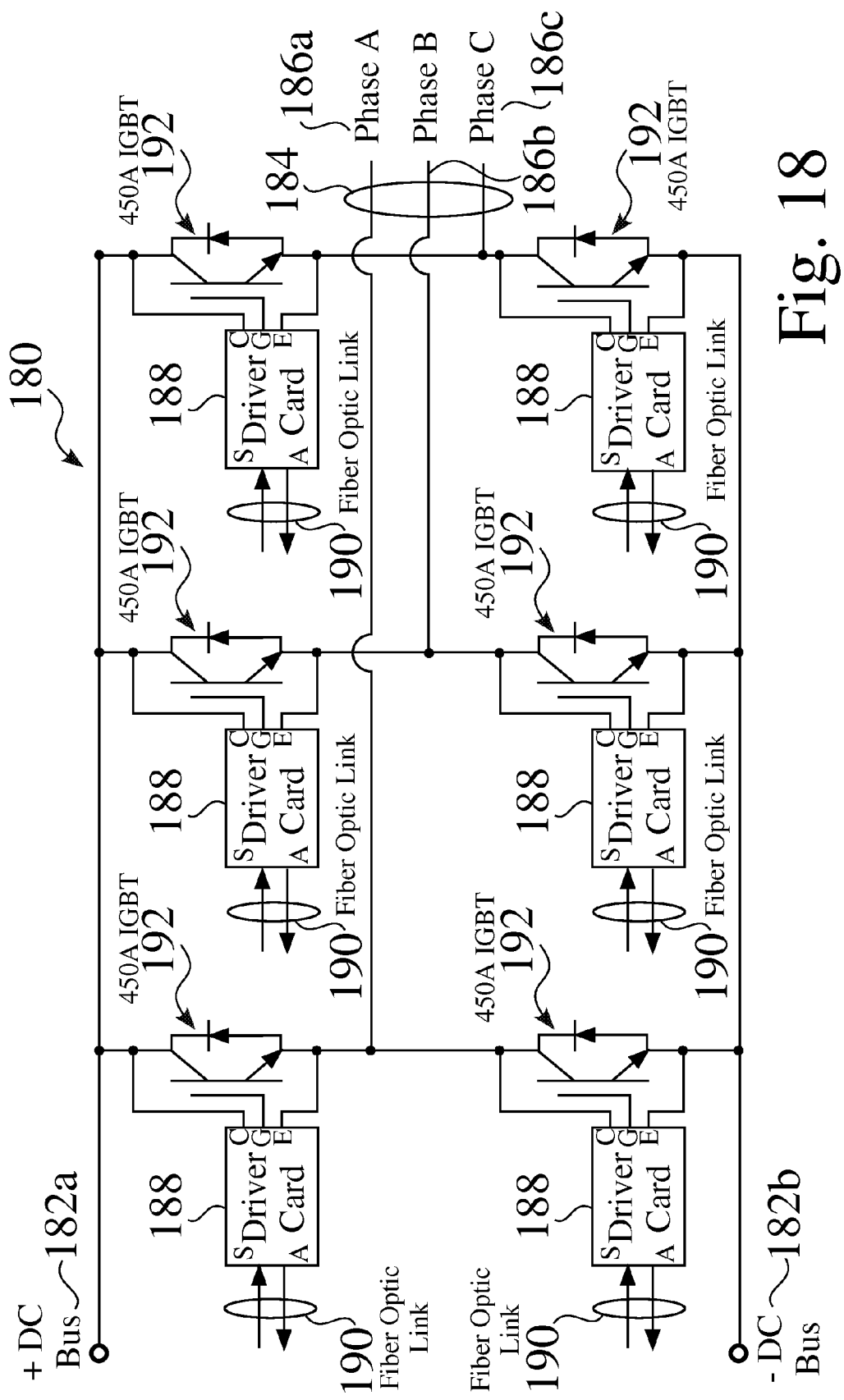
FIG. 18 is a simplified schematic circuit diagram of an exemplary power section for an enhanced inverter module.

FIG. 18 is a simplified schematic circuit diagram of an exemplary power section 180 for an enhanced inverter module 54, wherein the enhanced inverter 54 uses a three-phase half bridge IGBT driven power stage, such as provided with IGBTs 192, driver cards 188, and fiber optic links 190.

Most conventional inverter systems use a standard high frequency pulse width modulation (PWM) method that, while it performs basic signal inversion, has many inherent disadvantages.

Figure 19:
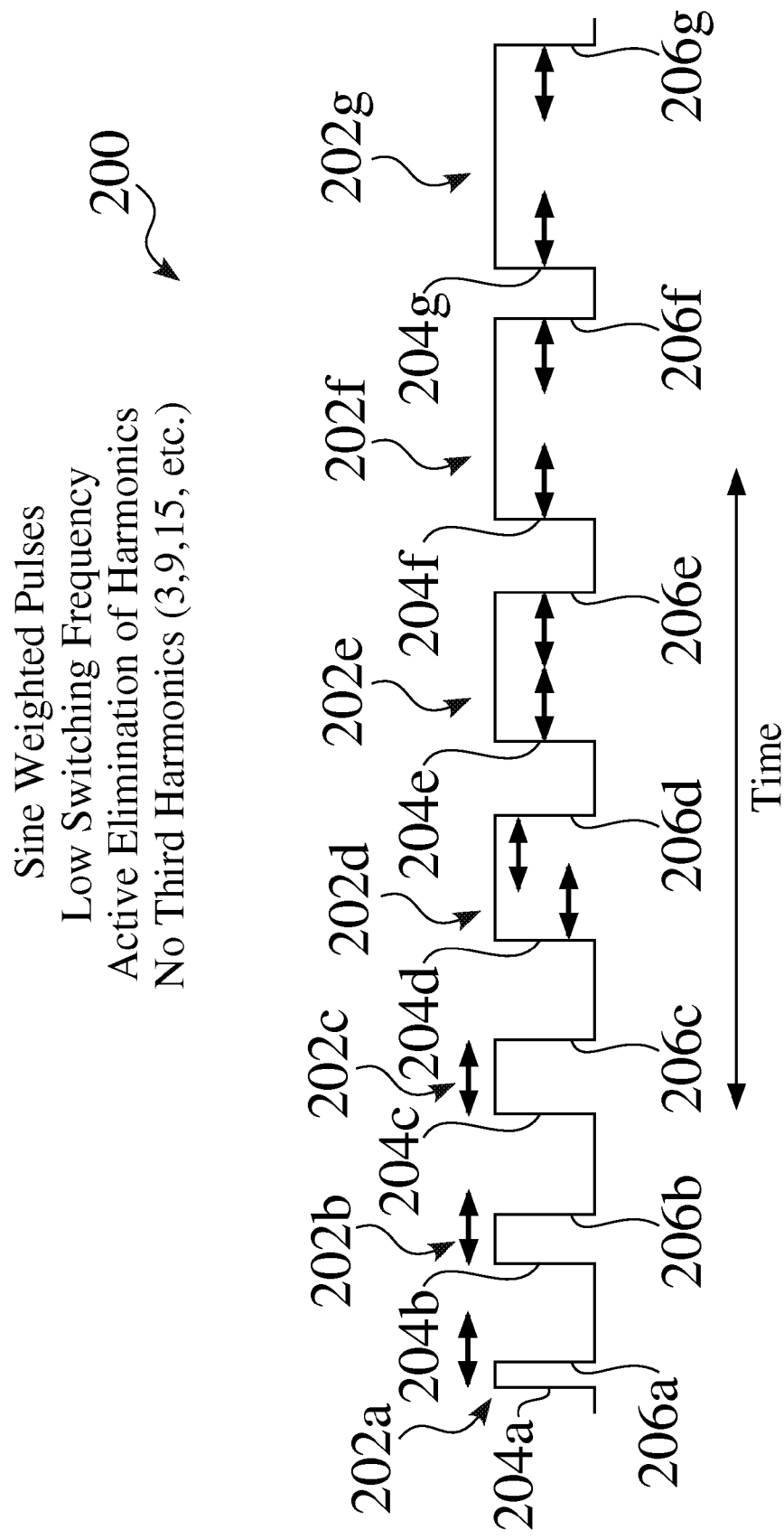
FIG. 19 shows resultant output power signal properties for active elimination of harmonics by inverter signal modification using sine-weighted pulses.

FIG. 19 shows a resultant output power signal pulse train 200, based upon active elimination of harmonics by an enhanced inverter module 54, wherein the power signal is processed using sine weighted pulses. In the enhanced pulse width modulation (PWM) provided by the enhanced inverter system 54, some of the edges, e.g. 204,206, are dynamically linked to other edges in the firing sequence. This has the benefit of simplifying the overall inverter 54, as well as actively eliminating all third harmonics. The enhanced inverter system 54 reduces or eliminates harmonics, by controlling where the rising edges 204 and falling edges 206 of the pulse train 200 occur.

Combining these two features, it is possible to generate a modified smart switching PWM signal 200 that has very low harmonic content, a lower carrier switching speed, and improved efficiency. This switching scheme 200 allows a relatively simple filter 356 (FIG. 26) to be used, which reduces weight and cost, and improves efficiency. The cutoff point for the filter 356 is preferably designed for the nineteenth harmonic, thus improving vastly over conventional pulse width modulation methods. For example, for an enhanced 35 kW inverter design, the power savings from switching alone ranges from about 650 Watts to 1 kW of power.

For example, the following equation provides the third harmonics of a seven pulse modified PWM waveform, as shown:

$$H03 = (\cos(p1s*3*pi/180) - \cos(p1e*3*pi/180) + \cos(p2s*3*pi/180) -$$
$$\cos(p2e*3*pi/180) + \cos(p3s*3*pi/180) -$$
$$\cos(p3e*3*pi/180) + \cos(p4s*3*pi/180) -$$
$$\cos(p4e*3*pi/180) + \cos(p5s*3*pi/180) -$$
$$\cos(p5e*3*pi/180) + \cos(p6s*3*pi/180) -$$
$$\cos(p6e*3*pi/180) + \cos(p7s*3*pi/180) -$$
$$\cos(p7e*3*pi/180) + 0)/(a01*3);$$

where "a01" is the power of the fundamental waveform, p stands for pulse, the number next to p indicates the number of the pulse, s stands for the start of the pulse, and e stands for the end of the pulse, e.g. p1s indicates the start of the first pulse, and p1e indicates the end of the first pulse. Also, the first three pulses and the ending fifth pulse are linked to the others, to eliminate the third harmonics.

Figure 26:
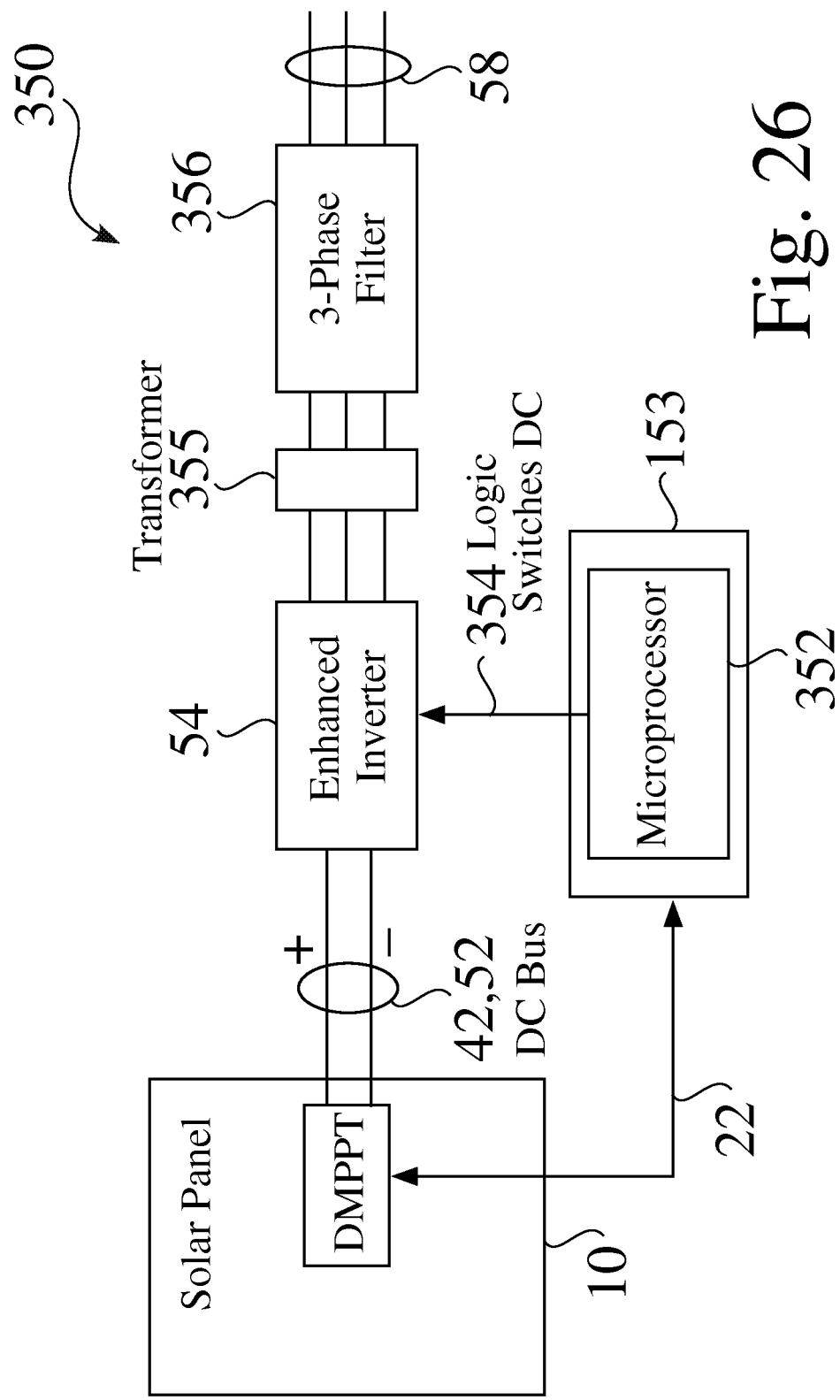
FIG. 26 is a schematic block diagram showing microprocessor-based enhancement of an inverter, such as to eliminate one or more levels of harmonics.

A microprocessor 352 (FIG. 26), such as located at a server 153 embedded within the inverter housing 50, generates a calculated smart switching pulse train signal 200, such as shown above. The calculated smart switching pulse train signal 200 is then passed 366 (FIG. 27) to the driver cards or boards 188, such as through fiber optic links 190 or via copper wire 190. The driver boards 188 then convert these digital pulses 202 (FIG. 19), e.g. 202a-202g, into power driving signals for the IGBTs 192. The IGBTs 192 controllably follow the turn-on pulses 204 and turn-off pulses 206 of the original smart switching pulse train signal 200, thus switching the high DC Bus voltage. This switching power is then transformed to the AC grid voltage 58 by a transformer 355 (FIG. 26) and a relatively small filter 356 (FIG. 26). The resultant output sine wave is very low in distortion. The use of smart switching 200 inputs to the enhanced inverters 54 therefore reduces power loss, reduces harmonics, reduces filter requirements, and reduces cost.

Controller and Power Supply.

Figure 20:
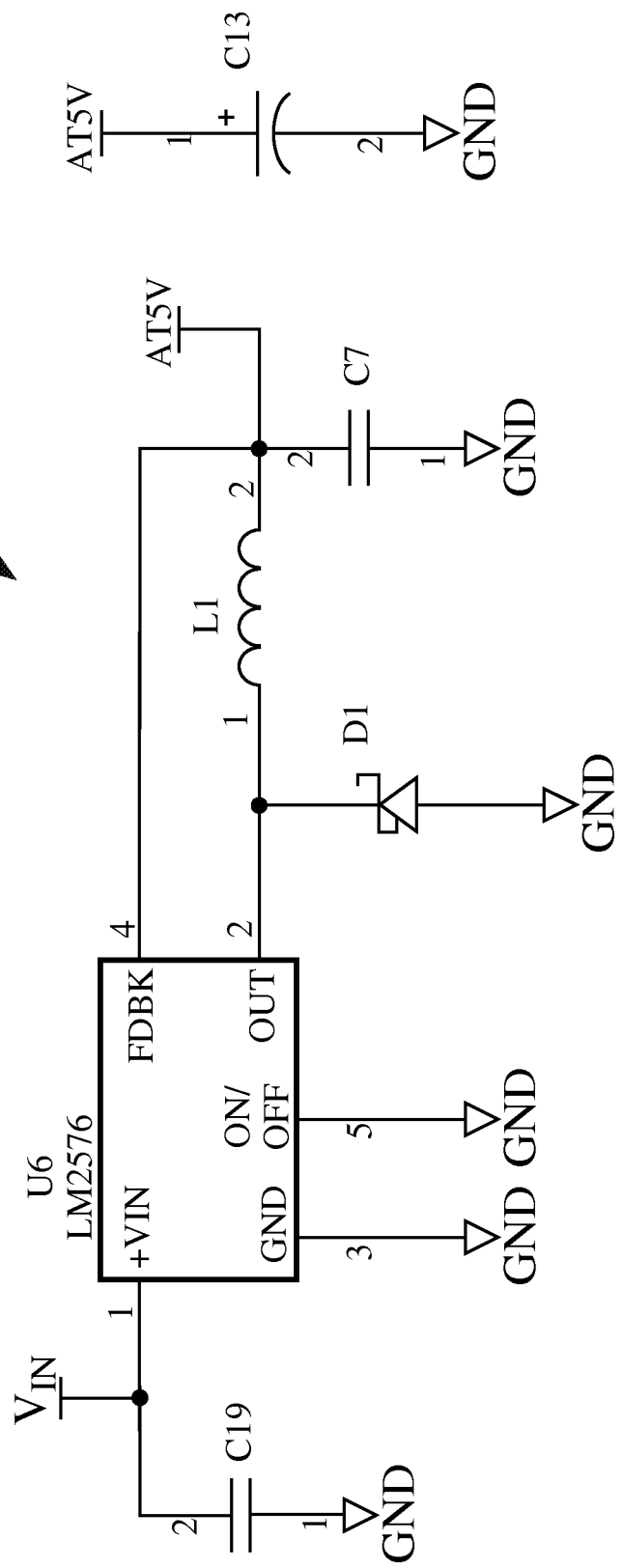
FIG. 20 is a schematic circuit diagram of an exemplary self-power section of a DMPPT module.

As described above, each of the DMPPT modules 18 are typically powered from their respective solar panels 10, such as to reduce the wiring requirements and improve the overall efficiency of the system 40. FIG. 20 is a schematic circuit diagram of an exemplary self-power section 220 of a DMPPT module 18, which generates local control voltage for the DMPPT module 18 from the solar panel 10.

In some embodiments, when the solar panel 10 begins generating about 4.5 to 6.5 volts DC, there is enough power to start the DMPPT module 18. One of the benefits realized by this configuration is that the system 40 as a whole can wake up automatically, off the external AC grid 58. For a system 40 configured with externally mounted solar panels 10 that are externally mounted on the surface of the Earth E, e.g. such as but not limited to stand-alone panels 10 or building-mounted panels 10, the user USR is able to observe this wake up phenomena as the sun S rises in the morning, and as it sets in the evening, when the DMPPT modules 18 shut down for the night.

Boost Circuits for DMPPT Modules.

FIG. 21 is a schematic circuit diagram of an exemplary boost circuit 250 for a DMPPT module 10.

Voltage and Current Monitoring for Distributed Multi-Point Power Point Tracking Modules.

Figure 22:
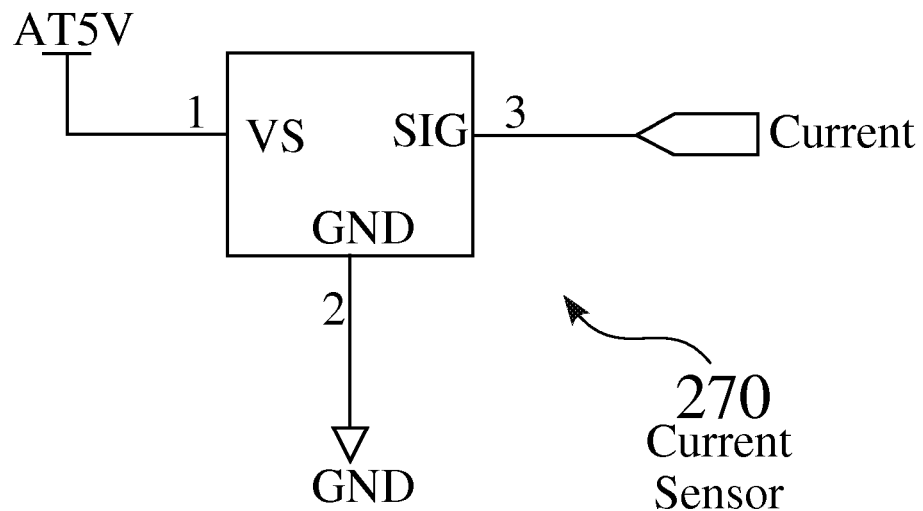
FIG. 22 is a schematic circuit diagram of an exemplary current sensor for a DMPPT module.
Figure 23:
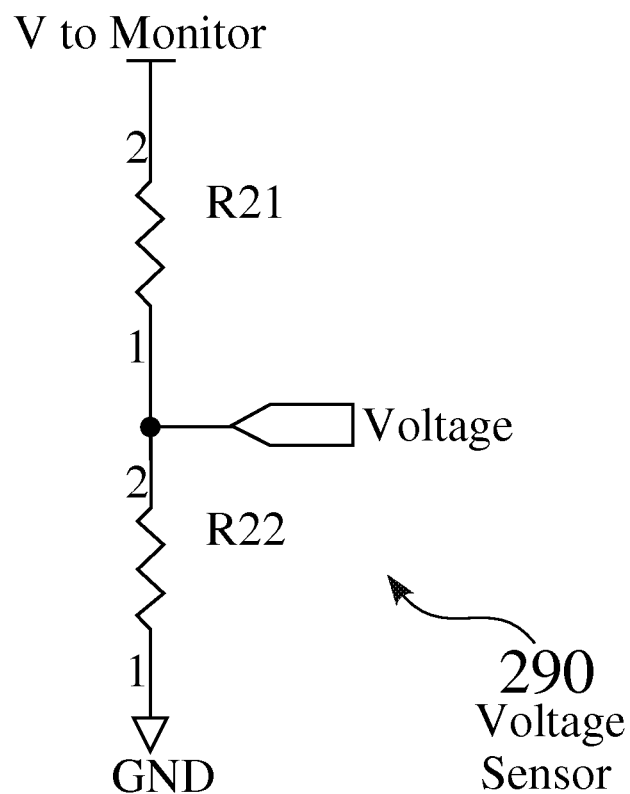
FIG. 23 is a schematic circuit diagram of an exemplary voltage sensor for a DMPPT module.

FIG. 22 is a schematic circuit diagram of an exemplary current sensor 270 for a DMPPT module 18, such as implemented by a V/I monitor 82 (FIG. 7) and associated hardware, e.g. a current loop 83 (FIG. 7). FIG. 23 is a schematic circuit diagram of an exemplary voltage sensor 290 for a DMPPT module 18. The output voltage and current are reported back to the embedded server 153 at the inverter cabinet 50, while used locally by the DMPPT controller 80 (FIG. 7) to provide stable regulated output 90 for the DC distribution bus 42,52 (FIG. 5, FIG. 6). The input voltage and current are used by the on-board controller 80, e.g. DSP, as part of the multi-level MPPT program.

The output voltage also plays into this control loop. A Hall-effect DC/AC current module and a 10M ohm voltage dividing resistor network transforms these signals to an op-amp for scaling, and are then processed by the controller 80, e.g. DSP 80. This forms the basis of a per panel monitoring system.

System Safety and Use of Crowbar Circuits.

Figure 24:
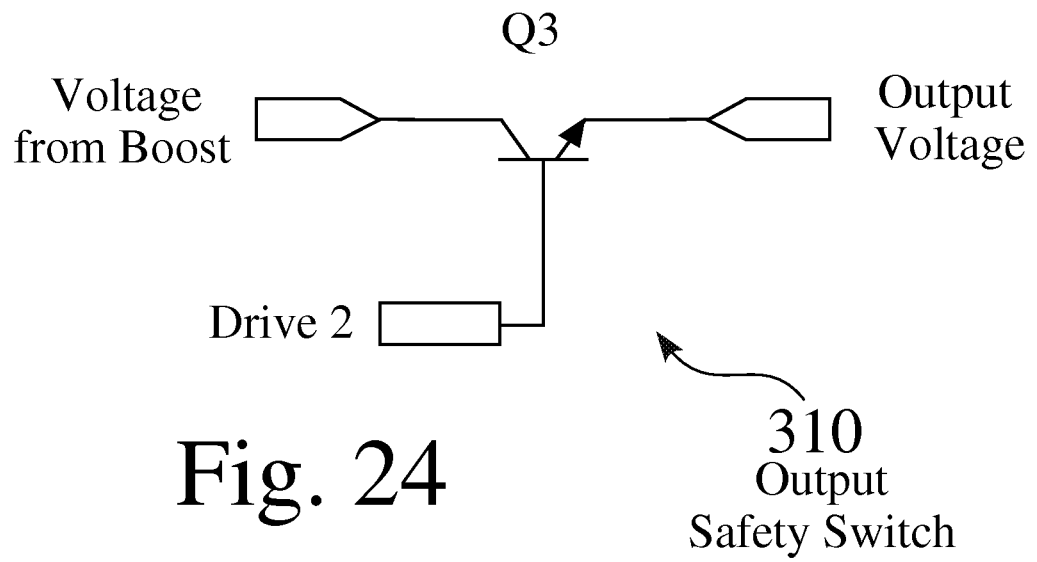
FIG. 24 is a schematic circuit diagram of an exemplary output safety switch for a DMPPT module.
Figure 25:
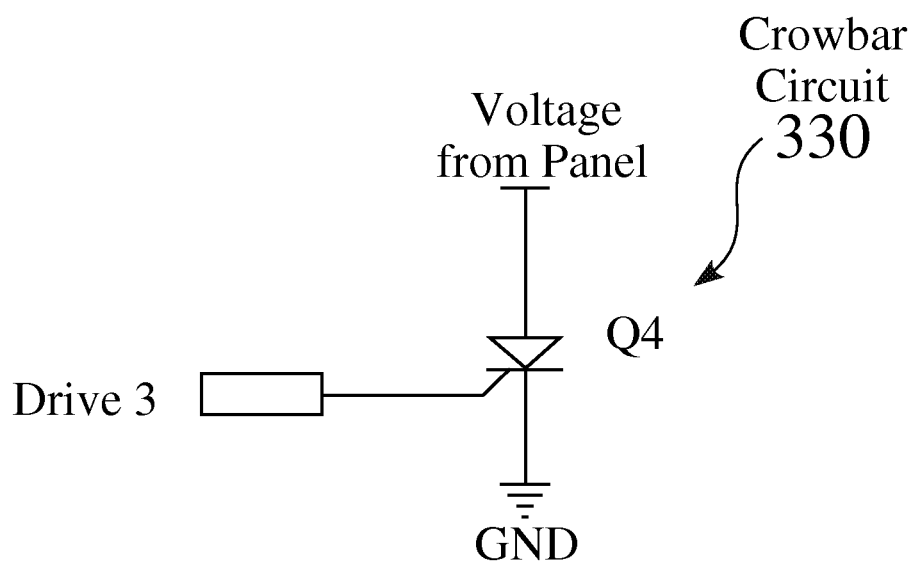
FIG. 25 is a schematic circuit diagram of an exemplary crowbar circuit for a DMPPT module.

FIG. 24 is a schematic circuit diagram of an exemplary output safety switch 310 for a DMPPT module 18. FIG. 25 is a schematic circuit diagram of an exemplary crowbar circuit 330 for a DMPPT module 18. The enhanced solar panel 10, such as seen in FIG. 1, preferably provides survivability from an output short circuit. As seen in FIG. 7, an input crowbar circuit 96, triggered by the microprocessor 80, is placed across the incoming power leads from the panel 10. In case of a fire, or any other maintenance procedure that requires the system to be de-energized, the input crowbar circuit 96 is triggered, thereby shorting out the solar panel 18. An output crowbar circuit 98 may also preferably be provided, such as to charge down capacitors when the unit is shut down.

The crowbar circuits 96,98 may be activated for a wide variety of reasons, such as for emergencies, installation, or maintenance. For example, during installation of the enhanced panels 10, the associated DMMPT modules 18 prevent high voltage from being transmitted to the output terminals 19a,19b (FIG. 1), until the panel is fully installed into the system 40. As well, if maintenance functions need to be performed near or on one or more panels 10, one or more of the solar panels 10 can be turned off, such as by triggering the crowbar circuits 96,98 through the DMPPT controllers 80.

The crowbar circuits 96,98 conduct and hold the solar panel 18 in a short-circuit condition until the voltage or current falls below the device's threshold level. To re-activate the solar panel 10, the current is typically required to be interrupted. This can typically be done either by manually breaking the circuit, or by waiting until the sunlight fades in late evening. This means that the system automatically resets its DMPPTs 18 during a period of darkness, e.g. the night.

Currently, one of the most cost effective crowbar circuits comprises a silicon controlled rectifier (SCR) 330. This allows the crowbars 96,98 to continue to function, even though the main circuits control power has been shorted. This removes the danger of high voltage DC power from the personnel, e.g. on a roof of a building where solar panels 10 are installed. The DMPPT system 18 automatically resets itself during the night, thus allowing for the completion of the work. If it is necessary for another day, the system 40 can operate in one of two modes. In a first mode, such as when communications 22 are present with the host 50, the host 50 can instruct the DMPPT devices 18 to shut down, thus allowing another period of safe work, e.g. on the roof. In a second mode, such as when there are no communications 22 with the host 50, the DMPPT module 18 may preferably fire, i.e. activate, the crowbar device(s) 96,98. To prevent unnecessary shutdowns, this non-communication method may preferably only occur if a status bit has been saved, e.g. in EEPROM memory at the module 18, indicating a fire or maintenance shutdown.

The current crowbar circuit 330 implemented for the DMPPT Module 18 is an SCR with its associated firing circuitry. The main control software, e.g. within the system server 153, preferably allows for a maintenance or fire shut down of the solar array system. This operates on a panel per panel basis, thus providing a safe solar array shutdown. The host system housing 50 can display the current array DC voltage, to indicate when it is safe to enter the roof area. The host system housing 50 may preferably be tied into the fire alarm system of the building, or may be controlled by a manual safety switch located by the host system itself. This addition to the DMPPT Modules 18 therefore enhances overall system performance, and improves safety for personnel.

Enhanced Inverter Power Circuit Operation.

Figure 27:
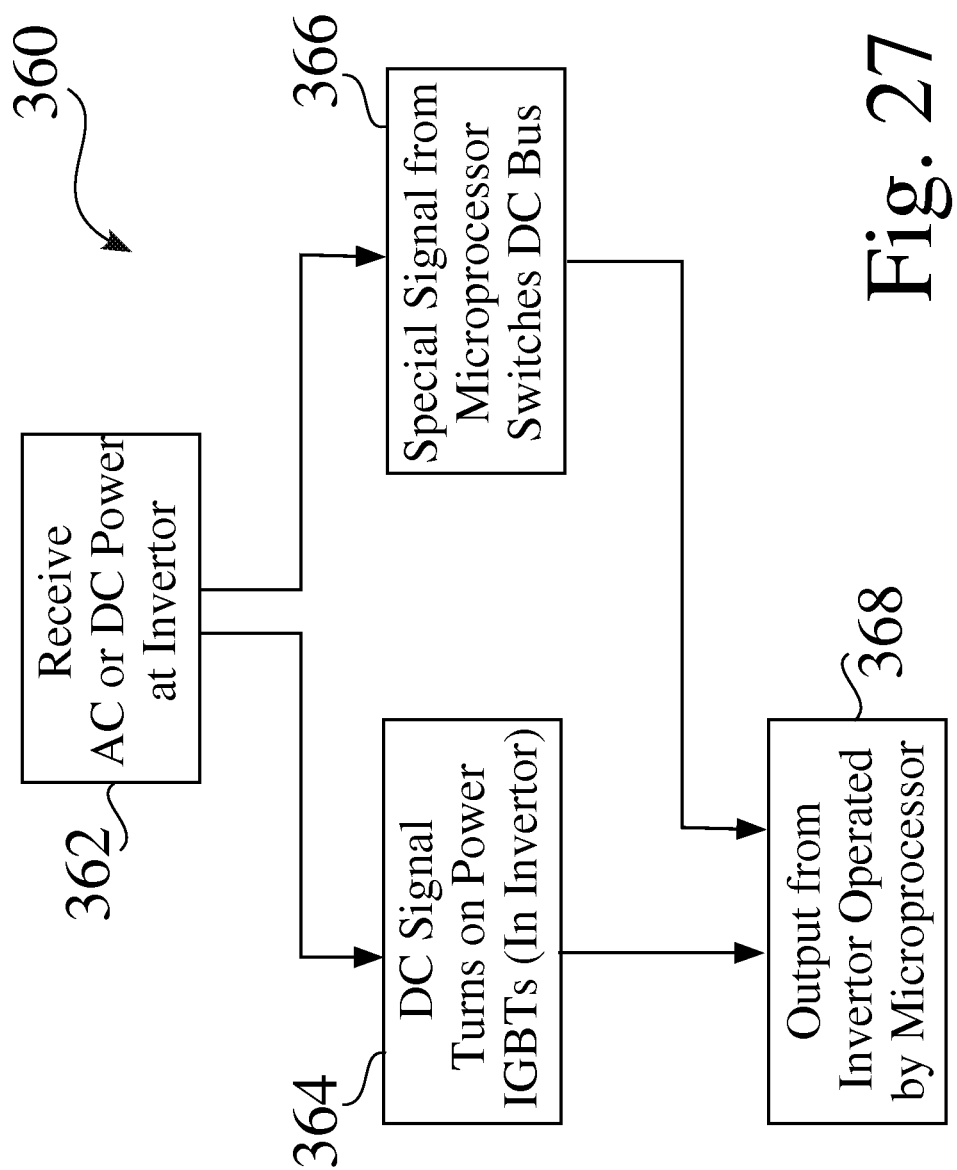
FIG. 27 is flowchart of exemplary operation of an enhanced inverter.

FIG. 26 is a schematic block diagram 350 showing microprocessor-based pulse width modulation 354 of an enhanced inverter 54, such as to eliminate one or more levels of harmonics. FIG. 27 is flowchart of an exemplary PWM harmonic reduction process 360 for an enhanced inverter 54. As seen in FIG. 26, a microprocessor 352 may preferably be used to provide a driving signal 354 to each of the enhanced inverters 54. For example, as seen in FIG. 27, for a DC signal received 362 at the enhanced inverter 54, either the DC power 42,52 from the panels 10, or the AC bus power 58, may be used to turn on 364 the power to the inverter transistors 192 (FIG. 18), which may preferably comprise insulated gate bipolar transistors (IGBTs) 192. A special signal 354 (FIG. 26), which may preferably comprise a smart switching pulse train 200 (FIG. 19), e.g. such as but not limited to switching at 1.68 KHz, is sent from the microprocessor 352 at the embedded server 153 (FIG. 14), to switch the DC bus through the driver cards 188 (FIG. 18) and provide active elimination of one or more harmonics, such as to controllably reduce or eliminate the harmonics from the DC signal, e.g. third harmonics 3, 9, 15, etc. The AC signal output 368 from the enhanced inverter 54 provides increased power over conventional inverter systems.

Since the inverter 50 is built in module blocks 54, for a larger system 40 each inverter block 54 may preferably turn on when needed to increase system efficiency. Solid-state inverters 54 presently run better once they have more than about 45 percent load. Therefore, for a 140 kW system 40, as power increases through the day, a first module 54 will turn on to provide power until there is enough power for the second module 54. The second module 54 will come on and the two modules 54, e.g. 54a and 54b will share the load (and still above the 45% point) until a third module 54 is needed. The same is true until all four modular inverters 54 are on. Later in the day, when power from the solar array 34 begins dropping off, each modular inverter 54 will drop off as necessary, until the system 40 shuts down for the night. This keeps the system 40 running at peak efficiency longer than a single large inverter, thus generating more power for the AC grid 58.

The use of smart switching of the inverters 54, as described above, delivers more power to the grid, since less solar power is converted into heat from the switching of the transistors. Furthermore, since a smaller filter is required (due to harmonic cancellation), there is more power available for pumping to the grid.

Another benefit of the modular system 40 is redundancy. For example, in a system having more than one enhanced inverter 54, if one enhanced inverter 54 fails for some reason, the entire system 40 does not come down. The system can continue to pump power out to the AC grid 58 with what capacity is left in the system 40.

Figure 28:
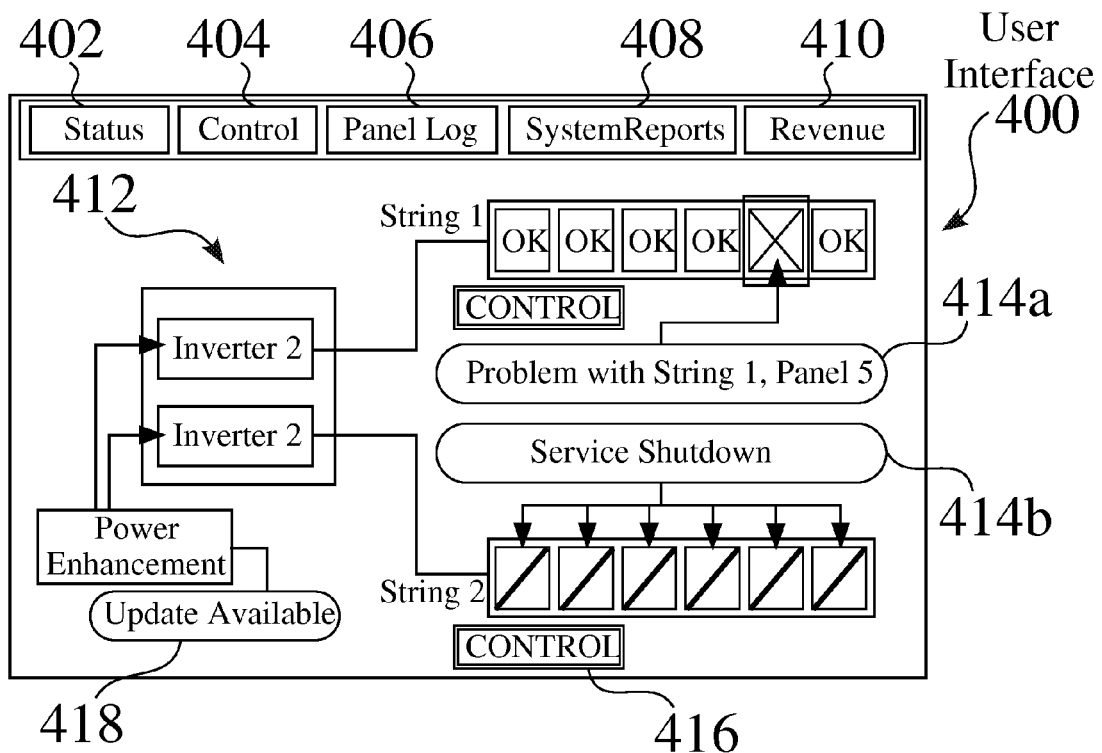
FIG. 28 is an exemplary user interface for monitoring and/or control of an enhanced power harvesting system comprising power modules having DMPPT modules.

FIG. 28 is an exemplary user interface 400, such as comprising a web page 157 (FIG. 14), for monitoring and/or control of an enhanced power harvesting system 40 comprising enhanced inverters 54, and power modules 10 having DMPPT modules 18. The exemplary user interface 400 seen in FIG. 28 may typically comprise any of system, array and/or component level status 402, control 404, logs 406 for one or more panels 10, system reports 408, and revenue tracking 410. For example, an exemplary system status screen 412 is seen in FIG. 28, such as to indicate current operating status of different strings 36 of solar panels 10.

As seen in FIG. 28, a first string 36 of panels comprises six panels 10, wherein panels 1-4 and 6 in the string are indicated 414a as being online and OK, while the fifth panel 10 in the first string is indicated 414a as being a problem and is currently taken offline. As also seen in FIG. 28, a second string 36 of panels comprises six panels 10, wherein panels 1-6 in the second string are indicated 414b as being shutdown for service, such as controlled 416 through the user interface 400.

The user interface 400 may typically be accessed through a wide variety of terminals, such as directly through an embedded server 153, locally through a connected terminal 156, or at another terminal 160, such as accessible through a network 158. In some embodiments, the system 40 may provide other means for alerts, status, and/or control, such as but not limited to network communication 155 to a wireless device 160, e.g. such as but not limited to a laptop computer, a cell phone, a pager, and/or a network enabled cellular phone or PDA.

As each of the panels 10 preferably comprises DMPPT functionality 18, wherein the DMPPTs provide monitoring at the panel level, the system 40 is readily informed, such as over the communication links 22 between the DMPPTs 18 and the invertors 54 or housing 50, of the operating status of each panel 10 in any size of array 34.

Furthermore, the DMPPTs 18 similarly provide troubleshooting and diagnostics at the panel level. For example, if there is a problem with one or more panels 10, such as not working, shut down locally by a controller 80, dirty, or shaded, the system 40 will be informed over the communication links 22 of any and all panel-level information, and can alert the user USR. All information from the panels 10 is typically logged into a database 154, where performance, history trends, and predications of future performance can be calculated. The database 154 may preferably be connectable through a network 158, such as the Internet, i.e. the World Wide Web, wherein viewing, and even control and/or maintenance, may be done through a web browser at a remote terminal 160.

As each enhanced panel 10 is connected to an associated DMPPT module 18, problems can be identified and pinpointed for both broken and sub-performing panels 10, wherein such panels 10 may readily be found and replaced, i.e. the system 40 identifies the exact panel(s) with a problem, thus significantly reducing the time required for repairs.

FIG. 29 shows an enhanced power harvesting system 40 located on the Earth E, wherein one or more panels 10 within a string 36 have different angles (0, 45, 90) or orientations (E, W, N, S). Conventional solar panels systems require solar panels having different angles of tilt to be serviced by different inverters. However, since the output of the DMPPT modules 18 at the panel level can be regulated, enhanced panels 10 having different tilt angles 422 can be fed into the same inverter, e.g. an enhanced inverter 54. The enhanced system 40 therefore allows panels to be mixed, such by varying tilt 422, from flat (0 degrees) through 90 degrees, and/or by varying directional orientation 424, by mixing East, West, South and/or North facing panels 10.

As well, since the output of the DMPPT modules 18 at the panel level can be regulated, strings 36 having different lengths of enhanced panels 10 may be fed into the same inverter, e.g. an enhanced inverter 54 or even a conventional inverter. For example, if one string 36 has an extra panel 10, or shorts a panel 10, the DMPPT modules can adjust the output of the remaining panels 10 in a string 36 to allow this "incorrect" string size to function in the system 40, without adverse affects.

Similarly, the use of DMPPT modules 40 allows different size panels or different manufacturers to co-exist in the same array 34. Therefore, instead of having to buy all of the panels from a single manufacturer to reduce mismatch problems, the DMPPT allows the use of various panels and even different wattages within the same system 40. Such versatility provides significant architectural freedom in panel placement and design, wherein solar panels equipped with an associated DMPPT module 10 allow unique layouts to accommodate different architectural features on any building or facility.

Furthermore, the use of DMPPT modules 40 addresses panel and string mismatch losses. At the present time, no two panels 10 are alike, and often are specified with a plus or minus 5 percent rating. While conventional solar panel strings 36 operate only as well as the weakest panel 10 in the string, the DMPPT modules 18 can adjust the output of the panels 10 to boost their output. Similarly, the DMPPT modules 18 for a string 34, such as controlled by the server over the communications links 22, can boost the power as needed to reduce or even eliminate string mismatch losses.

Block Diagram of Operation Software.

The software for the DMPPT modules 18 can be broken down into various sections as most are interrupt driven. When the modules 18 wake up in the morning, they each perform a routine check to ensure that everything is functioning properly. The modules 18 preferably check the status of a fire alarm flag, which is stored in EEPROM inside the microprocessor/controller 80 of the DMPPT Module. The microprocessor currently implemented for the controller 80 includes FLASH, EEPROM, and SRAM memories on the chip.

While the modules 18 watch the communications line 22 for activity, such as to see if the panel 18 needs to shutdown before power levels rise to a dangerous level. If necessary, the DMPPT Module 18 fires the crowbar circuit 96,98 to remain off line. Otherwise, it will proceed to the wait stage, until enough power is available for it to perform its functions.

Multiple Power Inputs for the Enhanced Inverter Units.

Since the inverter design has been modified so that the MPPT has been shifted to maximize harvest, the enhanced inverters, as well as the DMPPT modules may readily be adapted for different means of power generation, such as but not limited to fuel cells, wind power, Hydro, Batteries, Biomass, and Solar power. The inverters can operate at 50 Hz, 60 Hz, or 400 Hz to cover a vast range of applications. The system can also be designed for on-grid or off-grid applications.

While some embodiments of the structures and methods disclosed herein are implemented for the fabrication of solar panel system, the structures and methods may alternately be used for a wide variety of power generation and harvesting embodiments, such as for fuel cells or batteries, over a wide variety of processing and operating conditions.

As well, while some embodiments of the structures and methods disclosed herein are implemented with a server 153 within the modular inverter housing 50, other embodiments may comprise dedicated servers 55 within each of the enhanced inverters 54, which may also be in combination with a housing server 153.

Furthermore, while the exemplary DMPPT modules 18 disclosed herein are located at each of the panels, dedicated DMPPT modules can alternately be located at different points, such as ganged together locally near the panel strings 36. In present embodiments, however, the DMPPT modules 18 disclosed herein are located at each of the panels 10, such as to provide increased safety, since the crowbar circuitry 96,98 is located at the panel, and upon activation, no high voltage extends from the panels on the output connections 21.

Enhanced Coated Power Panels.

The efficiency of solar panels 10 falls off rapidly as dirt and other impurities settles on the outer surface 435 of the panels 10. The outer glass substrates 434 (FIG. 30) on the surface of solar panels 10, e.g. conventional solar panels 10 and/or solar panels 10 having DMPPT modules 18, typically contain microscopic voids, fissures, and/or scratches 436, making them rough, wherein dust, dirt, scale, particulates, and other contaminants can readily adhere to the glass 434.

Figure 30:
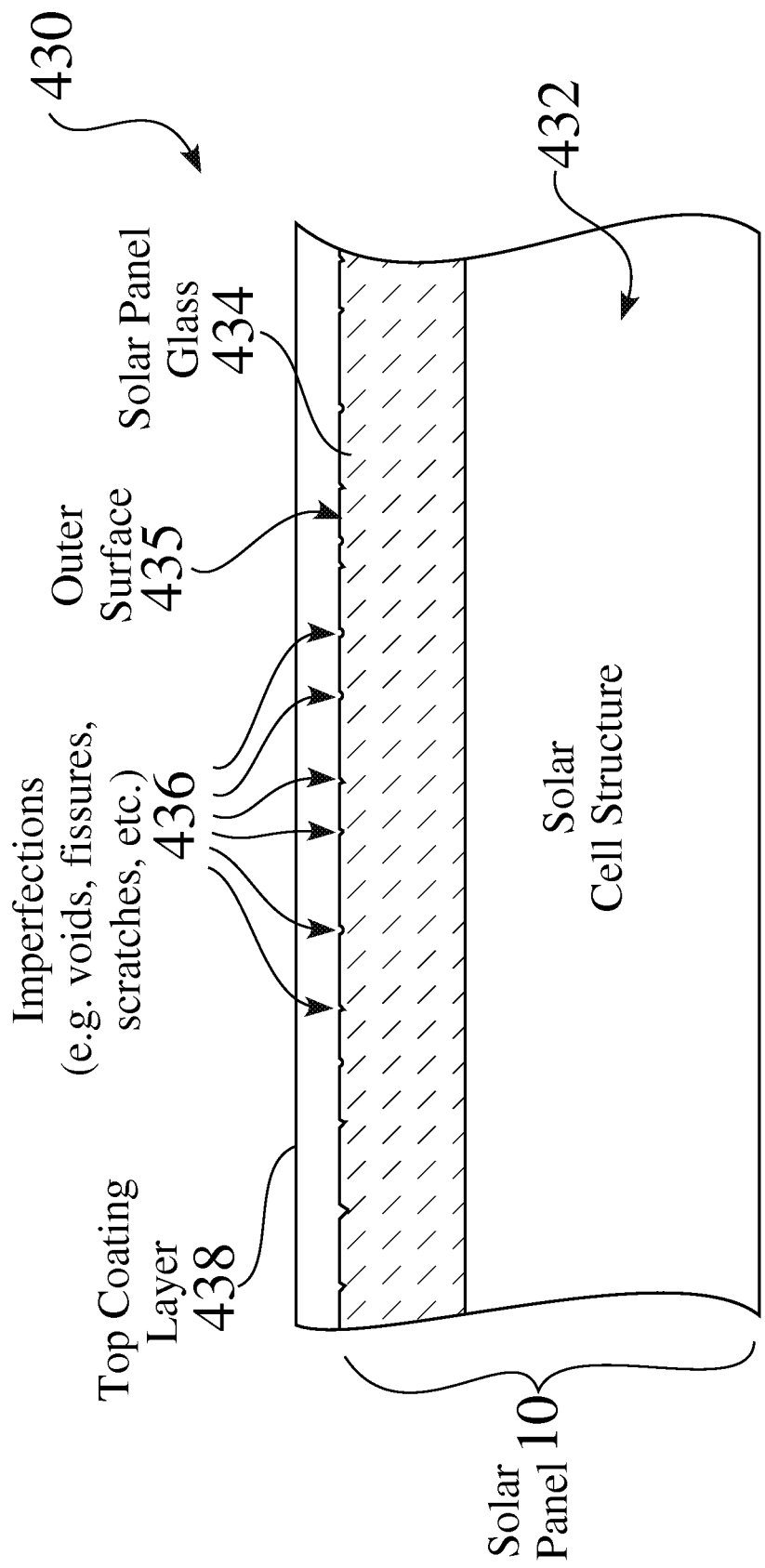
FIG. 30 is a partial cutaway view of an enhanced solar panel structure having an outer coating layer.

FIG. 30 is a partial cutaway view of an enhanced solar panel structure 430 having a top coating layer 438. It is advantageous to provide such improvements to the outer optical structures 432,434 for solar panels 10, such as to provide enhanced cleaning, and/or to provide improved light adsorption. Coatings 438 can be applied to any of:

- used, i.e. existing, solar panels 10 (such as with pre-cleaning);
- new but conventional solar panels 10, e.g. in the field (such as with pre-treatment/cleaning); and/or
- new enhanced solar panels 10, with enhanced coatings 438 applied during production (before shipment).

In some embodiments, the coating materials 438 are described as nano-technology materials, as they provide enhanced cleaning and/or improved light adsorption on any of a macroscopic or microscopic level. For example, the coatings 438 may preferably fill in or reduce voids fissures, and/or scratches 436. As well, the coatings 438 may preferably prevent or reduce buildup of dust, dirt, scale, particulates, and/or other contaminants on the solar panel glass 434.

In some embodiments, the enhanced coatings may preferably comprise hydrophobic coatings 438, e.g. comprising silicon oxide, and/or hydrophilic coatings 438, e.g. comprising titanium oxide.

For example a thin layer, e.g. such as but not limited to about 5,000 Angstroms thick, of a hydrophobic coating 438, provides a surface to which dust and dirt has difficulty adhering. One such hydrophobic coating 438 currently used comprises a Teflon™ based coating 438, wherein incoming water, such as sprayed on, poured on, or occurring through other means, e.g. rain, condensation, or fog, beads up on the glass 434, such as by reducing the surface contact between the liquid and the glass 434, and allowing the water to roll off, thereby accelerating the cleaning process.

The use of hydrophilic coatings 438, coupled with sunlight and moisture, may preferably react with deposits that land on the glass 434, such as to break down organic material to a point where it blows away in the wind, or washes off with water.

In some exemplary embodiments, the enhanced coatings may preferably comprise hydrophobic coatings 438, e.g. comprising silicon oxide, or hydrophilic coatings 438, e.g. comprising titanium oxide.

Other exemplary embodiments of the enhanced coatings 438 comprise both hydrophilic and hydrophobic components, such as to provide a coating material that provides any of reaction with and/or repelling incident water and/or contaminants.

Further exemplary embodiments of the enhanced coatings 438 may preferably comprise a component, e.g. an interference coating 438, that reduces the reflectivity of the glass 434, such as to allow more light to penetrate the glass and strike the solar cell structure 432, to produce more electricity.

Solar panels 10, e.g. such as conventional solar panels or solar panels which include DMPPT modules 18, may therefore be enhanced by any of a wide variety of coatings 438, such as to repel water, absorb light, and/or break down organic material. Such enhanced coatings 438 may preferably be used for any of reducing dirt buildup on solar panel glass layers 434, reducing cleaning time, and/or increasing the level of cleanliness achievable through cleaning procedures.

Rack Mounting Angles for Solar Panel Arrays.

Figure 31:
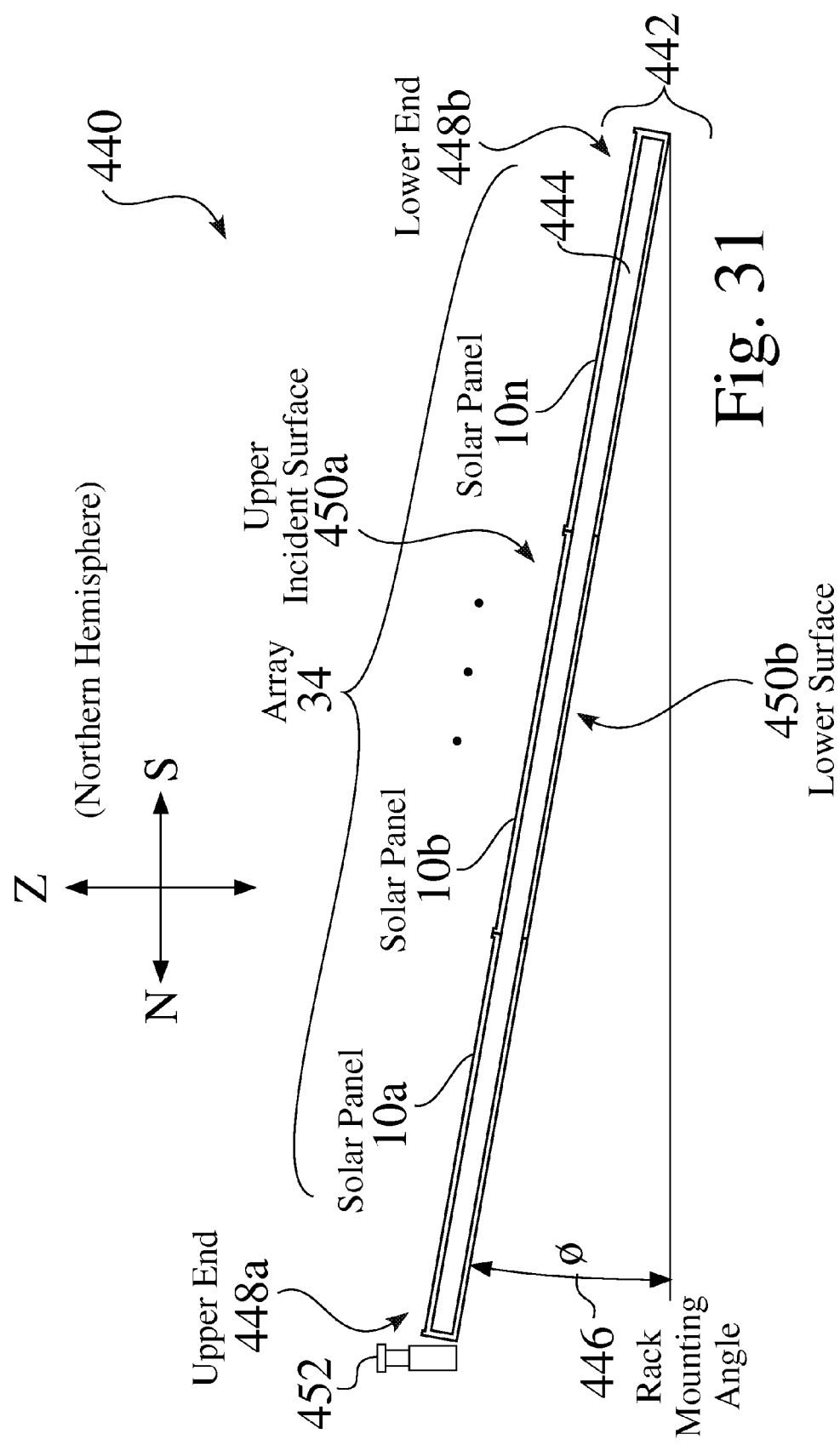
FIG. 31 is a simplified schematic view of an array of enhanced solar panels having a rack mounting angle.

FIG. 31 is a simplified schematic view 440 of an array 34 of solar panels 10, e.g. enhanced solar panels 10a-10n, such as assembled with one or more frame members 444, having a rack mounting angle Ø 446.

Fluid delivery systems 452, such as but not limited to a manifold and one or more spray mechanisms, may preferably provide any of cleaning and/or cooling for one or more solar panels 10, such as by spraying or otherwise distributing water, which may further comprise a cleaner, over the incident surfaces 450a of an array 34 of one or more panels 10.

As seen in FIG. 31, the exemplary panels 10 have a rack mounting angle 446. Conventional solar panel arrays have commonly been mounted with a rack angle 446 greater than zero degrees, such as to provide an increase in power harvest. For example, many solar panel arrays 34 located in the Northern hemisphere have a rack mounting angle of about 8-10 degrees.

A conventional array 34 of solar panels 10 that are installed flat on a flat roof can theoretically provide 100 percent coverage across the roof, while a conventional array of solar panels 10 that are installed with an eight degree slope on such a roof provides about 90 percent coverage, because of the aisle typically required between racking systems, such as to avoid shading between racks.

Panel arrays 34 that have substantially higher rack angles, e.g. 20 degrees, have a higher front to back height ratio, which typically requires a larger distance between the racking structural rows, thereby resulting in less room for panels 10, such as for a horizontal roof installation. e.g. about 70 percent coverage for a flat roof system.

In an enhanced power generation system 40 that includes a fluid delivery system 452, such as for cleaning and/or cooling, the rack angle 446 may preferably be chosen for fluid movement, e.g. water run off, as well as for power harvest.

For example, one current embodiment of an enhanced power generation system 40 that includes a fluid delivery system 452, installed in Menlo Park, Calif., has a rack mounting angle 446 of about 8 degrees toward the South, which serves to increase power harvest and also allows testing of a fluid delivery system 452.

The specific rack angle 446 for a solar panel installation may preferably be chosen to facilitate self-cleaning during rainfall, automated, i.e. robotic, cleaning, and/or automated cooling, such as to reduce or avoid maintenance and/or cleaning problems associated with flat mounted panels 10.

For example, for the specific solar panels 10 used for the aforementioned installation, and as recommended for many fluid delivery systems 452, a rack angle 446 of at least 10 degrees (toward the South in the Northern hemisphere or toward the North in the Southern hemisphere) may preferably provide greater fluid movement, e.g. water run off, such as to decrease residual build up of impurities along the surface and lower edges of the solar panels 10.

As the rack mounting angle 446 is increased, such as between 15-20 degrees toward the Equator, fluid runoff is increased, which can promote fluid reclamation and avoid deposition of contaminants at the lower edges of solar panels 10. The increased rack angle 446 also typically allows for a higher total year round harvest of electricity for installations that can accommodate such configurations, since in the winter, the Sun is lower on the horizon, so the additional tilt 446 of the panels 10 allows more light to be harvested. Because the higher slope results in better cleaning, there is a trade off between effective cleaning and the concentration of panels 10 on the roof.

Enhanced Pole-Mounted Solar Power Systems, Structures and Processes.

Enhanced solar power structures provide a wide variety of solutions for solar power production throughout many distributed environments.

Numerous regions within the United States and across the world use power distribution structures 702, such as but not limited to elevated poles and/or towers 702 (FIG. 51, FIG. 52), to support power lines 704 (FIG. 51, FIG. 52) and/or phone lines, wherein the poles and/or towers 702 are typically installed, operated, and maintained by respective utilities. While some areas, such as within urban or suburban environments, have installed power lines 702 and/or communication land lines below ground, a vast number or poles and towers 702 remain in service.

Several embodiments of enhanced power structures 700, e.g. 700a (FIG. 51); 700j (FIG. 70), are mountable to such poles and/or towers 702, to provide localized controlled production of solar power, which may preferably further comprise local DMPPT modules 18, such as integrated with or in conjunction with a local DC to AC power inverter 54 that is connectable 714 to the neighboring power grid 58, and may be configured to send and/or receive signals 722 (FIG. 51) over respective communication links 22.

The exemplary enhanced power structures 700 disclosed herein typically provide support for one or more solar panels 10, such as for but not limited to flat or arched embodiments 700. In stationary embodiments 700, the panels 10 may preferably be aligned toward the Equator, wherein the panels 10 may preferably be aligned toward the South if installed in the Northern Hemisphere, or toward the North, if installed in the Southern Hemisphere.

Rotatable configurations of enhanced power structures 700 are also disclosed herein, wherein the solar arrays 34 may be aligned to increase the power harvest based on any of location, time of day, available light, or any combination thereof. For example, some embodiments of the enhanced power structures 700 are controllably rotatable to face toward East in the morning, toward the South at midday, and toward the West at sunset.

Panel Mount Structures.

Figure 32:
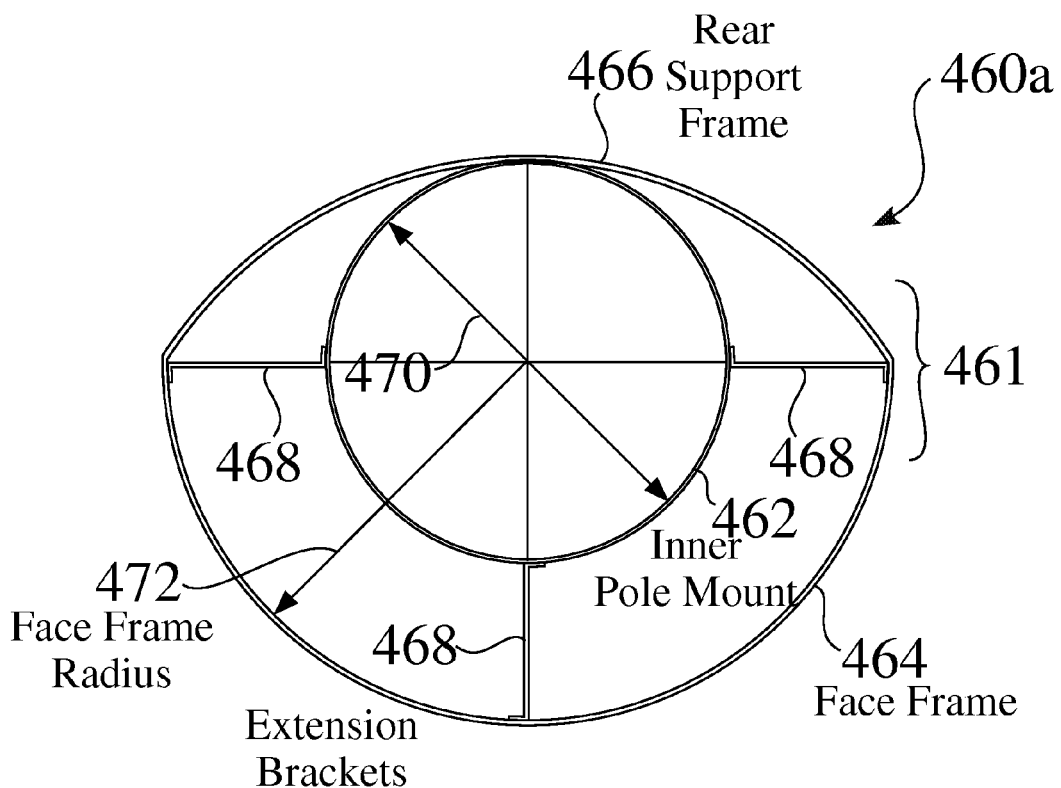
FIG. 32 is a top schematic view of an exemplary curved panel mount.
Figure 33:
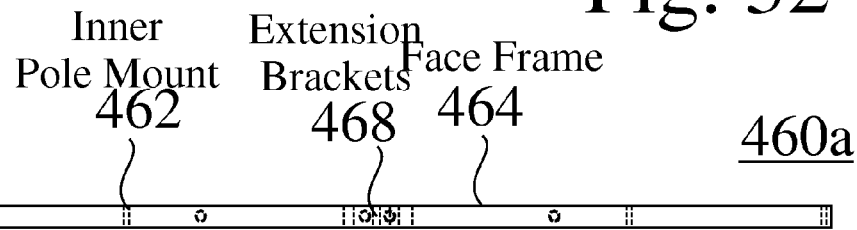
FIG. 33 is a front schematic view of an exemplary curved panel mount.
Figure 34:
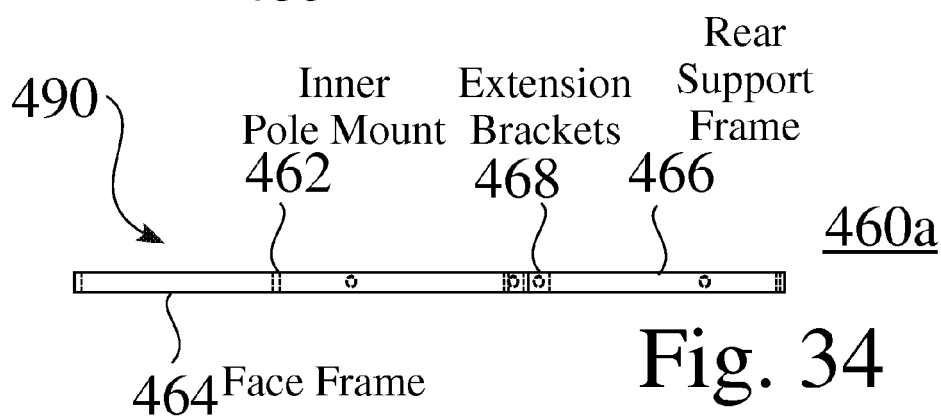
FIG. 34 is a side schematic view of an exemplary curved panel mount.
Figure 35:
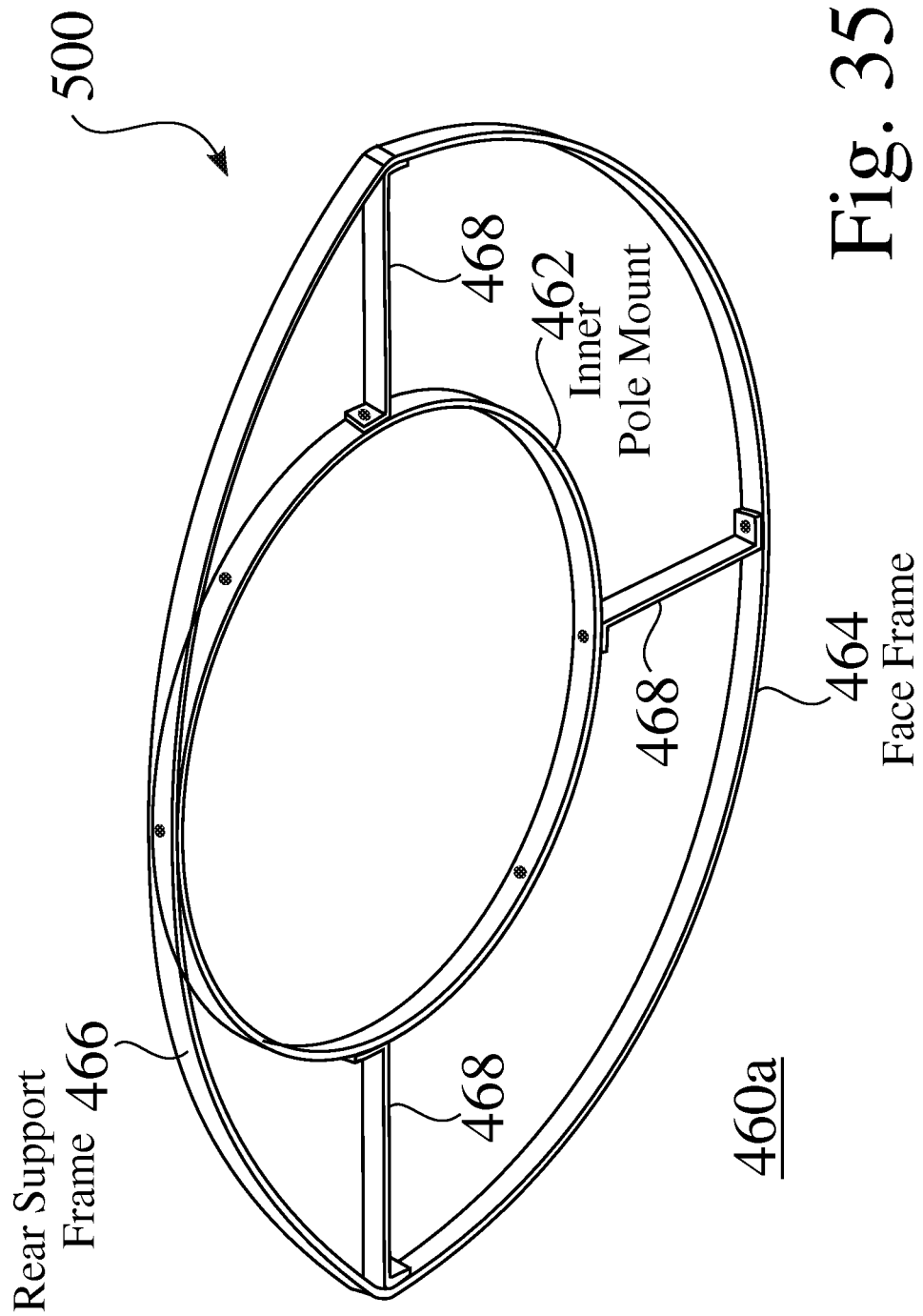
FIG. 35 is a perspective view of an exemplary curved panel mount.

FIG. 32 is a top schematic view of an exemplary curved frame structure 460a. FIG. 33 is a front schematic view 480 of an exemplary curved frame structure 460a. FIG. 34 is a side schematic view 490 of an exemplary curved frame structure 460a. FIG. 35 is a perspective view 500 of an exemplary curved frame structure 460a. In some embodiments, the curved frame structures 460a are comprised of corrosion resistant metal strips 462,464,466,468, e.g. such as comprising but not limited to stainless steel.

The exemplary curved frame structure 460a seen in FIG. 32 comprises an inner pole mount 462, which may be directly connectable to a pole structure 702, such as for stationary structures 700, or may be rotatably mounted to a pole structure 702, such as with a concentric bearing assembly 736 (FIG. 53), for rotatable power generation structures 700. The exemplary curved frame structure 460a seen in FIG. 32 also comprises a curved face frame 464 and a rear support frame 466, which are fixably attached to the inner pole mount 462, such as with extension brackets 468. The exemplary curved frame structure 460a seen in FIG. 32 to FIG. 35 may preferably be constructed with fasteners, or weldably fabricated.

Figure 36:
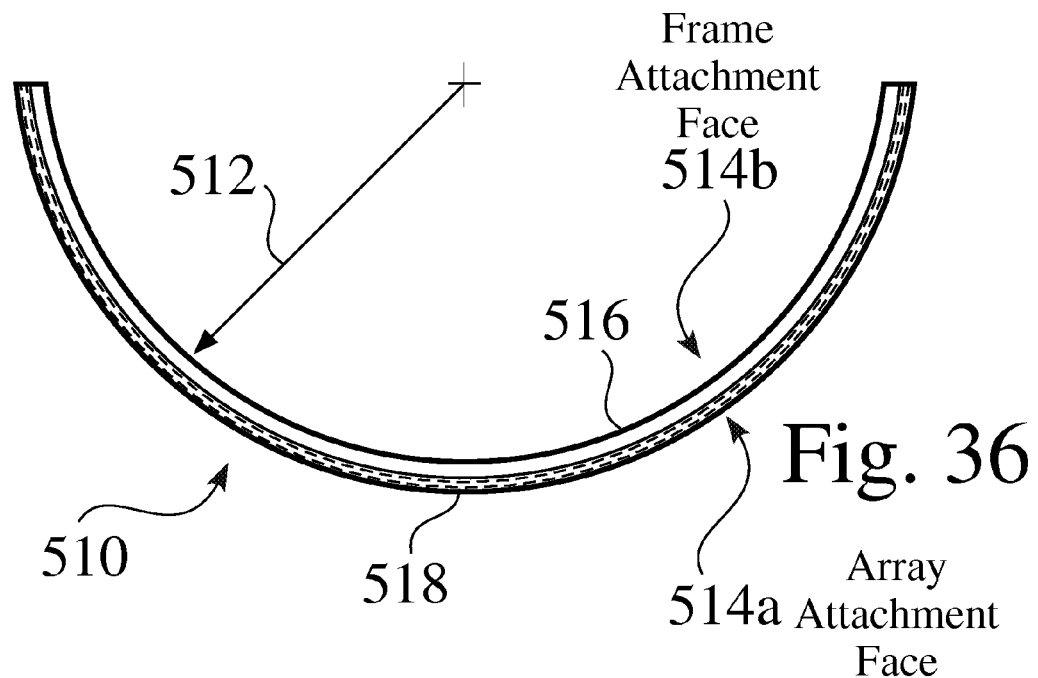
FIG. 36 is a top schematic view of an exemplary curved channel stay.
Figure 37:
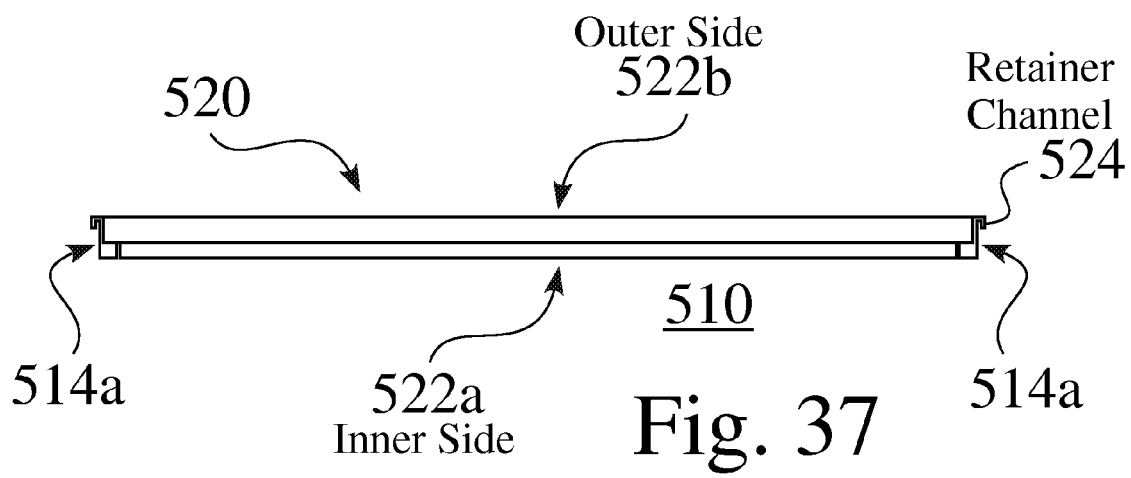
FIG. 37 is a front schematic view of an exemplary curved channel stay.

FIG. 36 is a top schematic view of an exemplary curved channel stay 510. FIG. 37 is a front schematic view 520 of an exemplary curved channel stay 510, having an inner side 522a that corresponds to an attached solar array 34, and an outer side 522b opposite the inner side 522a. The exemplary curved channel stay seen in FIG. 36 comprises a frame attachment face 514b having a mounting surface 516, such as for connection to a curved face frame 464 (FIG. 32). The radius 512 of the frame attachment face 514b corresponds to the outer convex surface of the curved face frame 464. The exemplary curved channel stay seen in FIG. 36 also comprises a convex array attachment face 514a opposite the concave frame attachment face 514b, which comprises an attachment boss 518 having a channel 524 for retaining a solar array 34, comprising one or more solar panel 10.

Figure 38:
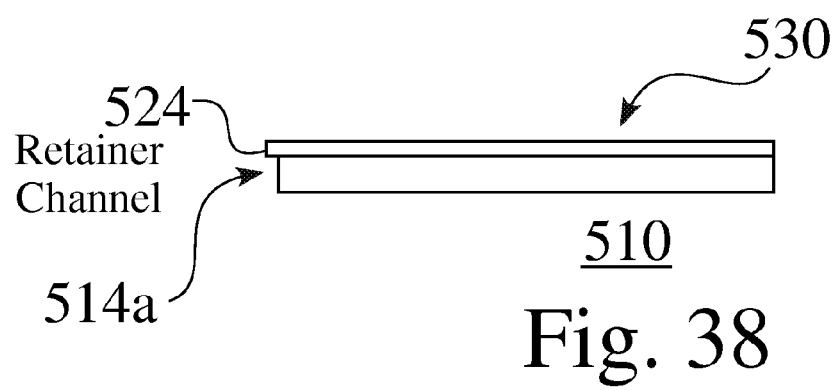
FIG. 38 is a side schematic view of an exemplary curved channel stay.
Figure 39:
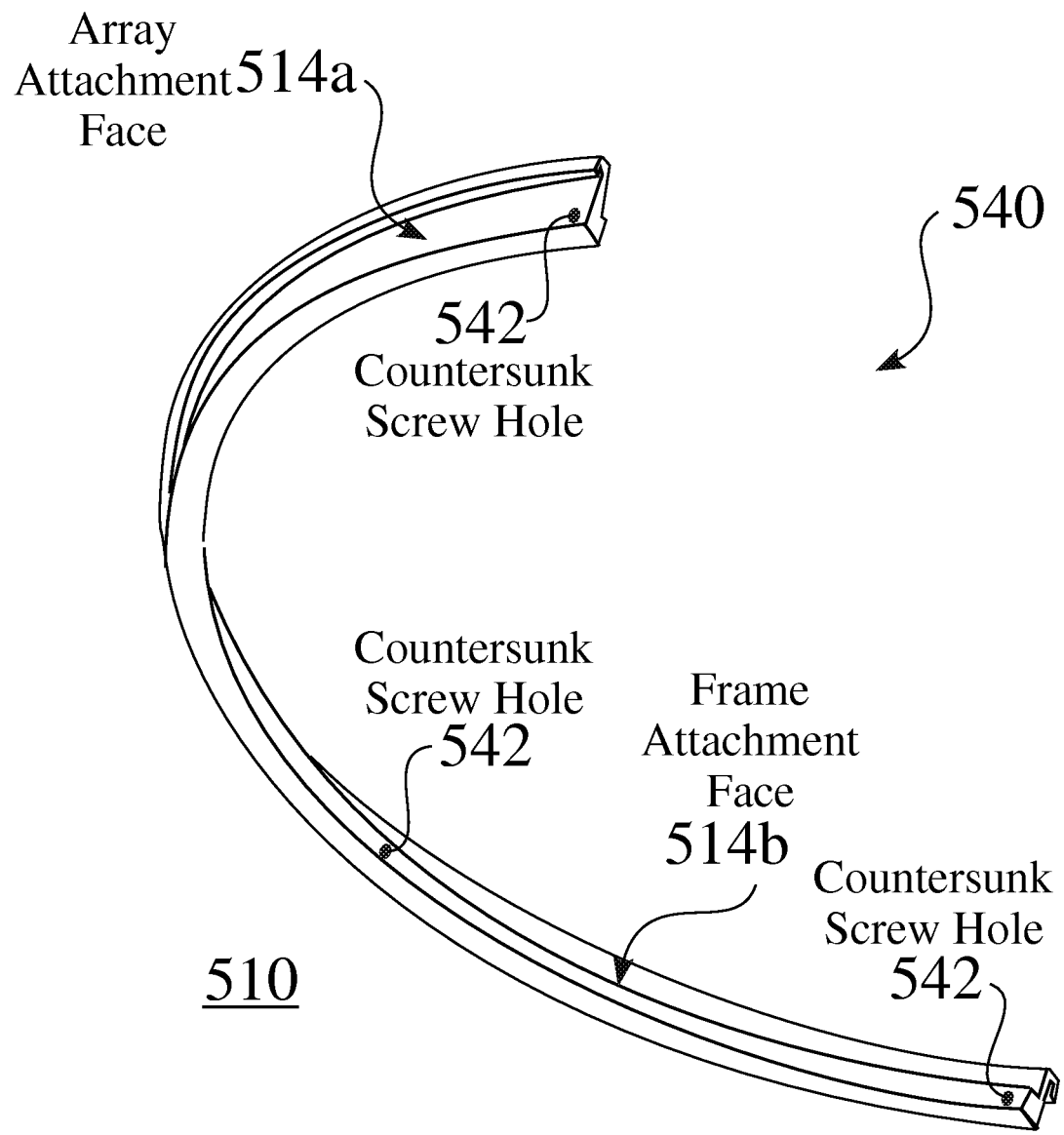
FIG. 39 is a perspective view of an exemplary curved channel stay.
Figure 50:
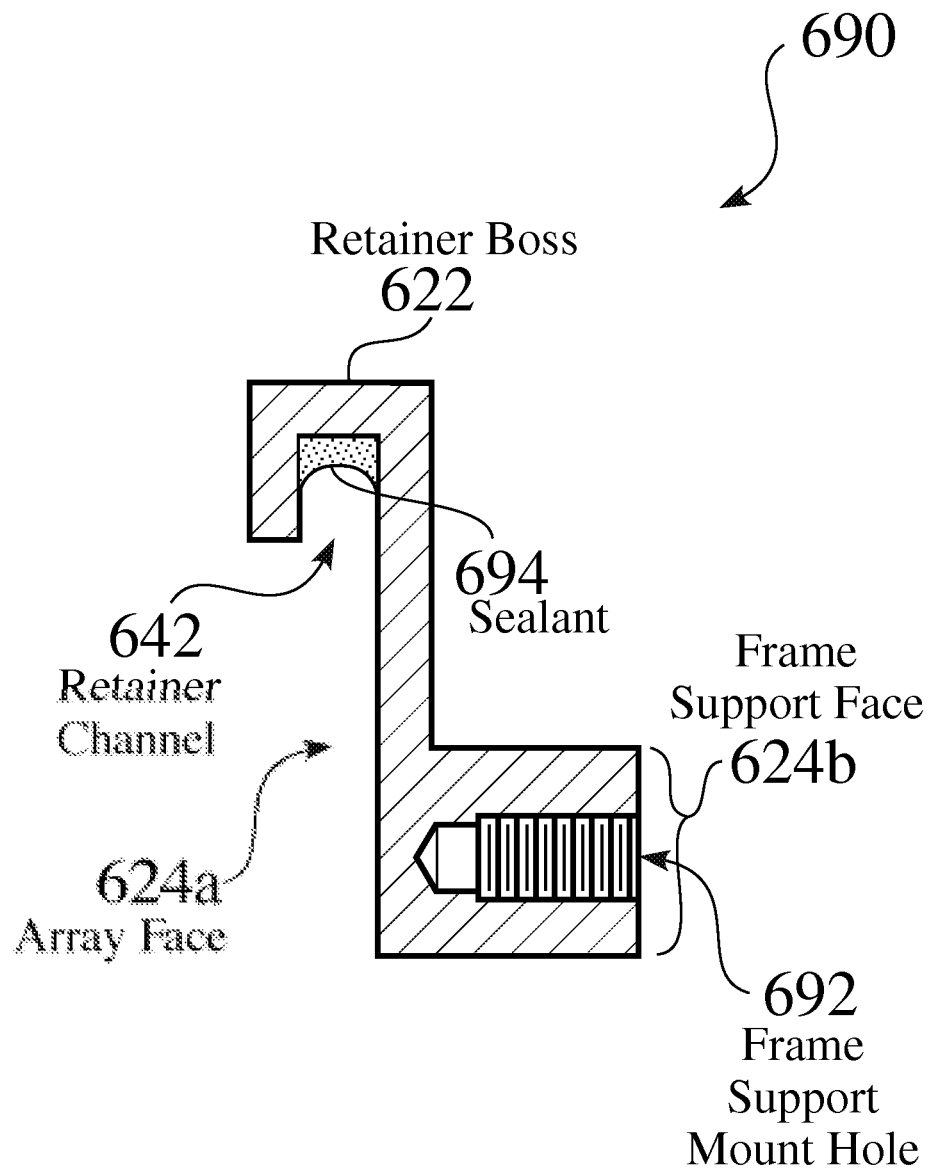
FIG. 50 is a partial cutaway view of an exemplary vertical channel stay.

FIG. 38 is a side schematic view 530 of an exemplary curved channel stay 510. FIG. 39 is a perspective view 540 of an exemplary curved channel stay 510. In some embodiments, screw holes 542 (FIG. 39) are defined in the curved channel stays 510, and may preferably be countersunk to avoid interference. To mount the main support, the user USR first slides a solar array 34 into place, using vertical channel stays 690 (FIG. 50). Once in place, the top and bottom curved channel stays 510 are bolted, to lock the solar panel 10 in place. A sealant 694 (FIG. 50), e.g. an epoxy sealant, may be applied to hold the solar panel 10 in the respective channels 524.

Figure 40:
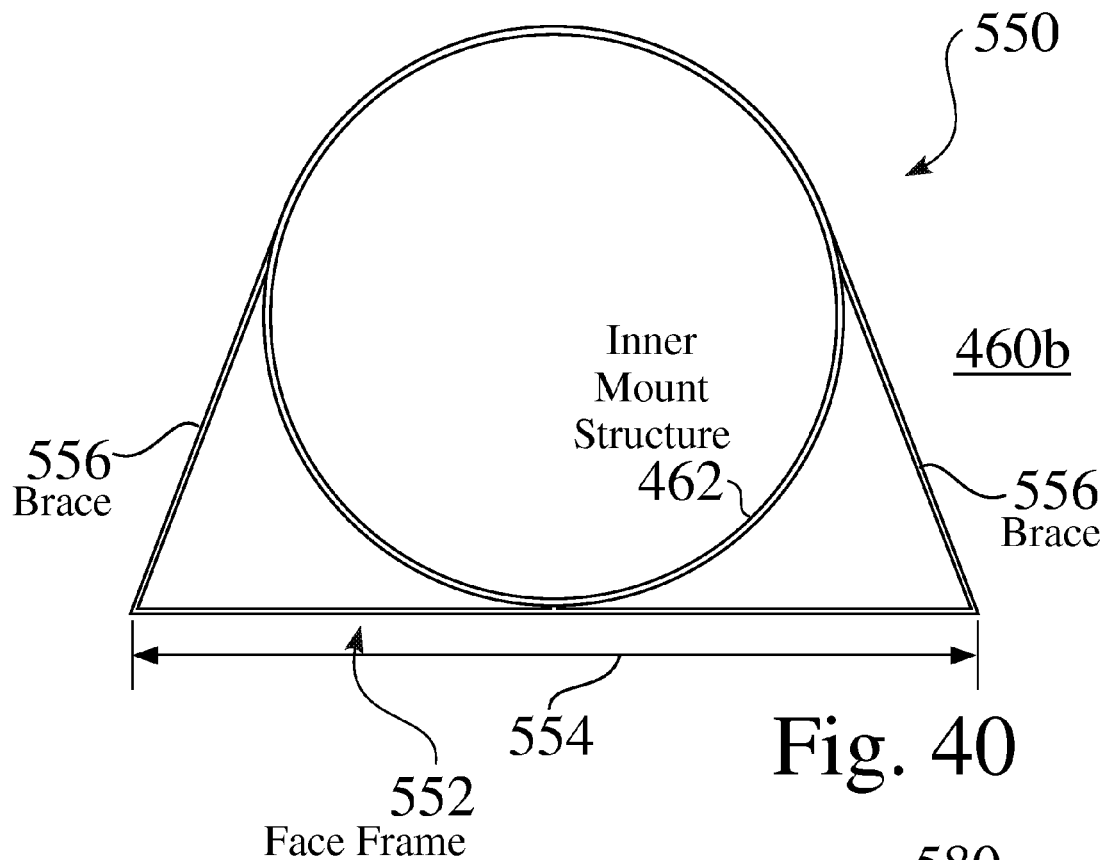
FIG. 40 is top schematic view of an exemplary flat panel mounting bracket.
Figure 41:
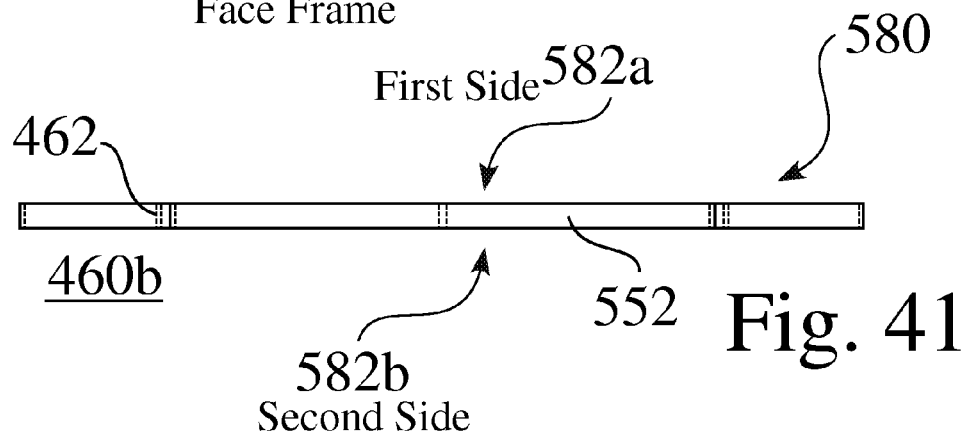
FIG. 41 is a front schematic view of an exemplary flat panel mounting bracket.
Figure 42:
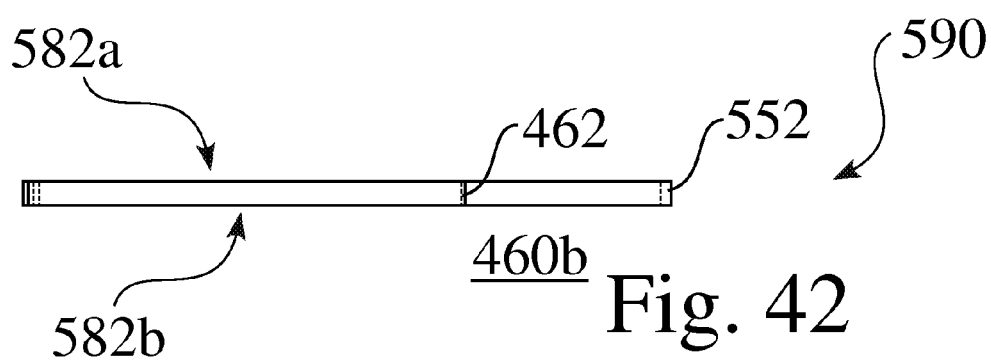
FIG. 42 is a side schematic view of an exemplary flat panel mounting bracket.
Figure 43:
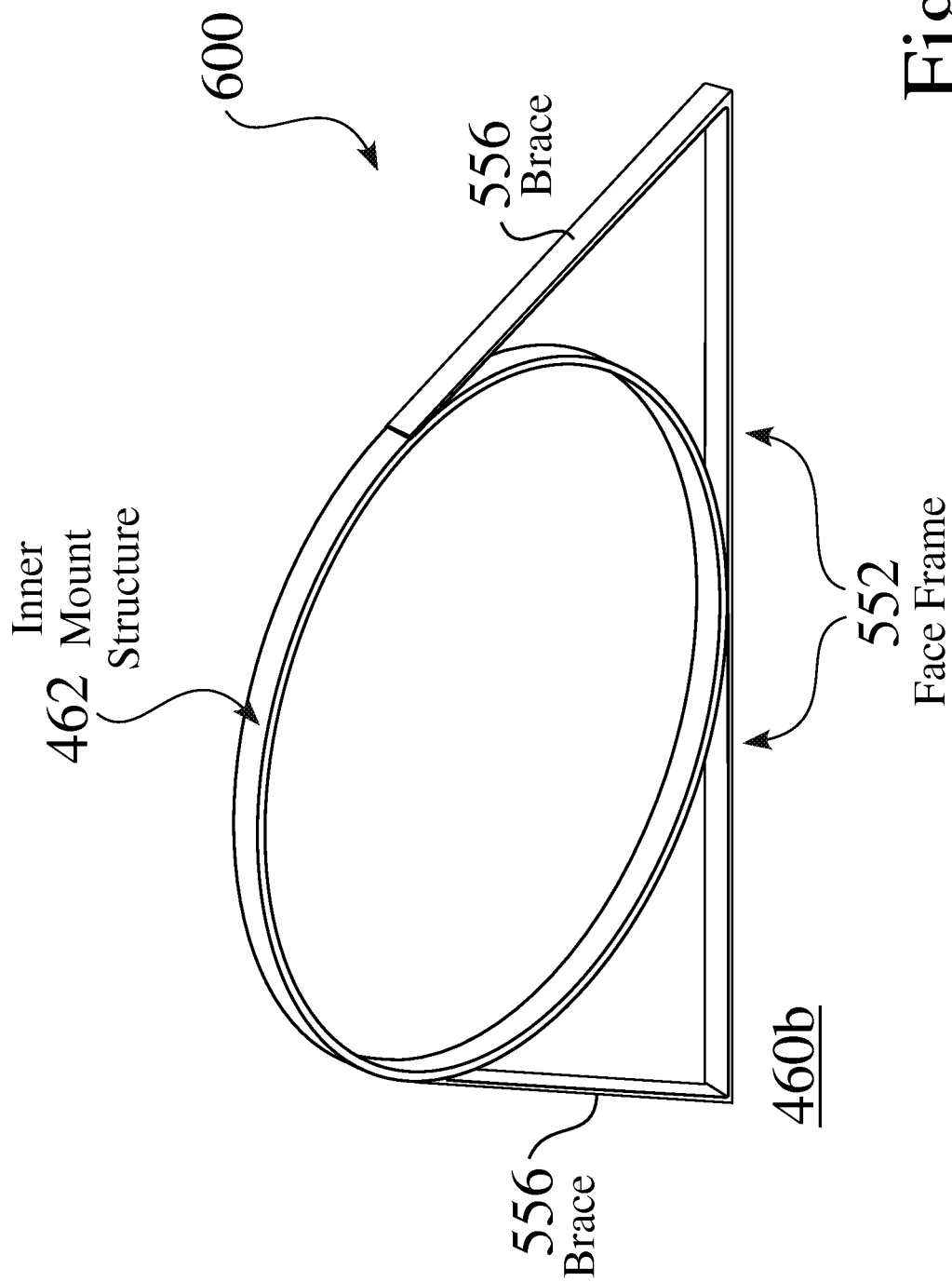
FIG. 43 is a perspective view of an exemplary flat panel mounting bracket.

FIG. 40 is top schematic view of an exemplary flat panel mounting frame 460b. The exemplary frame structure 460b seen in FIG. 40 comprises an inner pole mount structure 462, which may be directly connectable to a pole structure 702, such as for stationary structures 700, or may be rotatably mounted to a pole structure 702, such as with a concentric bearing assembly 736 (FIG. 53), for rotatable power generation structures 700. The exemplary frame structure 460b seen in FIG. 40 also comprises a planar face frame 552, such as having a defined width 554, e.g. 24 inches, and braces 566 that are fixably attached between the inner pole mount 462 and the planar face frame 552. FIG. 41 is a front schematic view 580 of an exemplary planar panel mounting frame 460b, having a first side 582a, and a second side 582b opposite the first side 582a. FIG. 42 is a side schematic view 590 of an exemplary planar panel mounting frame 460b. FIG. 43 is a perspective view 600 of an exemplary planar panel mounting frame 460b. In some embodiments, the planar panel mounting frames 460b are comprised of corrosion resistant metal strips, e.g. stainless steel, such as for ease of use and longevity in the field. The exemplary planar frame structures 460b seen in FIG. 40 to FIG. 43 may preferably be constructed with fasteners, or may be weldably fabricated.

FIG. 44 is top schematic view of an exemplary planar channel stay 620. FIG. 45 is a front schematic view 630 of an exemplary planar channel stay 620. FIG. 46 is a side schematic view 640 of an exemplary planar channel stay 620. FIG. 47 is a perspective view 650 of an exemplary planar channel stay 620. In some embodiments, the planar channel stays 620 are mounted using the same procedure as the curved channel stay 510, and may preferably be comprised from stainless steel extrusions, such as to prevent galvanic reactions. In some embodiments, the planar channel stays 620 have the same cross-sectional profile as the curved channel stays 510 or vertical channel stays 690 (FIG. 50).

Figure 48:
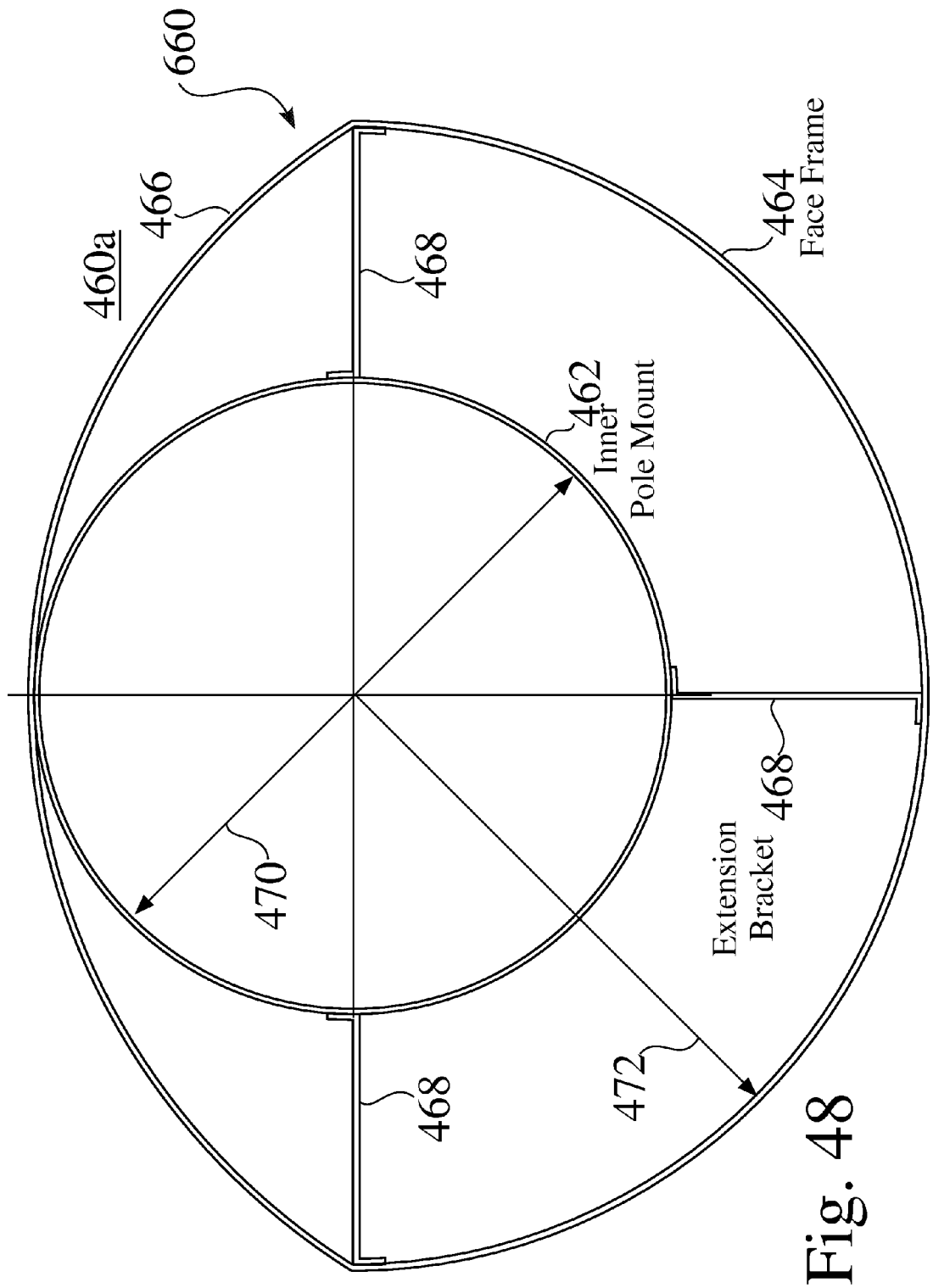
FIG. 48 is a detailed top schematic view of an alternate embodiment of a curved panel mount.

FIG. 48 is a detailed top schematic view 660 of an alternate embodiment of a curved frame structure 460a, such as comprised of stainless steel bands, wherein the material may preferably be chosen to have a sufficient yield strength to support the assembly. Holes through the curved panel mount may preferably be countersunk, such as to avoid any bolt interference.

Figure 49:
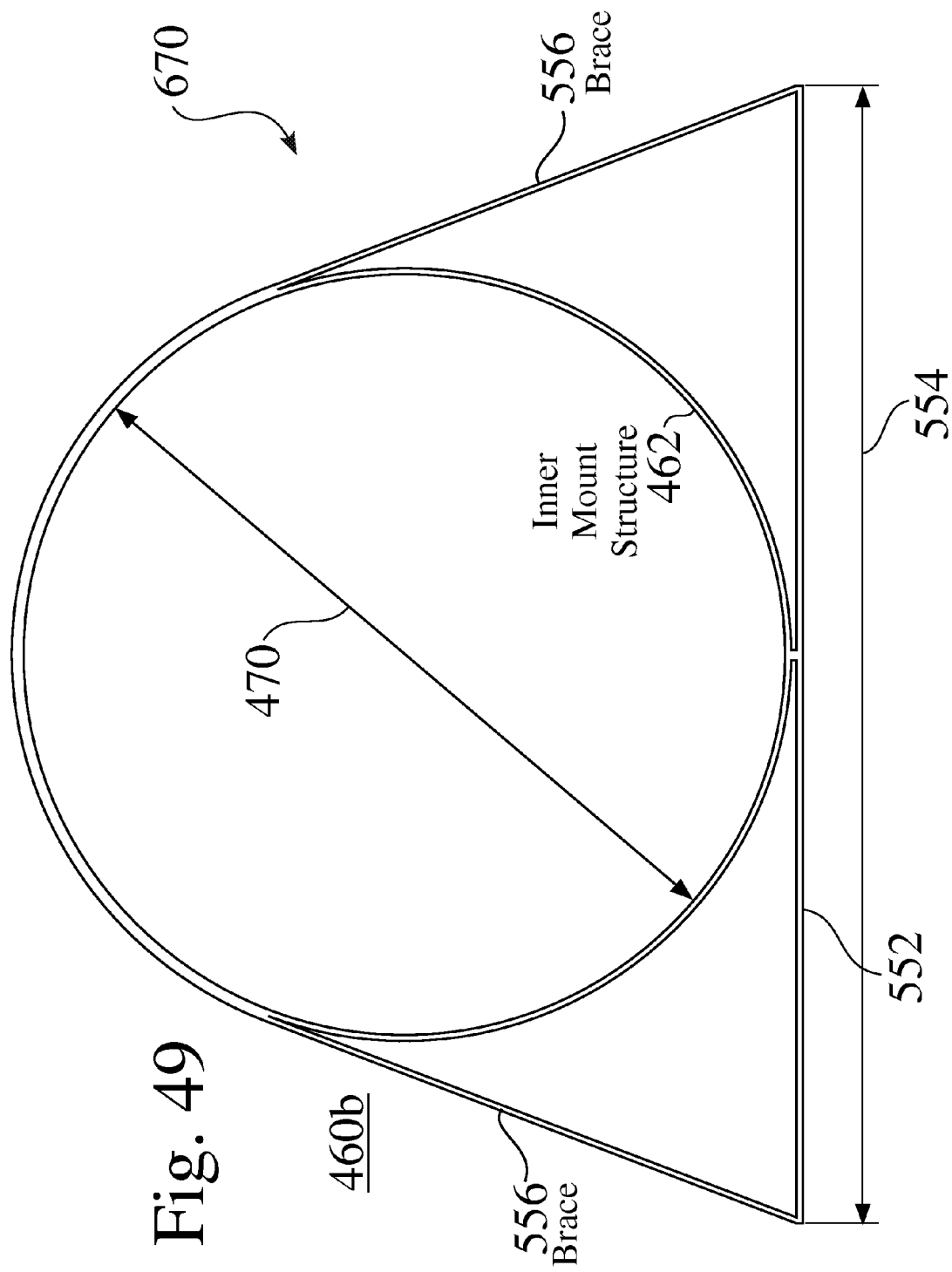
FIG. 49 is a detailed top schematic view of an alternate embodiment of a flat panel mount.

FIG. 49 is a detailed top schematic view 670 of an alternate embodiment of a planar frame structure 460b, which may be comprised in a similar manner to the curved frame structure 460a seen in FIG. 48, e.g. such as comprised of stainless steel bands, wherein the material may preferably be chosen to have a sufficient yield strength to support the assembly. The use of stainless steel bands may also provide some adjustability, such as for connection to a wide variety of power utility poles 702.

FIG. 50 is a partial cutaway view of an exemplary vertical channel stay 690. In some embodiments, the length of the vertical channel stay is 118 inches when used with the curved channel stays 510. In other embodiments, the length of the vertical channel stay 690 is 79 inches when used with the planar channel stays 620. The holes 692 defined in the vertical channel stay 690 may preferably be counter bored, such as to allow for four mounting points for attachment to curved frame structures 460a or planar frame structures 460b.

Pole-Mounted Stationary Arched Solar Power Structures.

Figure 51:
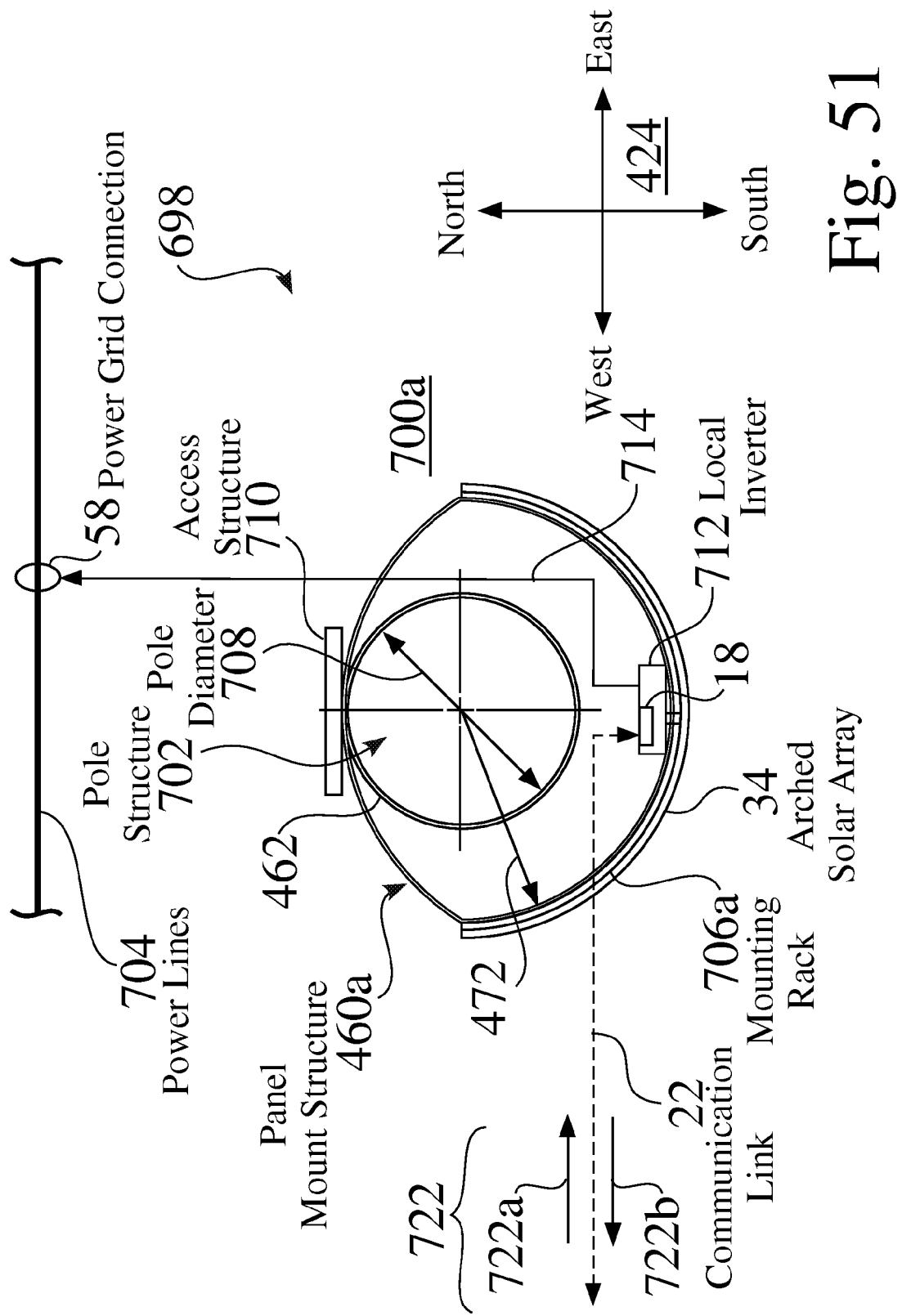
FIG. 51 is a partial schematic view of an exemplary pole-mounted stationary arched solar power structure having a DMPPT module.
Figure 52:
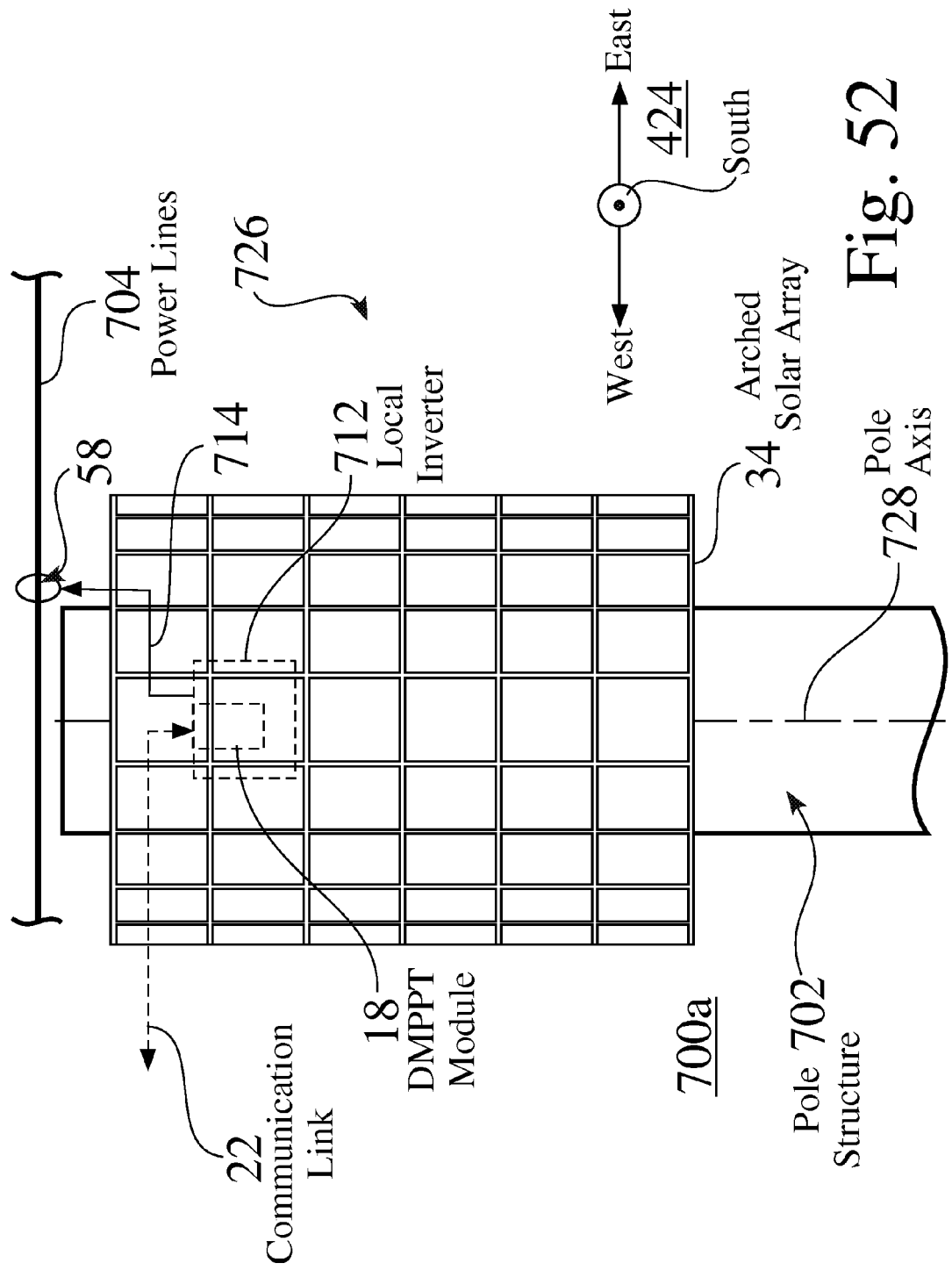
FIG. 52 is a partial front view of an exemplary pole-mounted stationary arched solar power structure having a DMPPT module.

FIG. 51 is a partial schematic view of an exemplary pole-mounted stationary arched solar power structure 700a having local DC to AC inverter 712, e.g. a micro-inverter 712, which may further comprise a DMPPT module 18. FIG. 52 is a partial front view 726 of an exemplary pole-mounted stationary arched solar power structure 700a. In some exemplary embodiments of pole-mounted stationary arched solar power structures 700, e.g. 700a, the solar array 34 comprises at least one solar panel 10, e.g. a flexible 300 watt panel 10, e.g. 36 inches wide by 10 feet long, that is mounted to a curved, e.g. hemispherical, mounting rack 706a, having a radius of 12 inches and a length of 10 feet, which is fixedly-mountable to a utility distribution pole 702, i.e. a power pole 702, having a defined characteristic pole axis 728, and an exemplary diameter 708 of 10 inches.

In a current exemplary embodiment of the pole-mounted stationary arched solar power structure 700a, the solar array 34 comprises a flexible thin-film panel 10, Part No. SFX-i200, available through Solopower, Inc. of San Jose, Calif., wherein the 200 watt thin-film panel has a width of 0.88 meters, a length of 2.98 meters.

In the Northern hemisphere, the exemplary pole-mounted stationary arched solar power structure 700a may typically be mounted facing southward, to maximize local power production. The exemplary pole-mounted stationary arched solar power structure 700a seen in FIG. 51 and FIG. 52 extends from and wraps around the power pole 702, wherein the solar array 34 may define and arc up to approximately one hundred eighty degrees. The pole-mounted structure 700a may preferably provide a vertical plane for the solar panel array 34, wherein the solar panels 10 are self-cleaning, since less dirt accumulates on the vertical panel surface 435 (FIG. 30), and at least a portion of any accumulated dirt is cleaned through any of wind, rain, dew, or fog. Furthermore the outer surface 435 of the flexible solar panels 10 may further comprise an outer coating layer 438 (FIG. 30), to further prevent buildup of dirt and/or promote cleaning.

The flexible solar array 34, comprising one or more solar panels 10, is mountably supported to a mounting rack 706, e.g. 706a, which may preferably be comprised of any of polyethylene or polycarbonate. The mounting rack 706a may preferably be attached directly or indirectly to one or more pole mount structures 460, e.g. 460a, which are mountable to a pole structure 702 or to other stationary object. An access structure 710 may also be provided, such as on the north side of the pole structure 702, e.g. a utility distribution pole 702, whereby service personnel can access the solar panel structure 700, as well as neighboring power lines 704, phone lines, and/or other items.

The exemplary pole-mounted stationary arched solar power structure 700a seen in FIG. 51 and FIG. 52 also comprises a local DC to AC invertor 712, e.g. a micro-inverter 712, for inversion of array DC power to AC power, for AC electrical connection 714 to the local power grid 58.

The DC to AC inverter 712 may be selected based on a wide variety of features, such as but not limited to any of input panel power (nameplate STC), maximum input voltage, peak power tracking voltage, maximum short circuit current, maximum input current, maximum output power, nominal output current, nominal and extended output voltage and range, nominal and extended frequency and range, power factor, nominal efficiency, nominal power point tracking accuracy, temperature range, standby power consumption, size, weight, environmental rating, communications capabilities, and/or warranty. In some system embodiments 700, e.g. 700a, the DC to AC inverter 712 may comprise a Model No. M215 micro inverter, available through Enchase Energy, of Petaluma, Calif.

A DMPPT module 18 may also be provided, such as within or otherwise associated with the DC to AC inverter 712. A communication link 22, e.g. wired or wireless, is preferably connectable to the DC to AC inverter 712, such as through the DMPPT module 18. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

Each of the pole-mounted stationary arched solar power structures 700a typically comprises a mechanism, such as provided through the DMPPT 18, for transmission and receipt of signals 722, for tracking and/or local control of voltage and/or current delivered to the power lines 704 through the DC to AC inverter 712. The DC to AC inverter 712 and/or DMPPT 18 may also preferably be configured for any of local or off-site control of start-up, daily shutdown, fail safe/emergency shutdown, and/or maintenance modes of operation Some embodiments of the DC to AC inverter 712 and/or DMPPT 18 may further be configured to provide controlled rotation 734 or other movement of one or more solar panels 10 in pole-mounted rotatable solar power structures 700, e.g. 700b (FIG. 53), such as based on location, time of day, date, shading, maximum illumination direction, and/or service modes. e.g. shutting down a panel and locking in position to provide for worker access to a utility distribution pole 702.

Outgoing signals 722b over the communication link 22 are typically sent to a controller or server, e.g. 153 (FIG. 14) associated with the operating entity, e.g. such as but not limited to a local or regional utility, which may provide control through a regional location or through a central location, e.g. headquarters. The signals 722 may be transferred over a network, e.g. 158 (FIG. 14), such as but not limited to the Internet or a cloud network.

Pole-Mounted Rotatable Arched Solar Power Structures.

Figure 53:
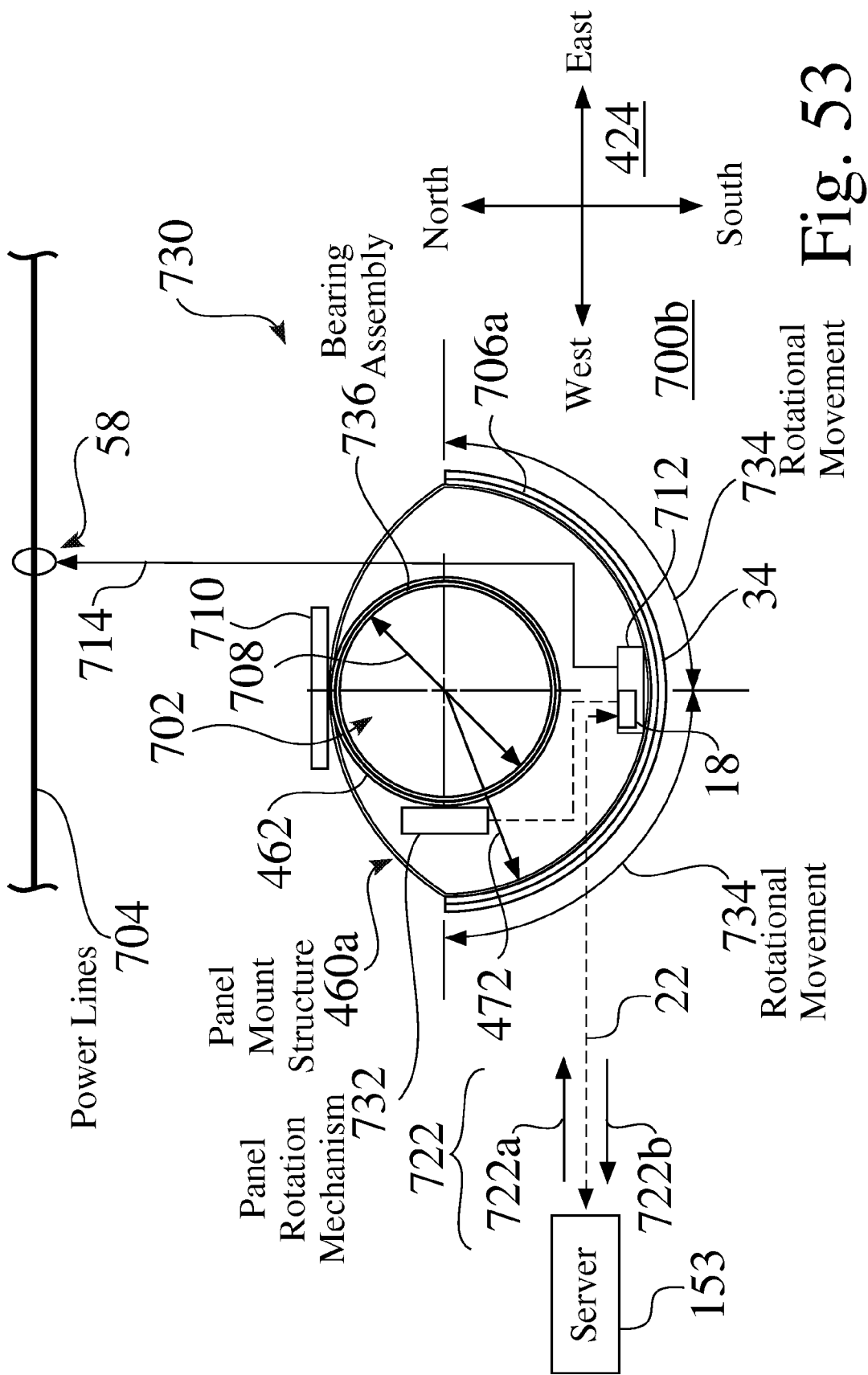
FIG. 53 is a partial schematic view of an exemplary pole-mounted rotatable arched solar power structure having an enhanced DMPPT module.

FIG. 53 is a partial schematic view 730 of an exemplary pole-mounted rotatable arched solar power structure 700b having a local DC to AC inverter 712. FIG. 54 is a partial front view 740 of an exemplary pole-mounted rotatable arched solar power structure 700b. FIG. 55 is a partial schematic view 742 of an exemplary pole-mounted rotatable arched solar power structure 700b, located in the Northern Hemisphere at a first time $T_1$, e.g. early morning, wherein the solar array 34 is rotatably positioned 743a in a generally Eastward direction. FIG. 56 is a partial schematic view 744 of the pole-mounted rotatable arched solar power structure 700b of FIG. 55, at a second time $T_2$, e.g. about 12:00 PM, wherein the solar array 34 is rotatably positioned 743n in a generally Southward direction. FIG. 57 is a partial schematic view 746 of the pole-mounted rotatable arched solar power structure 700b of FIG. 55 and FIG. 56, at a third time $T_3$, wherein the solar array 34 is rotatably positioned 743s in a generally Westward direction.

While the sequential views of the exemplary pole-mounted rotatable arched solar power structure 700b shown in FIG. 55 to FIG. 57 indicate three discreet times during the day, it should be understood that the panel rotation mechanism 732, such as linked through the DMPPT 18, may preferably be operated 734 continuously or sequentially throughout the day, e.g. such as but not limited to every minute, every ten minutes, or every hour. At the end of the day, such as during system shutdown, during the night, or during start up the next morning, the rotatable solar array 34 is rotated 734 back to its beginning morning position, e.g. 743a.

The exemplary pole-mounted rotatable arched solar power structure 700b seen in FIG. 53 through FIG. 57 may preferably comprise the same mounting rack 706a as the pole-mounted stationary arched solar power structure 700a seen in FIG. 51 and FIG. 52. However, the rotatable arched solar power structure 700b is rotatably movable 734 about the utility distribution pole 702, such as with respect to concentric bearings 736 (FIG. 53) mounted between the inner mount structure 462 and the pole 702. In some embodiments, the solar array 34 is controllably rotatable 734 up to 180 degrees, e.g. up to 90 degrees clockwise or counterclockwise from a central Southward position about the utility distribution pole 702, from east in the AM to west in the PM, under computer control, e.g. through the DMPPT module 18. The solar panel mounting structure 460a may preferably include one or more tracks or guides 736, e.g. roller bearing guide assemblies, wherein the rotatable solar array mounting rack 460a may be rotated 734 about the central pole 702.

In some exemplary embodiments of the pole-mounted rotatable arched solar power structure 700b, the solar array 34 comprises a flexible 300 watt panel, e.g. 36 inches wide by 10 feet long, that is mounted to a curved, e.g. hemispherical, solar array rack 706a, having a radius of 12 inches and a length of 10 feet, which is rotatably mountable to a central support structure, which in turn is mounted to a utility distribution pole 702, i.e. power pole 702, having an exemplary diameter of 10 inches.

The circumference of the exemplary arched solar array 34 in the above example is about 37.7 inches, as compared to a circumference of about 15.7 inches around half of the utility distribution pole 702 having a diameter of 10 inches. In both planar and curved embodiments of the pole-mounted rotatable arched solar power structures 700, the width of the solar arrays 34 may preferably be configured to greater than half the circumference of the power distribution structures, e.g. poles or towers 702, upon which they are installed, since the solar arrays 34 are extendably mounted, i.e. cantilevered out, from the pole structures 702.

Therefore, pole-mounted stationary and rotatable arched solar power structures 700a, 700b may readily provide a substantially larger area for solar cells 12, as compared to systems having stationary thin film panels that are wrapped directly to a utility distribution poles 702. The size of the perimeter or diameter of the mounting rack 706a for pole-mounted stationary and rotatable arched solar power structures 700a, 700b may be chosen based on one or more factors, such as but not limited to any of available panel sizes, cost, zoning, wind, shading, and/or the rotational range of the system, e.g. 180 degrees, 150 degrees, 120 degrees, etc.

In the Northern hemisphere, the exemplary pole-mounted rotatable arched solar power structure 700b may preferably be rotatable 734 to face from the East to the West, toward the Equator, to maximize local power production.

The exemplary pole-mounted rotatable arched solar power structure 700b seen in FIG. 53 and FIG. 57 may preferably extend around the power pole by up to 180 degrees, and is typically configured to provide a vertical plane for the solar array 34, comprising one or more solar panels 10, wherein the solar panels 10 are self-cleaning, since less dirt accumulates on the vertical panel surfaces 435 (FIG. 30), and at least a portion of any accumulated dirt is cleaned through any of wind, rain, dew, or fog. Furthermore the surface 435 of such flexible solar panels 10 may further comprise an outer coating layer 438 (FIG. 30), to further prevent buildup of dirt and/or promote cleaning.

The flexible solar panels 10 are mountably supported to a mounting rack 706a, which may preferably comprise any of polyethylene or polycarbonate, wherein the mounting rack 706a is attached directly or indirectly to one or more pole mount structures 460a, which are rotatably mountable 736 to a pole structure 702 or other stationary object. An access structure 710, e.g. a service ladder, may also be provided, such as on the north side of the pole 702, wherein service personnel can access the solar panel structure 700b, as well as neighboring power lines 704, phone lines, and/or other items.

While the exemplary pole-mounted rotatable arched solar power structure 700b seen in FIG. 53 through FIG. 57 shows a flexible solar array 34 that is curved and supported in a fixed arc, e.g. having a 24 inch diameter, wherein the array 34 and mounting rack 706a are rotatable 734 as an assembly, an alternate system embodiment 700b may preferably comprise a flexible array 34 that is controllably moved in relation to one or more tracks having a defined arc, such as a movable screen, curtain, or a "Lazy Susan" style track system.

The exemplary pole-mounted rotatable arched solar power structure 700b seen in FIG. 53 through FIG. 57 also comprises a local DC to AC invertor 712, e.g. a micro-inverter 712, for inversion of array DC power to AC power, and for an AC electrical connection 714 to the local power grid 58. The DC to AC inverter 712 for pole-mounted rotatable arched solar power structures 700 may preferably be selected based on a wide variety of features, such as but not limited to any of input panel power (nameplate STC), maximum input voltage, peak power tracking voltage, maximum short circuit current, maximum input current, maximum output power, nominal output current, nominal and extended output voltage and range, nominal and extended frequency and range, power factor, nominal efficiency, nominal power point tracking accuracy, temperature range, standby power consumption, size, weight, environmental rating, communications capabilities, and/or warranty. In some system embodiments 700, e.g. 700b, the DC to AC inverter 712 comprises a Model No. M215 micro inverter, available through Enchase Energy, of Petaluma, Calif.

A DMPPT module 18 may also be provided, such as within or otherwise associated with the DC to AC inverter 712. A communication link 22, e.g. wired or wireless, is preferably connectable to the DC to AC inverter 712, such as through the DMPPT module 18. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

The local DC to AC inverter 712, e.g. a micro-inverter 712, may preferably be configured, such as provided through the DMPPT 18, for the receipt and transmission of signals 722, e.g. 722a, 722b, such as for tracking and/or local control of voltage and/or current delivered to the power lines 704 through the DC to AC inverter 712. The local DC to AC inverter 712 and/or DMPPT 18 may be configured for any of local or off-site control of start-up, daily shutdown, fail safe/emergency shutdown, and/or maintenance modes of operation. A controller, e.g. 80 (FIG. 7), such as in conjunction with or within the DMPPT 18 or the DC to AC inverter 712, may comprise a mechanism 732 for rotation 734 or other movement of one or more solar panels 10, such as based on location, time, shading, maximum illumination direction, and/or service modes. e.g. shutting down an array 34 or panel 10, and locking in position to provide for worker access to a utility distribution pole 702.

Outgoing signals 722b over the communication link 22 are typically sent to a controller or server, e.g. 153, e.g. associated with the operating entity, such as but not limited to a local or regional utility, which may provide control through a regional location or through a central location, e.g. headquarters. The signals 722 may be transferred over a network 158, such as but not limited to the Internet or a cloud network.

The enhanced pole-mounted solar power structures 700 disclosed herein provide a localized DC to AC invertor 712, e.g. a micro-inverter 712, and localized AC connections 714 to the power lines 704, e.g. right at or near the utility distribution pole 702. Therefore, there are no transmission costs or losses associated with the power produced at the enhanced pole-mounted solar power structures 700.

Pole-Mounted Stationary Flat Solar Power Structures.

Figure 58:
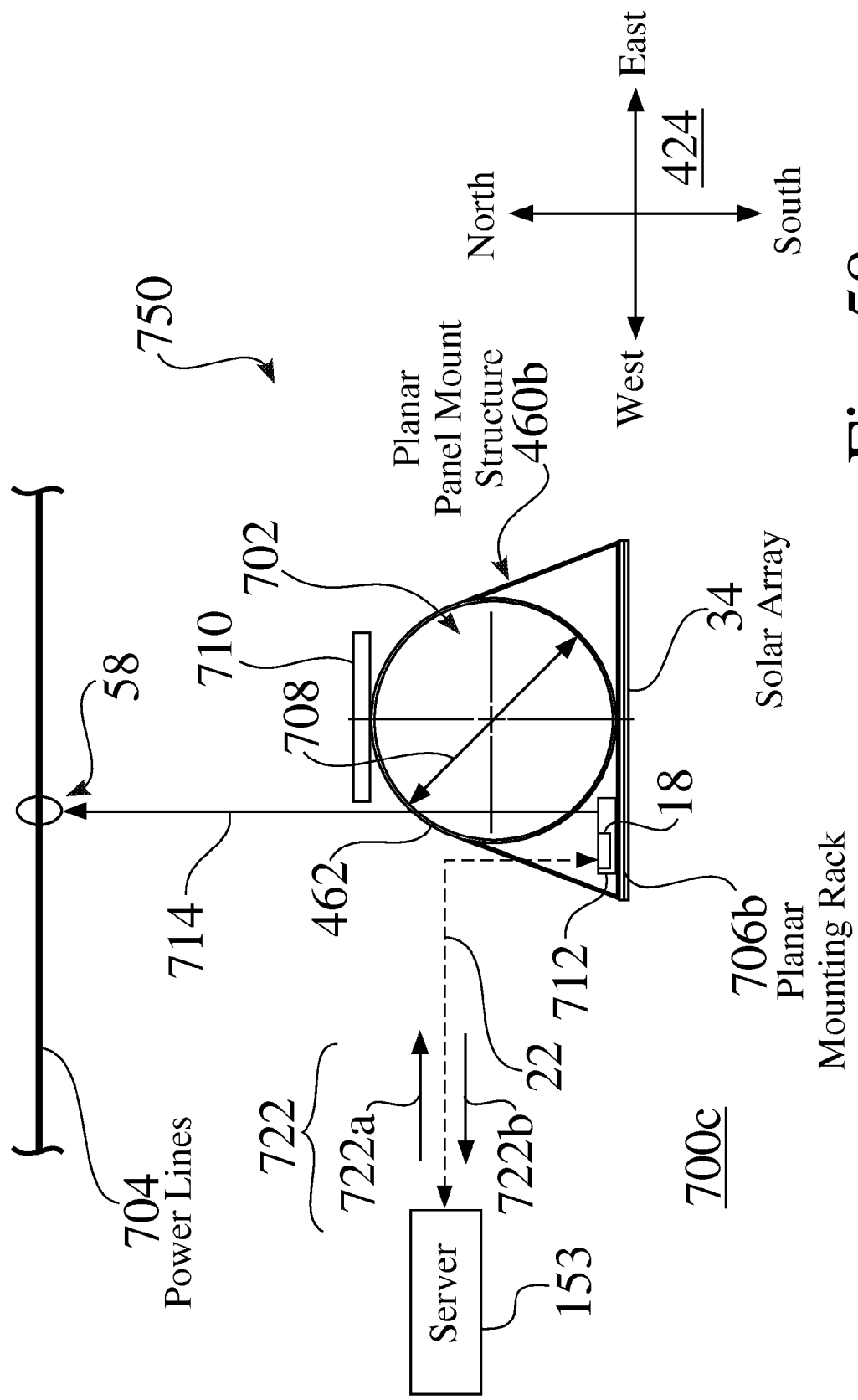
FIG. 58 is a partial schematic view of an exemplary pole-mounted stationary flat solar power structure having a DMPPT module.
Figure 59:
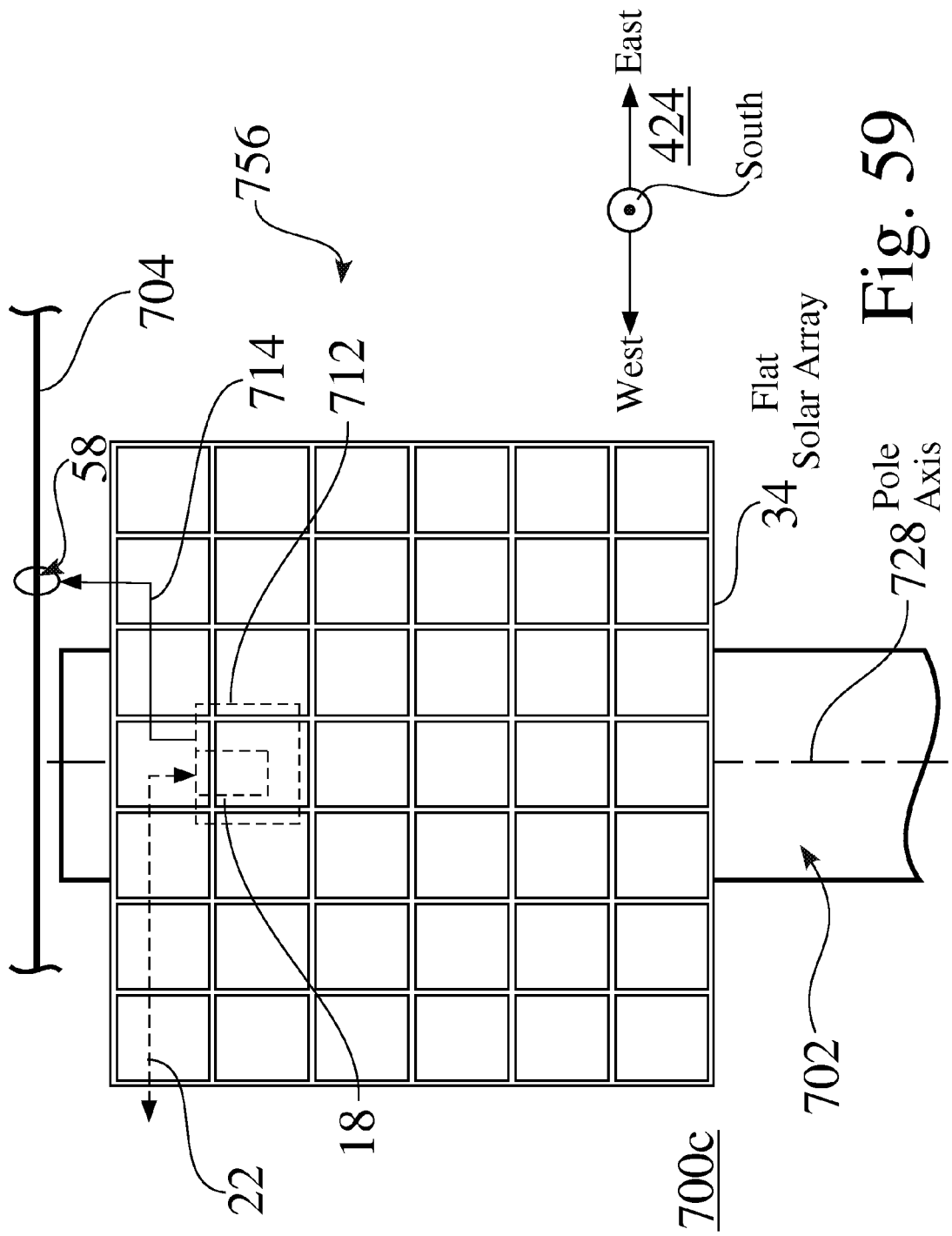
FIG. 59 is a partial front view of an exemplary pole-mounted stationary flat solar power structure.

FIG. 58 is a partial schematic view 750 of an exemplary pole-mounted stationary planar solar power structure 700c. FIG. 59 is a partial front view 756 of an exemplary pole-mounted stationary planar solar power structure 700c.

In some exemplary embodiments of the pole-mounted stationary planar solar power structure 700c, the solar array 34 comprises a flexible rectangular 300 watt panel 10, e.g. having a width 28 (FIG. 2) of 36 inches and a length 29 (FIG. 2) of 10 feet, which is mounted to a planar mounting rack 706b, having a corresponding width of 36 inches and length of 10 feet, wherein the planar mounting rack 706b is fixedly-mountable to a utility distribution pole 702, i.e. power pole 702, having an exemplary diameter 708 of 10 inches. In another current exemplary embodiment of the pole-mounted stationary arched solar power structure 700c, the solar array 34 comprises Part No. SFX-i200 solar panel, available through Solopower, Inc. of San Jose, Calif., wherein the 200 watt thin-film panel 10 has a width 28 of 0.88 meters, and a length 29 of 2.98 meters.

In the Northern hemisphere, the exemplary pole-mounted stationary planar solar power structure 700c may preferably be mounted facing southward, to maximize the local power production. The power production for an exemplary pole-mounted stationary planar solar power structure 700c, such as having a 20" wide by 10' long thin-film panel 10 producing 200 watts mounted to a 20" by 10' rack facing South, is greater than the power production of a pole-mounted stationary solar power structure 700a having a 180 degree curved mounting 706a that is similarly oriented, since the average incident light energy is greater for the flat configuration.

The exemplary pole-mounted stationary planar solar power structure 700c seen in FIG. 58 and FIG. 59 is typically configured to provide a vertical plane for the solar array 34, comprising one or more solar panels 10, wherein the solar panels 10 are inherently self-cleaning, since less dirt accumulates on the vertical panel surfaces 435 (FIG. 30), and at least a portion of any accumulated dirt is cleaned through any of wind, rain, dew, or fog. The outer surfaces 435 of the flexible solar panels 10 may also comprise an outer coating layer 438 (FIG. 30), to further prevent buildup of dirt and/or promote cleaning.

The flexible solar array 34 is mountably supported to a planar mounting rack 706b, which may preferably comprise any of polyethylene or polycarbonate, wherein the planar mounting rack 706b is attached directly or indirectly to one or more planar panel mount structures 460b, which are mountable to pole structure 702 or other stationary object. An access structure 710, e.g. a ladder, may also be provided, such as on the North side of the pole structure 702, wherein service personnel can access the solar panel structure 700c, as well as any of neighboring power lines 704, phone lines, or other items.

The exemplary pole-mounted stationary planar solar power structure 700c seen in FIG. 58 and FIG. 59 similarly comprises a local DC to AC invertor 712, e.g. a micro-inverter 712, for inversion of array DC power to AC power, and for AC electrical connection 714 to the local power grid 58. A DMPPT module 18 may also be provided, such as within or otherwise associated with the DC to AC inverter 712.

A communication link 22, e.g. wired or wireless, is preferably connectable to the micro-inverter 712, such as through the DMPPT module 18. While some embodiments of the communications link 22 are wireless, other embodiments of the communications link 22 may comprise a wired link 22, such as through any of a phone line, a dedicated line, or as a piggy-backed communications signal link 22 over one or more existing lines, e.g. through one or more of the power lines 704.

The local DC to AC inverter 712, e.g. a micro-inverter 712, may preferably be configured, such as provided through the DMPPT 18, for the receipt and transmission of signals 722, e.g. for tracking and/or local control of voltage and/or current delivered to the power lines 704 through the DC to AC inverter 712. The local DC to AC inverter 712 and/or DMPPT 18 may be configured for any of local or off-site control of start-up, daily shutdown, fail safe/emergency shutdown, and/or maintenance modes of operation.

Outgoing signals 722b over the communication link 22 may preferably be sent to a controller or server, e.g. 153, such as associated with the operating entity, e.g. such as but not limited to a local or regional utility, which may provide control through a regional location or through a central location, e.g. headquarters. The outgoing, i.e. uplink, signals 922b may be transferred over a network, e.g. 158 (FIG. 14), such as but not limited to the Internet or a cloud network.

Pole-Mounted Rotatable Flat Solar Power Structures.

Figure 60:
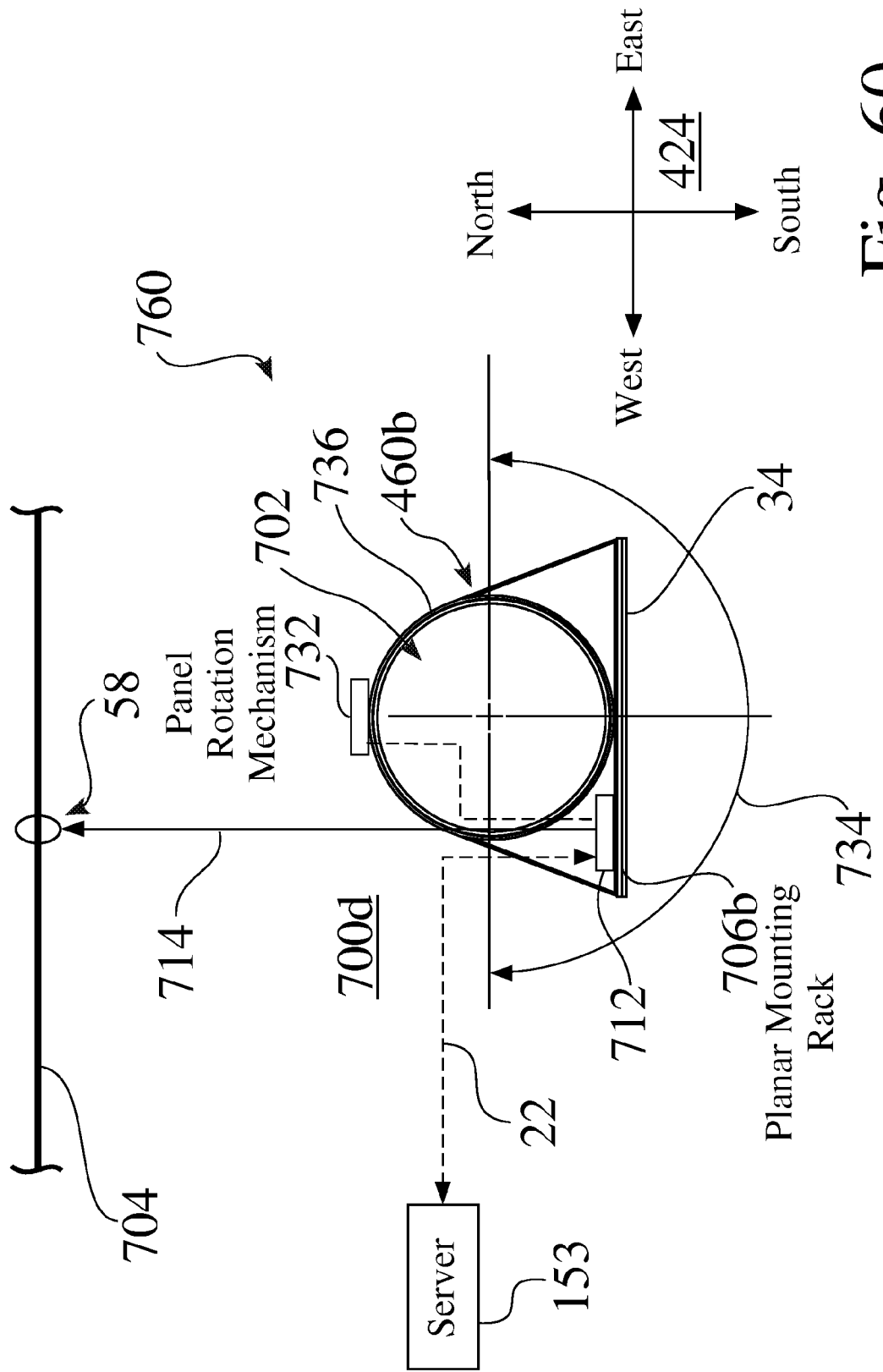
FIG. 60 is a partial schematic view of an exemplary pole-mounted rotatable flat solar power structure.

FIG. 60 is a partial schematic view 760 of an exemplary pole-mounted rotatable planar solar power structure 700d. FIG. 61 is a partial schematic view 762 of an exemplary pole-mounted rotatable planar solar power structure 700d, located in the Northern Hemisphere at a first time $T_1$, e.g. early morning, wherein the solar array 34 is rotatably positioned 734 in a generally Eastward direction 743a. FIG. 62 is a partial schematic view 764 of the pole-mounted rotatable planar solar power structure 700d of FIG. 61, at a second time $T_2$, e.g. midday, wherein the solar array 34 is rotatably positioned 734 in a generally Southward direction 743n. FIG. 63 is a partial schematic view 766 of the pole-mounted rotatable planar solar power structure 700d of FIG. 61 and FIG. 62, at a third time $T_3$, e.g. just before dusk, wherein the solar array 34 is rotatably positioned 734 in a generally Westward direction 743s.

The rotatable planar solar power structure 700d seen in FIG. 60 through FIG. 63 may be similar in mounting 460b to the stationary planar solar power structure 700c seen in FIG. 58 and FIG. 59, except for the use of tracks or guides 736, e.g. roller bearing guides, that allow the mounting rack 706b and corresponding solar array 34 to rotate 734, e.g. up to 180 degrees, around the power pole 702. In some system embodiments, the mounting rack 706b and corresponding solar array 34 may preferably be rotated based on any of location, time of day, available light, shading, service needs, startup, shutdown, or any combination thereof. For example, the mounting rack 706b and corresponding solar array 34 may be controllably rotated 734, e.g. clockwise in the Northern hemisphere) from the east in the morning toward the west in the afternoon, such as responsive to any of local or remote computer control.

Transmission Line Mounted Solar Power Structures.

FIG. 64 is a partial schematic view 780 of a transmission line mounted solar power structure 700e. In one exemplary embodiment, the solar array comprises a 36" wide by 10' long thin-film solar panel 10 that is mounted, with or without a mounting rack 784, flat on top of three power transmission lines 704. The solar panel 10 and mounting rack 784 may preferably be centered and locked onto the top of the power pole 702, such as with 5' overhang left and right of the power pole 702, with the solar panel 10 attached to the power lines 704 for support, and separated from the power lines 704 with a high dielectric material 786. A local DC to AC inverter 712, e.g. a micro inverter 712, is connected to the DC outputs of the solar array 34, and may preferably be connected to or include a DMPPT module 18. The DC to AC inverter 712 also provides a local AC connection 714 to the local power grid 58, through the power transmission lines 704.

Pole Mounted Solar Concentrator Structures.

FIG. 65 is a partial schematic view 800 of an exemplary pole-mounted arched solar concentrating power structure 700f. FIG. 66 is a partial schematic view 820 of an exemplary pole-mounted planar solar concentrating power structure 700g.

In an exemplary embodiment of the pole-mounted solar concentrating power structures 700f,700g, a 24 inch wide by 10 foot long solar concentrating panel 804, e.g. heliostat technology, is mounted to a corresponding mounting rack 706, e.g. 706a,706b, and may further comprise roller bearing guides 736 and a rotation mechanism 732, e.g. a drive motor 732, which allows the solar concentrating panels 804 to be controllably rotated 734 around the power pole 702, e.g. up to 180 degrees, from east in the morning to west in the afternoon, such as responsive to any of local or remote computer control. The use of heliostat technology, as applied to one or more of the embodiments 700f,700g, although more complex, may suitably be implemented to provide more electricity than an installation without such heliostat mechanisms, e.g. up to an approximate factor of five times over array embodiments without solar power concentration.

Pole Mounted Solar Power Structures Integrated with Wind Generation Systems.

FIG. 67 is a partial schematic view 830 of an exemplary pole-mounted arched solar power structure 700h, which is integrated with a wind turbine 832. FIG. 68 is a partial schematic view 840 of an exemplary pole-mounted planar solar power structure 700i, which is integrated with a wind turbine 832.

In such combined solar and wind power generation systems 700h, 700i, a wind turbine 832 may preferably be mounted to the north side of the power pole 702, so as not to interfere with a thin-film solar array 34 mounted to the south side of the pole 702. Depending on the solar array width 28 and length 29, the combined solar and wind power generation systems 732h, 731i may produce more energy at a given location, in areas that have sufficient wind speed and duration, as compared to a pole-mounted system 700 that provides only solar power. As well, since the duty cycles of the solar power system and the wind power system are not identical, the power generation from one may be used to provide power to the other, such as during start up or for troubleshooting.

Exemplary System Operation.

Figure 69:
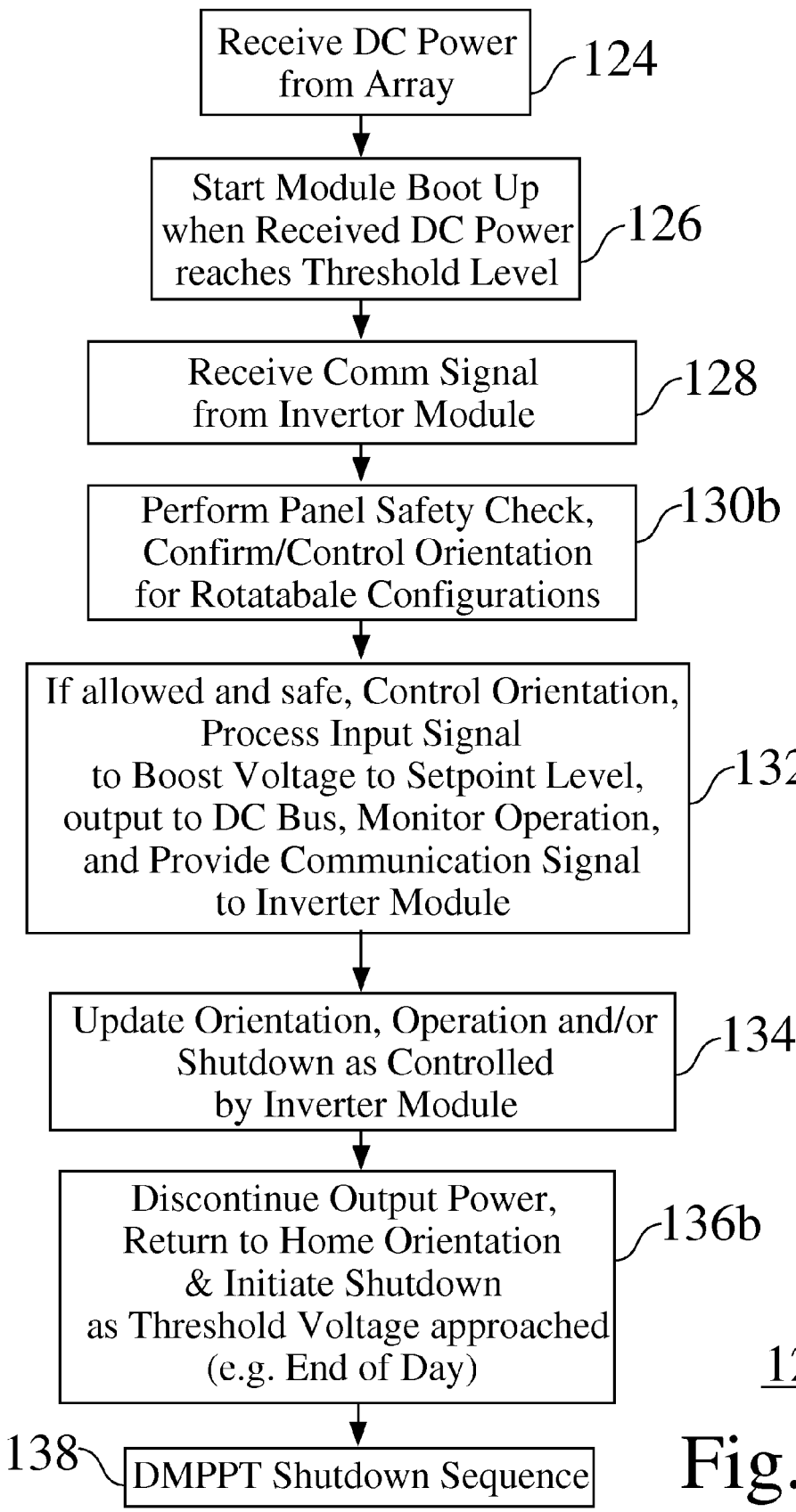
FIG. 69 is a flowchart of an exemplary operation of a pole mounted rotatable power module.

FIG. 69 is a flowchart of an exemplary process 122b for operation of an enhanced pole-mounted solar power structure 700. As a solar array 34 starts producing a voltage 102 and current 104 when light is shining on it, once the voltage 102 reaches a threshold voltage 116 (FIG. 10), e.g. approximately 4.5 to 6.5 Volts DC, the DC to AC inverter 712 and/or DMPPT Module 18 automatically wakes up 126, and starts performing the necessary checks 128,130b, before switching over to RUN Mode 132b. For rotatable system embodiments 700, e.g. 700b,700d,700j (FIG. 70), the position 743, e.g. 743a-743s (FIGS. 55-57) and rotation 734 of the rotatable solar array 34 may be monitored, and/or controlled.

As the voltage 102 of the solar panel 10 increases, the micro-inverter 712 and/or DMPPT Module 18 starts boosting the voltage 102 from the solar array 34 to the local distribution bus 42 feeding the local micro-inverter 712. This wait is necessary to prevent the loss of control power from the controller circuit 70 (FIG. 7) when switching begins. By using control inputs, the system tracks the maximum power point of the solar array 34, and boosts the voltage out to the local DC Bus 42 feeding the local DC to AC inverter 712, e.g. a micro-inverter 712. Since the voltage $102i$ is boosted $102o$, the system as a whole reaches striking voltage for the local DC to AC inverter 712 in a shorter period than a conventional array of panels 10 would without DMPPT functionality.

At seen at step 134b, the process 122b may controllably updated any of orientation, operation, or initiate shutdown, such as controlled by the DMPPT module 18 and/or DC to AC inverter 712. As seen at step 136b, such as during shutdown at the end of the day, the process 122b may discontinue output power, return to a home orientation for rotatable system embodiments 700, and initiate DMPPT shutdown 138 as a threshold voltage is reached.

The local DC to AC inverter 712 and/or DMPPT module 18 address many of the current limitations of solar power, such as by providing longer harvest times with panel-level DMPPT functionality, by providing "Early-On" and "Late-Off" for extended harvest times. Since the output from the solar panels 10 is boosted, the usable power is converted by the local DC to AC inverter 712, because the striking voltage is reached sooner and can be held longer, thereby resulting in an increase in harvestable power from each of the solar panels 10.

As well, some embodiments of the local DC to AC inverters 712 and/or DMPPT modules 18 may preferably be reprogrammable or updatable, such as over the communications link 22, wherein different algorithms may be sent and stored within the controllers 80, such as for modifying start up, operation, safety and shutdown operations.

The local DC to AC inverters 712 and/or DMPPT modules 18 also help to reduce the effects of partial shading on solar panels 10 in arrays 34. In conventional solar panels, partial shading of a single cell 12 causes the entire panel and string in which it is connected to reduce power output, and also increases loses due to string mismatch, by lowering the MPPT point for an entire solar array. In contrast to conventional panels, the local DC to AC inverters 712 and/or DMPPT modules 18 can controllably compensate for partial shading at the panel level, to boost the DC output signal $102o$.

The use of local DC to AC inverters 712 and/or DMPPT modules 18 with different embodiments of enhanced pole-mounted systems 700 provide many advantages over prior technologies. For example, the local DC to AC inverter 712 and/or DMPPT module 18 can readily be used to boost the DC performance of a pole mounted structure 700, and can readily be controlled, either through the communication link 22, or locally, e.g. by service personnel, to shut down the associated array 34. For solar panels 10 and/or arrays 34 that may preferably track production of one or more cells 12 on a panel 10, e.g. a column, the local DC to AC inverter 712 and/or DMPPT module 18 may be used to locally monitor energy production as a function of column, such as to provide a local set point for rotating the solar array 34 to center itself toward a direction of maximum power harvest.

While several embodiments of pole-mounted solar power structures 700 are described herein as comprising DMPPT modules 18, it should be understood that the pole mounted structures 700 and methods for their use may be implemented for systems that do not include DMPPT modules 18. As well, local DC to AC inverters 712 and/or DMPPT modules 18 and the methods for their use may be implemented for a wide variety of power generation systems and structures.

Furthermore, while some of the embodiments of pole-mounted solar power structures 700 are described herein as comprising a single flexible solar panel 10 that is fixed or rotatably controllable, it should be understood that the pole mounted structures 700 and methods for their use may be implemented for systems that comprise a plurality of solar panels 10, such as for but not limited to available panel geometry, and/or providing wind gaps defined between neighboring panels 10.

In addition, while some of the embodiments of pole-mounted solar power structures 700 are described herein as comprising a track or guides 736 for rotating solar panel assemblies 706, it should be understood that the pole mounted structures 700 and methods for their use may be rotated using a wide variety of mechanisms, such as structures for relative movement or rotation about the inner diameter of a mounting pole 702, structures for relative movement of the solar panels in relation to an outer defined arch, and/or any other mechanism for relative rotation for one or more solar panels 10 with respect to a fixed utility structure.

Figure 70:
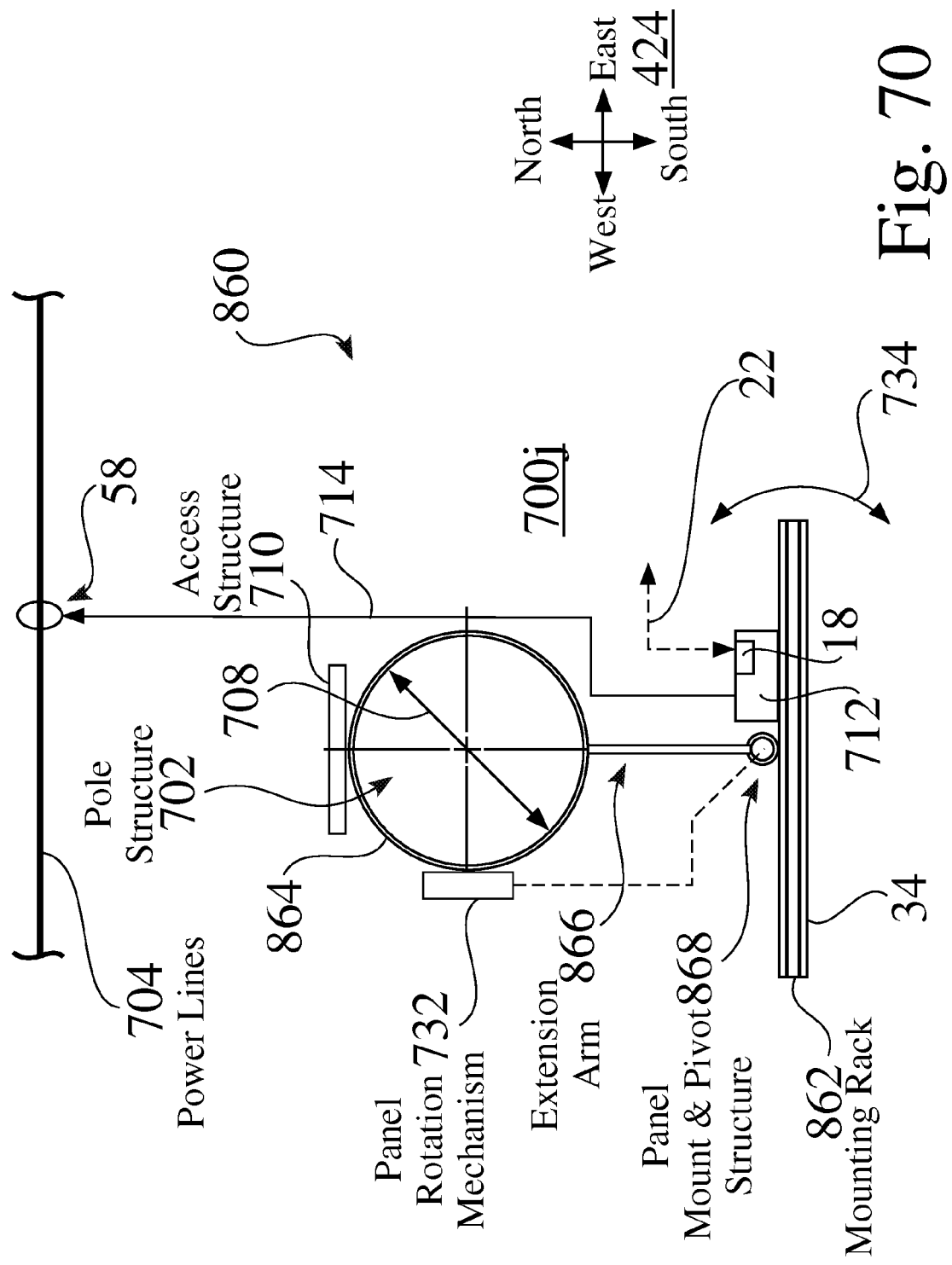
FIG. 70 is a partial schematic view of an exemplary pole-mounted solar power structure having an extended pivot structure.

For example, FIG. 70 is a partial schematic view 860 of an exemplary pole-mounted solar power structure 700j having an extended pivot structure 864,866. The structure 700j may in some embodiments be stationary, or in other embodiments, be rotatable 734 about a pivot structure 868 that extends 866, such as from a pole mount 864. The exemplary structure seen in FIG. 70 is therefore non-concentric to the pole 702 from which it extends. In some embodiments, the panel rotation mechanism 732 may operate directly upon an axis 925 (FIG. 75) associated with the solar panel support structure. While the exemplary DC to AC inverter 712, e.g. a micro-inerter 712, shown in the embodiment of FIG. 70 is generally located upon the solar panels structure, it should be understood that the DC to AC inverter 712 and/or DMPPT 18, in this or other system embodiments 700, may be located at other locations, as desired, such as but not limited to being affixed to any of another portion of the mounting structure 864 or mounting rack 862, to the power pole 702 itself, or to other associated equipment or structures.

FIG. 71 is a partial bird's eye schematic view 870 of an exemplary pole-mounted rotatable planar solar power structure 700j, located in the Northern Hemisphere at a first time $T_1$, wherein the solar array 34 is rotatably positioned 734 in a generally Eastward direction 743a. FIG. 72 is a partial bird's eye schematic view 880 of the pole-mounted rotatable planar solar power structure 700j of FIG. 71 at a second time $T_2$, wherein the solar array 34 is rotatably positioned 734 in a generally Southward direction 743n. FIG. 73 is a partial bird's eye schematic view 890 of the pole-mounted rotatable planar solar power structure 700j of FIG. 71 and FIG. 72 at a third time $T_3$, wherein the solar array 34 is rotatably positioned 734 in a generally Westward direction 743s. As seen in FIG. 71 to FIG. 73, the length of the extension arms 866 may preferably be greater than half the width of the solar array 34, such as to allow at least 180 degrees of rotation 734 and, depending on the system configuration, may be configured to allow full rotation 734 of the solar array 34, e.g. clockwise rotation and/or counterclockwise rotation.

FIG. 74 is a side schematic view 900 of the pole-mounted rotatable planar solar power structure 700j of FIG. 71, wherein the solar array 34 is rotatably positioned 734 in a generally Eastward direction 743a. FIG. 75 is a side schematic view 910 of the pole-mounted rotatable planar solar power structure 700j corresponding to FIG. 72, wherein the solar array 34 is rotatably positioned 734 in a generally Southward direction 743n. FIG. 76 is a side schematic view 920 of the pole-mounted rotatable planar solar power structure 700j corresponding to FIG. 73, wherein the solar array 34 is rotatably positioned 734 in a generally Westward direction 743s. The exemplary pole-mounted rotatable flat solar power structure 700j seen in FIG. 70 to FIG. 76 may preferably allow full rotation 734, e.g. clockwise rotation, such as throughout the day during power production, and similarly, to return to a starting position, 743, e.g. 743a.

While the exemplary pole-mounted rotatable planar solar power structure 700j seen in FIG. 70 to FIG. 76 is disclosed in regard to a planar solar array 34 and mounting rack 862, it should be understood that the power structure 700j may readily be implemented with other profiles, such as but not limited to curved or arched solar arrays 34. As well, the curvature in some system embodiments 700, e.g. 700j is not limited to being concentric to the pole structure 702. For example, a solar array 34 and corresponding mounting rack 862 may preferably be formed with a substantially gradual curve, i.e. having a large effective radius, such as to effectively collect incoming solar energy, in a similar manner to a planar panel, while providing a more robust mechanical structure, in a similar manner to a curved mounting rack.

Accordingly, although the invention has been described in detail with reference to a particular preferred embodiment, persons possessing ordinary skill in the art to which this invention pertains will appreciate that various modifications and enhancements may be made without departing from the spirit and scope of the disclosed exemplary embodiments.

The invention claimed is:
1. A system, comprising:
  alternating current (AC) power transmission lines that are connected to a power grid;
  a power distribution structure for supporting the power transmission lines, wherein the power distribution structure has a defined axis and a defined circumference;
  a mounting structure that is attached to the power distribution structure, wherein the mounting structure extends from the power distribution structure and comprises a mounting rack;
  a solar array comprising at least one solar panel that is affixed to the mounting rack, and DC outputs extending from the solar array, wherein the solar array defines a rectangle having a defined length and width; and
  an DC to AC invertor connected between the DC outputs of the solar array and the AC power transmission lines;
  wherein the length of the solar array is generally aligned with the defined axis of the power distribution structure, and wherein the width of the solar array is greater than half the circumference of the power distribution structure.
2. The system of claim 1, wherein the power distribution structure comprises any of a power distribution pole or a power distribution tower.
3. The system of claim 1, wherein the DC to AC invertor further comprises a DMPPT module.
4. The system of claim 1, wherein the DC to AC invertor further comprises
  a control module: and
  a communications link connected to the control module;
  wherein the control module comprises
    input connections that are connected to the solar array,
    output connections that are connected to the micro-inverter,
    a signal processing circuit connected to the input connections, and a controller that is connected to the signal processing circuit, wherein the controller is connected to any of a computer or a server through the communications link;

wherein the DC output of the solar array is controllably adjustable in response to an input signal that is sent from the computer or server and received at the controller over the communications link.

5. The system of claim 1, wherein the solar array and at least a portion of the mounting structure are rotatable with respect to the power distribution structure.

6. The system of claim 1, further comprising:
a rotation mechanism that is configured to rotate the mounting rack and the solar array with respect to the power distribution structure.

7. The system of claim 6, wherein the rotation mechanism is controllably responsive to a signal.

8. The system of claim 6, wherein the rotation mechanism is responsive to any of location, time of day, available light, or any combination thereof.

9. The system of claim 6, wherein the rotation mechanism is configured to rotate mounting rack and the solar array based on the direction of incident solar energy.

10. The system of claim 1, wherein the mounting rack and the solar array are substantially planar.

11. The system of claim 1, wherein the mounting rack and the solar array are curved.

12. The system of claim 1, wherein the solar array is substantially rigid.

13. The system of claim 1, wherein the solar array is flexible.

14. The system of claim 1, wherein the solar array further comprises at least one heliostat mechanism.

15. The system of claim 1, further comprising:
a wind turbine mounted to the power distribution structure and connected to the AC power transmission lines.

16. The system of claim 1, further comprising:
an access structure affixed to the power distribution structure that is configured to provide access to any of the (AC) power transmission lines, the mounting structure, the solar array, or the DC-AC inverter.

17. A structure for locally harvesting solar power at a power distribution structure that supports alternating current (AC) power transmission lines, wherein the power distribution structure has a defined axis and a defined circumference, wherein the power generation structure comprises:
a mounting structure that is attached to the power distribution structure, wherein the mounting structure extends from the power distribution structure and comprises a mounting rack;
a solar array comprising at least one solar panel that is affixed to the mounting rack, and DC outputs extending from the solar array, wherein the solar array has a defined length and width; and
a DC to AC invertor connected between the DC outputs of the solar array and the AC power transmission lines;
wherein the length of the solar array is generally aligned with the defined axis of the power distribution structure, and wherein the width of the solar array is greater than half the circumference of the power distribution structure.

18. The structure of claim 17, wherein the power distribution structure comprises any of a power distribution pole or a power distribution tower.

19. The structure of claim 17, wherein the DC to AC invertor further comprises a DMPPT module.

20. The structure of claim 17, wherein the DC to AC invertor further comprises
a control module; and
a communications link connected to the control module;
wherein the control module comprises
input connections that are connected to the solar array,
output connections that are connected to the DC to AC inverter,
a signal processing circuit connected to the input connections, and
a controller that is connected to the signal processing circuit, wherein the controller is connected to any of a computer or a server through the communications link;
wherein the DC output of the solar array is controllably adjustable in response to an input signal that is sent from the computer or server and received at the controller over the communications link.

21. The structure of claim 17, wherein the solar array and at least a portion of the mounting structure are rotatable with respect to the power distribution structure.

22. The structure of claim 17, further comprising:
a rotation mechanism that is configured to rotate the mounting rack and the solar array with respect to the power distribution structure.

23. The structure of claim 22, wherein the rotation mechanism is controllably responsive to a signal.

24. The structure of claim 22, wherein the rotation mechanism is responsive to any of location, time of day, available light, or any combination thereof.

25. The structure of claim 22, wherein the rotation mechanism is configured to rotate mounting rack and the solar array based on the direction of incident solar energy.

26. The structure of claim 17, wherein the mounting rack and the solar array are any of planar or curved.

27. The structure of claim 17, wherein the solar array is any of rigid or flexible.

28. A process, comprising the steps of:
providing a power structure for locally harvesting solar power at a power distribution structure that supports alternating current (AC) power transmission lines, wherein the power distribution structure has a defined circumference, wherein the power generation structure comprises
a mounting structure that is attached to the power distribution structure, wherein the mounting structure extends from the power distribution structure and comprises a mounting rack;
a solar array comprising at least one solar panel that is affixed to the mounting rack, and DC outputs extending from the solar array, wherein the solar array has a defined length and width, and
a DC to AC invertor connected between the DC outputs of the solar array and the AC power transmission lines,
wherein the length of the solar array is generally aligned with the power distribution structure, and wherein the width of the solar array is greater than half the circumference of the power distribution structure;
collecting solar energy through the solar array;
inverting the DC power from the solar array to AC power through the DC to AC invertor; and
transferring the AC power to the AC transmission lines.

29. The process of claim 28, wherein the mounting rack and the solar array are rotatable, and wherein the process further comprises the step of:
controllably rotating the mounting rack and the solar array.

30. The process of claim 29, wherein the step of controllably rotating the mounting rack and the solar array is based on any of location, time of day, available light, or any combination thereof.

* * * * *